United States Patent [19]
Smith et al.

[11] Patent Number: 5,748,922
[45] Date of Patent: May 5, 1998

[54] METHOD AND APPARATUS FOR READING DATA FROM A WRITE ONLY PORT

[75] Inventors: Jimmy Dean Smith; Mark D. Nicol, both of Stevensville; Terence Paul O'Brien, Saint Joseph, all of Mich.

[73] Assignee: Packard Bell NEC, Sacramento, Calif.

[21] Appl. No.: 387,370

[22] Filed: Feb. 13, 1995

Related U.S. Application Data

[63] Continuation of Ser. No. 43,169, Apr. 5, 1993, abandoned.

[51] Int. Cl.$^6$ .............................. G06F 12/00; G06F 12/14
[52] U.S. Cl. ........................ 395/309; 395/823; 395/835
[58] Field of Search ................................ 395/823, 835, 395/872, 309, 413; 380/4

[56] References Cited

U.S. PATENT DOCUMENTS

| | | | |
|---|---|---|---|
| 4,349,870 | 9/1982 | Shaw et al. | 395/800 |
| 5,027,317 | 6/1991 | Pepera et al. | 395/490 |
| 5,136,694 | 8/1992 | Belt et al. | 395/887 |
| 5,202,994 | 4/1993 | Begur et al. | 395/412 |
| 5,202,997 | 4/1993 | Arato | 395/186 |
| 5,251,304 | 10/1993 | Sibigtroth et al. | 395/186 |
| 5,269,015 | 12/1993 | Shires | 395/421.01 |
| 5,418,927 | 5/1995 | Chang et al. | 395/490 |
| 5,434,562 | 7/1995 | Reardon | 340/825.34 |

OTHER PUBLICATIONS

BYTE Magazine, Min–Hur Whang and Joe Kua, "Join the EISA Evolution" Article, May 1990, pp. 241–247.
Intel's EISA Peripheral Components Brochure, Oct. 1991, Order No. 290386–004.
1992 National Semiconductor Corporation, PC87311/PC87312 (SuperI/O™ II/III) Floppy Disk Controller with Dual UARTs Parallel Port, and IDE Interface Pamphlet, Apr. 1992.

*Primary Examiner*—Parshotam S. Lall
*Assistant Examiner*—Viet Vu
*Attorney, Agent, or Firm*—Fitch, Even, Tabin & Flannery

[57] ABSTRACT

The present invention relates to a method and apparatus to provide a write only register that is implemented with a low cost device yet provides the means whereby the register may be read, glitch free, using a predetermined procedure.

26 Claims, 15 Drawing Sheets

TRUTH TABLE

| S1 | S0 | OUT_3 | OUT_2 | OUT_1 | OUT_0 |
|----|----|-------|-------|-------|-------|
| 0  | 0  | 0     | 0     | 0     | IN    |
| 0  | 1  | 0     | 0     | IN    | 0     |
| 1  | 0  | 0     | IN    | 0     | 0     |
| 1  | 1  | IN    | 0     | 0     | 0     |

TRUTH TABLE

| S1 | S0 | OUT |
|----|----|-----|
| 0  | 0  | IN_0 |
| 0  | 1  | IN_1 |
| 1  | 0  | IN_2 |
| 1  | 1  | IN_3 |

TRUTH TABLE

| DISABLE | S1' | S0' | OUT_3' | OUT_2' | OUT_1' | OUT_0' |
|---------|-----|-----|--------|--------|--------|--------|
| 0 | 0 | 0 | 0 | 0 | 0 | IN |
| 0 | 0 | 1 | 0 | 0 | IN | 0 |
| 0 | 1 | 0 | 0 | IN | 0 | 0 |
| 0 | 1 | 1 | IN | 0 | 0 | 0 |
| 1 | X | X | 0 | 0 | 0 | 0 |

X = DON'T CARE

Fig. 13A

| BUS DMA CHANNEL (DRQ_OUT, DACK_IN) | DEV DMA CHANNEL (DRQ_IN, DACK_OUT) | XBUS_USE (ON/OFF) | DMA_SWITCH 10, 32, 54 |
|---|---|---|---|
| 0 | | | |
| 1 | | | |
| 2 | | | |
| 3 | | | |
| 4 | | | |
| 5 | | | |

Fig. 13B

| (SYSTEM REQUIREMENTS) | | | (REGISTER VALUES) | |
|---|---|---|---|---|
| DEV_IRQ | BUS_IRQ | PROTECTION (SECURE) | IRQ_SECURE | IRQ_IN_SWITCH |
| 0 | | | | |
| 1 | | | | |
| 2 | | | | |
| 3 | | | | |
| 4 | | | | |
| 5 | | | | |

METHOD AND APPARATUS FOR READING DATA FROM A WRITE ONLY PORT

This application is a continuation of application Ser. No. 08/043,169 filed Apr. 5, 1993, now abandoned.

CROSS REFERENCE TO RELATED APPLICATIONS

This invention is related to the following patent applications: Expansion Module Including Programmable Chip Select, Ser. No. 08/043,193 abandoned; Method Of Securing Various Functions On An I/O Controller Chip, Ser. No. 08/042,979 abandoned; Method For Remapping Interrupts and DMAs, Ser. No. 08/043,191 abandoned; and Method For Providing A Programmable Data Write Hold Time, Ser. No. 08/043,126 abandoned, all filed on Apr. 5, 1993 and subject to an obligation of assignment to Zenith Data Systems Corporation.

BACKGROUND OF THE INVENTION

1. Field of the Invention

The present invention relates to a method and apparatus to provide a write only register that is implemented with a low cost device yet provides the means whereby the register may be read, glitch free, using a predetermined procedure.

2. Description of the Prior Art

Write only ports are ports that can be written to but may not be read from at all or only allowed to be read by the low level BIOS (Basic Input Output System). In many cases, it is desirable to provide a write only port whose outputs are used to enable or disable some logic in the system. In other words, the outputs are used as static bits and must not be allowed to change. Using the port in this way requires the outputs of the port to remain stable and glitch free. This usually prevents all applications including the BIOS from reading the port. The outputs may change for a short time when the port is being read possibly causing problems with the logic that is being enabled or disabled by the port's outputs. Also, if the ability of allowing the BIOS to read this port is desired, the cost of implementing the port goes up. To make the port non-readable by any means, the BIOS must find another way of obtaining the information contained in the write only port.

Various methods of implementing a write only port have been done in the Art. A unidirectional part such as the standard 74×373 from Texas Instruments has been used to provide a write only port that is non-readable by any means.

Another solution has been to use a device such as the standard 74×543, also from Texas Instruments, type bi-directional port. Although this part provides the means to read the port, the outputs cannot be used as static bits since they are not glitch free (values may fluctuate when the port is read). This solution is also more costly and requires more logic to prevent any application other than the BIOS from reading the port.

SUMMARY OF THE INVENTION

It is the object of the present invention to provide a low cost write only port.

It is another object of the present invention to provide a glitch free write only port where the outputs are usable as static enable/disable controls.

It is another object of the present invention to provide a write only port that is readable only by the BIOS without adding additional cost to the system.

It is another object of the present invention to provide a write only port that allows the BIOS to read the port values or the last data written to the port.

The present invention provides a write-only port that can, by using the correct procedure, be read by the BIOS without changing the outputs during the read. Thus, the outputs are guaranteed to be static and usable as enable or disable control signals. It also provides a means where by the last data written to the port can be read.

BRIEF DESCRIPTION OF THE DRAWING

These and other objects and advantages of the present invention will become readily apparent upon consideration of the following detailed description and attached drawing, wherein:

FIGS. 13A and 13B are programmable DMA and IRQ mapping tables for recording system I/O configurations;

DETAILED DESCRIPTION OF THE PREFERRED EMBODIMENT

Figure 1:
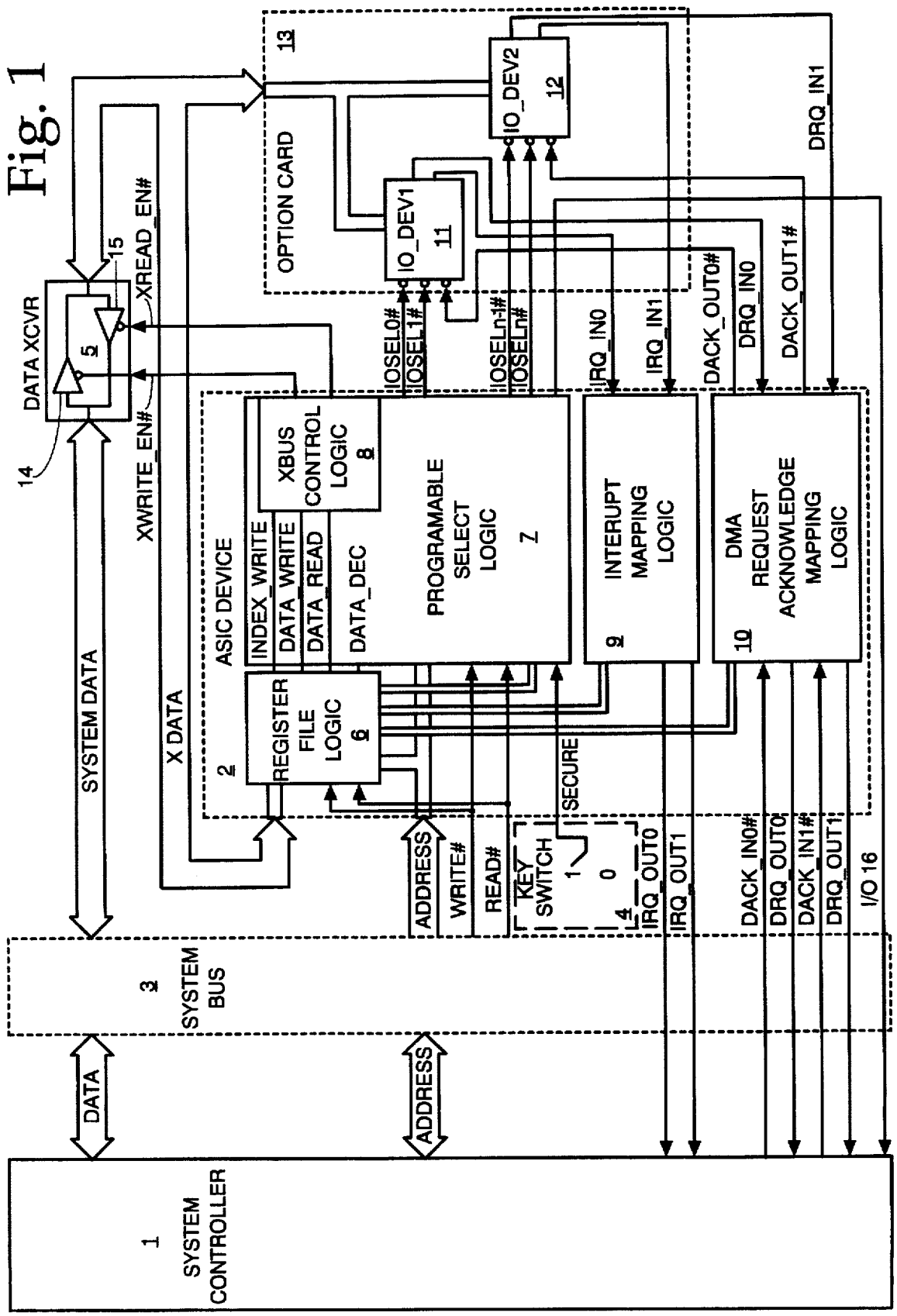
FIG. 1 is a block diagram of the computer system.

A computer system is illustrated in FIG. 1 which includes a system controller 1, a programmable device 2, a system data and address bus 3, an option data bus (XDATA), and an input/output (I/O) option or expansion card 13 for supporting a plurality of I/O devices. Two I/O devices, identified with the reference numerals 11 and 12, are illustrated for simplicity. The I/O expansion card 13 is adapted to be plugged into an edge connector (not shown) on the motherboard; thus conserving AT bus expansion slots. The programmable device 2 provides for the necessary selection, decoding, and resource routing functions to support the I/O devices 11 and 12.

As shown, the expansion card 13 is connected to the option data (XDATA) bus, which, in turn, is connected to the system bus 3 by way of a data transceiver 5. However, it is also contemplated that the expansion card 13 can be directly connected to the system data bus 3. Addressing of the I/O devices 11 and 12 is provided by the programmable device 2 as will be discussed in more detail below.

Bus Description

Various architectures for the system bus 3 are contemplated. For example, the system bus 3 can be an industry standard architecture (ISA) bus, an extended industry standard architecture (EISA) bus, a microchannel architecture (MCA) bus; a video local (VLBUS) bus, or a peripheral component interconnect (PCIBUS) bus.

The option data bus (XDATA) is a multiple bit parallel bus, connected to the system bus 3 by way of the data transceiver 5. The data transceiver 5 allows for data transfers between the system bus 3 and the I/O devices 11 and 12, and between the system data bus 3 and the programmable device 2.

The data transceiver 5 includes read tri-state device 15 and write tri-state devices 14. These tri-state devices 15 and 14 are enabled by a read signal XREAD_EN# and write signal XWRITE_EN# from the programmable device 2, as will be discussed in more detail below.

System Controller

The system controller 1, under the direction of the central processing unit (not shown, CPU), initiates commands on the system bus 3 to transfer data to and from all system peripherals including the I/O devices 11 and 12. These commands include commands to transfer data from I/O devices 11, 12 to the system controller 1 and ultimately to the CPU, as well as WRITE commands to transfer data to the I/O devices 11, 12 from the system controller 1 and the CPU. The system controller 1 also asserts addressing information to the I/O devices 11, 12 to indicate which I/O device 11, 12 is to respond to the command. The addressing information is decoded by the programmable device 2, as will be discussed in more detail below.

Interrupt request lines IRQ allow the I/O devices 11 and 12 to asynchronously notify the system controller 1 when the I/O devices 11 and 12 require service. These interrupt request lines IRQ are prioritized and require coordination between the I/O devices 11 and 12 and the system software to allow the I/O devices 11, 12 interrupt priority level to be changed during installation and to allow the I/O devices to coexist with other similar devices. In known systems, the method of changing the interrupt level is accomplished manually by way of a jumper or shunt; requiring a certain amount of disassembly of the computer system. As will be discussed in more detail below, the interrupt system described herein is programmable.

The system controller 1 also provides to the system bus 3 a number of control signals intended to allow the I/O devices 11 and 12 to request a direct memory access (DMA) by way of DMA request signal DRQ. When a DMA request is received by the system controller 1, it will respond to the I/O devices 11, 12 with a DMA acknowledged signal DACK, assuming that system resources are available. These signals DRQ and DACK are paired together to form a DMA channel. Multiple DMA channels are typically provided in a computer system and are generally allowed to be rerouted from one device to another when the need arises. In known systems, rerouting of DMA channels is similar to remapping of an interrupt request and require the manual changing of various shunts or jumper. As described below, DMA channel rerouting described herein does not require any disassembly and is accomplished by software commands.

The system controller 1 does not form a part of the present invention and includes DMA and IRQ functions as discussed above, as well as bus control functions. This system controller 1 may be formed from a single chip or multiple chips. For example, the DMA and IRQ functions can be provided on a single chip, such as an Intel model number 82357, while the bus control functions may be provided by another chip such as an Intel model 82358.

The Programmable Device

The programmable device 2 provides the necessary selection, decoding, and resource rerouting functions necessary to support various I/O devices 11 and 12 on the option card 13, as well as the motherboard itself. In particular, the programmable device 2 may be used to provide all address decoding functions, IRQ, and DMA mapping function for the entire motherboard.

The programmable device includes register file logic 6, a programmable select logic 7, option bus control logic 8, interrupt mapping logic 9, and DMA request/acknowledge mapping logic 10.

The programmable device 2 may be implemented as an application specific integrated circuit (ASIC). The Verilog source code for the ASIC is attached as Appendix 1.

Register File Logic

Figure 2:
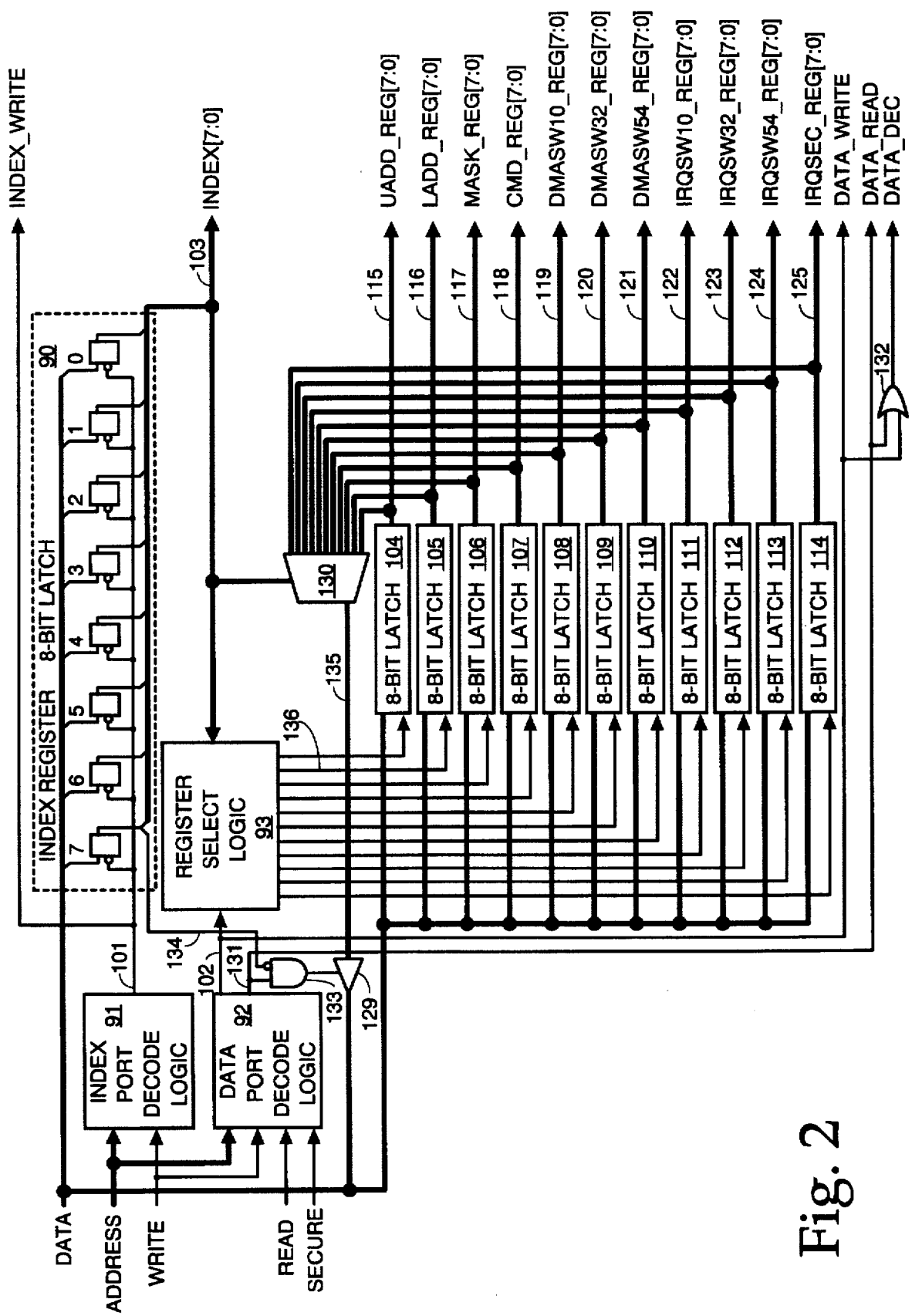
FIG. 2 is a schematic diagram of the register file logic illustrated in FIG. 1.

The register file logic 6 is illustrated in FIG. 2. The register file 6 includes all of the programmable storage elements used to configure the programmable device 2 along with the decode logic to identify accesses to the programmable device 2. As shown, a plurality of internal registers 104 through 114 are shown. These internal registers 104 through 114 are accessed by the system controller 1 by way of an index port 91 and a data port 92. In particular, the index port and the data port can be set at any values, for example, $E0 and $E4. Thus, anytime the system controller 1 writes the address $E0, the index port decode logic 91 will assert the INDEX_WRITE signal when the address matches the index port decode address ($E0) during a WRITE operation. The INDEX_WRITE signal is utilized by the XBUS control logic 8 (FIG. 1) to cause a XWRITE_EN# signal to be asserted to enable the data transceiver 5 to pass system data through to the XDATA bus. The INDEX_WRITE signal also enables an 8-bit index register 90 along line 101. The index register 90 is used to select one of the internal registers 104 through 114 as a target register for programming. Thus, once the signals XWRITE_EN# and INDEX_WRITE are asserted, a data byte from the system controller 1 is written to the index register and latched as the signals XWRITE_EN# and INDEX_WRITE are deasserted. The output of the index register 90 is applied along line 103 to a register select logic block 93, implemented as a demultiplexer, which selects or enables one of the internal registers 104 through 114.

When the system controller 1 asserts the address of the data port (e.g., $E4) and asserts a WRITE command signal, the data port decode logic 92 asserts a DATA_WRITE signal along line 102. The DATA_WRITE signal is used in the XBUS control logic 8 to assert an XWRITE_EN# signal and to allow system data to be connected to the XDATA bus. The assertion of the DATA_WRITE signal at the register select logic 93 asserts one of the WRITE lines 115 to 125 of the internal registers 104 through 114 which corresponds to the target register, thereby loading the data into that register.

The accesses to the data port may be qualified for various reasons, including security. In particular, in order to prevent unauthorized access of the data port 92, accesses to this port 92 may be qualified with a SECURE signal or other signals. As shown in FIG. 1, the SECURE signal may be from a key switch 4 to prevent unauthorized modification of the programmable device 2.

Each of the registers 104 to 114 in the register file logic 6 can be read back by the system controller 1 (FIG. 1). In particular, all eight bits of each of the registers 104 to 114 are connected to a multiplexer 130 along line 135. When the system controller 1 asserts the data port address (e.g., $E4), and additionally asserts a READ command, the data port decode logic 92 will assert a DATA_READ signal. The DATA_READ signal along with bit 7 from the index register 90 are used to control a tri-state device 129 to enable the multiplexer 130 output to be applied to the XDATA bus. In particular, the DATA_READ signal is applied to a noninverting input of the AND gate 133 along line 134 while bit 7 of the index register 90 is used to control an inverting input of the AND gate 133. The output of the AND gate 133 is applied to a tri-state device 129, which, in turn, when enabled, applies the outputs of the selected register 104 to 114 to the XDATA bus. During this condition, the XREAD_EN# signal will be enabled from the XBUS control circuit 8 to allow the XDATA bus to be connected to the system bus 3, which, in turn, allows the output of the registers 104 to 114 to be read back by the system controller 1.

Bit 7 of the latch 90 may be used to defeat the read back function by the system controller 1. In particular, if bit 7 is set, then gate 133 will be disabled, which, in turn, will disable the tri-state device 129 to prevent the data at the output of the registers 104 to 114 from being read back by the system controller 1.

A data decode signal DATA_DEC is asserted any time the data port decode logic 92 indicates that the data port was addressed by the system controller 1. This data decode signal, available at the output on an OR gate 132, is under the control of the DATA_WRITE and DATA_READ signals, applied to the inputs of the OR gate 132. This data decode signal DATA_DEC is used in other parts of the control logic, including an index match INDX_MTCH logic control circuit 162 on FIG. 3 of the drawings.

Programmable Select Logic

As mentioned above, the programmable device 2 is accessed by way of the register file logic 6 which includes the internal registers 104 through 114. The internal registers 104 through 107 are used to control each of the IOSEL0# output signals from the programmable select logic 7, used to select an I/O device 11, 12 on the expansion card 13. As discussed below, the registers 108 through 114 are utilized for DMA and IRQ mapping.

The registers 104 through 107 define the address and other qualifying parameters for each output select signal IOSEL. For simplicity, only a single programmable address output signal IOSEL is described.

The registers 104 through 107 represent the command register CMD_REG[7:0]; the upper address register UADD_REG[7:0]; the lower address register LADD_REG[7:0]; and the mask register MASK_REG[7:0].

The command register CMD_REG[7:0] is used to specify the commands for enabling the I/O select output signal IOSEL and global outputs. The command register CMD_REG[7:0] is an 8-bit register. Bit 0, when set, allows the signal I/O 16 to be asserted when the programmable output select signal IOSEL is asserted. The I/O 16 signal is used to indicate to the system bus 3 that the particular I/O device 11, 12 is capable of 16-bit data transfers. Bit 1 is used to qualify the output select signal IOSEL with a PRIVY signal, for example, which may be used to control access to a particular I/O device, such as a hard disk drive (not shown). In particular, as will be discussed in more detail below, when bit 1 is asserted, the programmable output select signal IOSEL will be enabled. Similarly, when bit 1 is disabled, the output select signal IOSEL will be deasserted unless the programmable select logic 7 is in the sticky mode, in which case bit 1 is ignored. Bits 4, 3 are used to qualify the programmable output select signal IOSEL with either an I/O WRITE signal IOW or an I/O READ signal IOR. In particular, when bits 4,3 equal 0,0, neither the I/O READ signal IOR nor the I/O WRITE signal IOW affect the I/O select signal IOSEL. When bits 4,3 equal 0,1, the I/O READ signal IOR is used to qualify or enable the I/O select signal IOSEL. When bits 4,3 equal 1,0, the I/O WRITE signal IOW enables the I/O select signal IOSEL. When bits 4,3 equal 1,1, either the I/O READ signal IOR or the I/O WRITE signal IOW can enable the I/O select signal IOSEL. Bits 5,6 are reserved. Bit 7, identified as INDXD, controls the mode of operation of the programmable select logic 7. In particular, when bit 7 is set, the programmable select logic 7 will be in either the index mode or the sticky mode, depending on whether the sticky bit in the mask register is set.

When the programmable select logic 7 is in an address decode mode of operation, the upper address register UADD_REG and the lower address register LADD_REG are used to define the upper and lower bytes of the programmed address range for the I/O devices 11 and 12 on the expansion card 13. Both the upper address register UADD_REG and the lower address register LADD_REG are 8-bit registers.

The mask register MASK_REG[7:0] is an 8-bit register which allows a range of addresses to be decoded instead of a single address. Each bit in the mask register MASK_REG[7:0] corresponds to a bit in the lower address register LADD_REG[7:0]. Bit 0 of the mask register MASK_REG[7:0] is used to set the "sticky bit" which enables a sticky mode of operation, as will be discussed below.

The programmable select logic 7 (FIG. 3) is adapted to operate in an address decode mode, an index decode mode, and a sticky mode. The mode of operation of the programmable select logic 7 is under the control of a multiplexer (MUX) 150 and an OR gate 152. The MUX 150 has two selectable inputs A and B which are under the control of a select input S. Bit 7 of the command register CMD_REG is applied to the select inputs of the MUX 150 to control the mode of operation. As mentioned above, when bit 7 of the command register CMD_REG[7:0] is set, this indicates that the indexed mode of operation has been selected. If bit 0 in the mask register MASK_REG[7:0] is also set, the programmable select logic 7 will operate in the sticky mode of operation. Bit 7 of the command register CMD_REG[7:0] is applied to the select input S of the MUX 150. When this select input S is high, the MUX 150 selects input B to enable either the index mode of operation or the sticky mode of operation. When the select input S is low, input A is selected for the address mode of operation.

When the address mode of operation is selected, the address select signal ADD_SEL is asserted on a successful address decode. This signal ADD_SEL is under the control of an AND gate 154. The AND gate 154 is a two-input AND gate. One input to the AND gate 154 is an address match signal ADD_MATCH from the ADDMTCH control logic 156. The other signal is an option match signal OPT_MTCH from the command match logic CMD_MTCH 158. As will be discussed in more detail below, the ADD_MTCH signal is asserted when an address matches the programmed address. This address match signal ADD_MTCH is qualified with the option match signal OPT_MTCH from the command match logic CMD_MTCH 158 such that the I/O select output signal IOSEL is only asserted for various programmed commands, such as SECURE, WRITE, READ, or other qualifiers, such as a PRIVY signal, which, in turn, enable the AND gate 154 which, in turn, is applied to the A input of the MUX 150 to provide the I/O select output signal.

If the programmable select logic 7 is in an index mode of operation, bit 7 of the command register CMD_REG[7:0] will select input B of the MUX 150 to disable the address mode of operation. Input B of the MUX 150 is used for both the index mode of operation and the sticky mode of operation. Whether the index mode of operation or the sticky mode of operation is selected is under the control of the OR gate 152, whose output is applied to the B input of the MUX 150. In both an index and sticky mode of operation, the B input of the MUX 150 is selected. When the "sticky" bit is set, the particular IOSEL is selected until the "sticky" bit is deasserted.

In an index mode of operation, the IOSEL signal is under the control of the AND gate 160. In a sticky mode of operation, the "sticky" bit (e.g., bit 7 of the command register CMD_REG[7:0]) masks the index select signal INDEX_SEL such that the IOSEL signal is asserted as long as bit 7 of the command register CMD_REG[7:0] is asserted. The index select signal INDEX_SEL is under the control of an AND gate 160. One input to the AND gate 160 is the option match signal OPT_MTCH from the command match logic CMD_MTCH 158. The other input to the AND gate 160 is an index match signal INDEX_MTCH from the index control logic INDX_MTCH 162. As will be discussed in more detail below, when the index matches the programmed index, the index match INDEX_MTCH signal will be asserted to enable the AND gate 160.

The programmable device 2 is thus adapted to decode either physical or indexed addresses. A physical address defines an actual I/O address within the physical address space. An indexed address refers to a method where the address is generated using a base address and an offset. The index values are available at the index register 90 and decoded as discussed below. The indexed decodes allow I/O devices to avoid using any physical address space.

When an address mode is selected, the address can be fully decoded using 16 bits of address or the lower eight address bits can be selectively masked off to enable up to 256 contiguous addresses to match the decode. This allows for global address ranges for option boards if necessary.

As discussed above, the programmable select logic 7 system is also able to provide an ISA bus slave signal I/O 16 which indicates to the system bus 3 that the I/O devices 11, 12 on the expansion card 13 is capable of 16-bit data transfers. This signal I/O 16 is available at the output of an AND gate 164. One input to the AND gate 164 is the address select signal ADD_SEL. Bit 0 of the command register is applied to the other input. This bit CMD_REG[0] is used to enable or disable the I/O 16 output.

Figure 4:
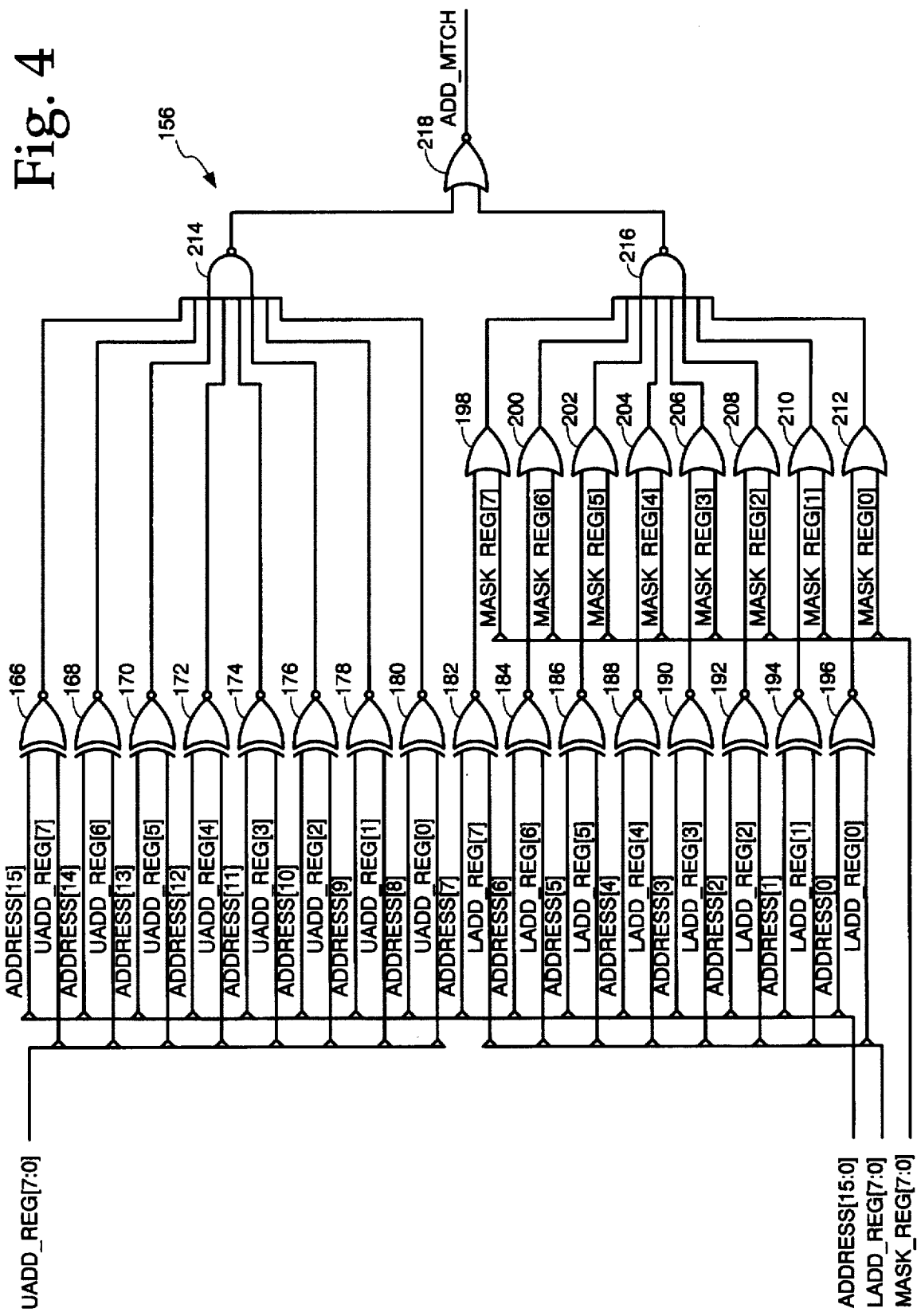
FIG. 4 is a schematic diagram of the address match logic illustrated in FIG. 3.

The address match ADD_MTCH logic 156 is illustrated in FIG. 4. This logic 156 includes 16 exclusive NOR gates 166 through 196, 8 OR gates 198 to 212, 2 NAND gates 214 and 216, and one NOR gate 218. The upper byte of the system address ADDRESS[15:8] is applied to one input of the exclusive NOR gates 166 through 180. The eight bits of upper address register UADD_REG[7:0] are applied to the other inputs. The outputs of the exclusive NOR gates 166 to 180 are applied as inputs to NAND gate 214 whose output is applied to NOR gate 218. The output of the NOR gate 218 is the address match signal ADD_MTCH.

The lower byte of the system address ADDRESS[7:0] is applied to one input of the exclusive NOR gates 182 to 196. Bits 0 to 7 of the lower address register LADD_REG are applied to the other inputs. The outputs of the exclusive NOR gates 182 to 196 are applied to one input of the OR gates 198 through 212. The MASK_REG bits 0 to 7 are applied to the other inputs of the OR gates 198 to 212. The outputs of the OR gates 198 to 212 are applied to the NAND gate 216 whose output is applied to the NOR gate 218.

When the address from the system address bus matches the programmed address in the upper address register UADD_REG and the lower address register LADD_REG, the outputs of the exclusive NOR gates 166 through 196 will be high. The high output from the exclusive NOR gates 166 to 180 will cause the output of the NAND gate 214 to be low. When the address match logic ADD_MTCH 156 is decoding a single address, the bits 0 through 7 of the mask register MASK_REG will be deasserted. In this situation, the outputs of the exclusive NOR gates 182 to 196 are used to enable the NOR gates 198 to 212 to cause the output of the NAND gate 216 to be low, which in turn enables the address match signal ADD_MTCH.

The mask register MASK_REG[7:0] enables a range of addresses to be decoded. In particular, the mask register MASK_REG[7:0] controls the outputs of the OR gates 198 through 212. When these bits are enabled, they will force the corresponding outputs of the OR gates 198 to 212 to be high, which, in turn, results in the corresponding address bits being ignored. A summation of all of the mask register bits MASK_REG[7:0] being asserted results in the NAND gate 216 being deasserted. When the mask register bits MASK_REG[7:0] are low, the lower byte address bits are decoded in the same manner as the upper byte address bits.

Figure 3:
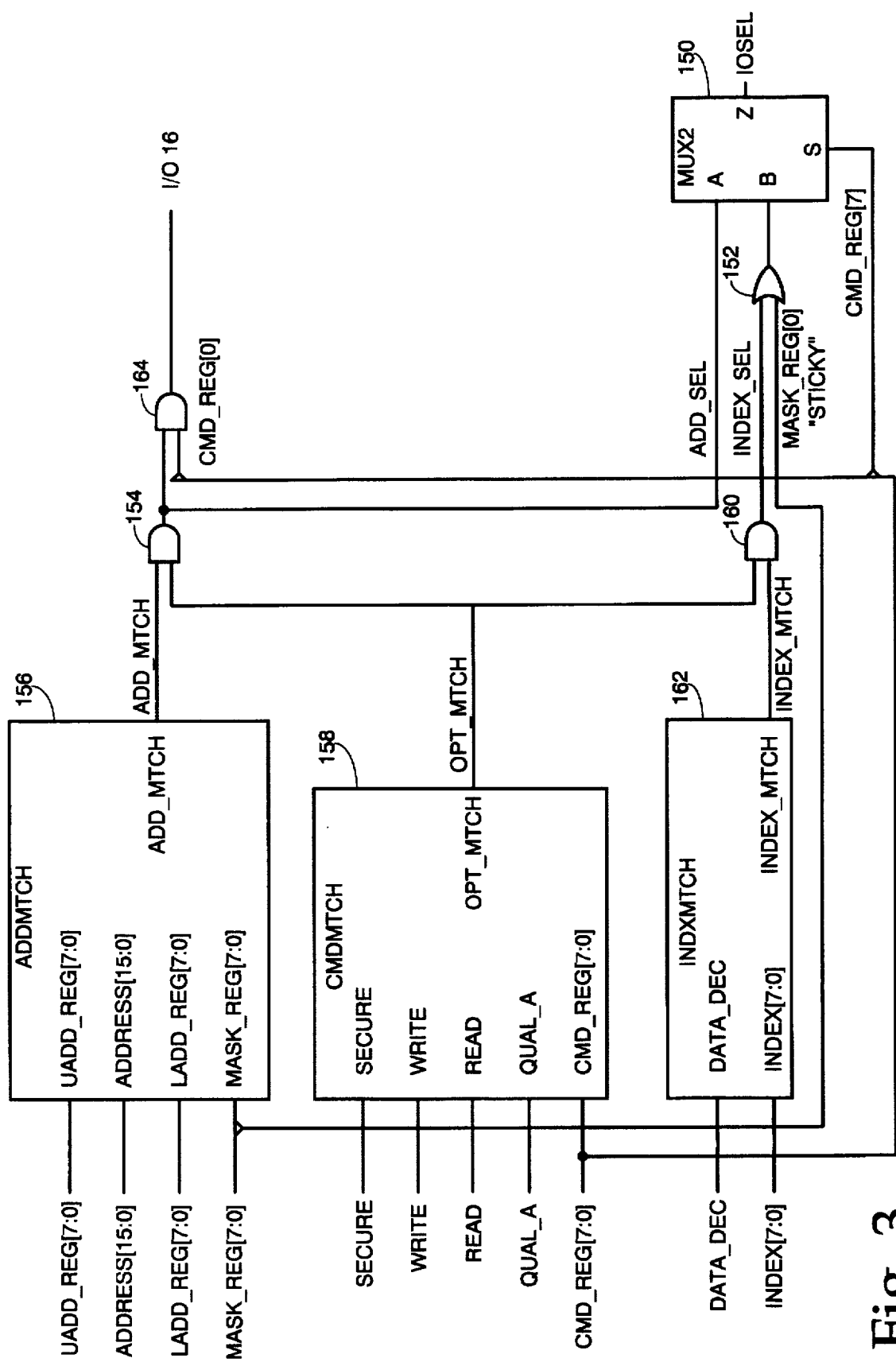
FIG. 3 is a block diagram of the programmable select logic illustrated in FIG. 1.
Figure 5:
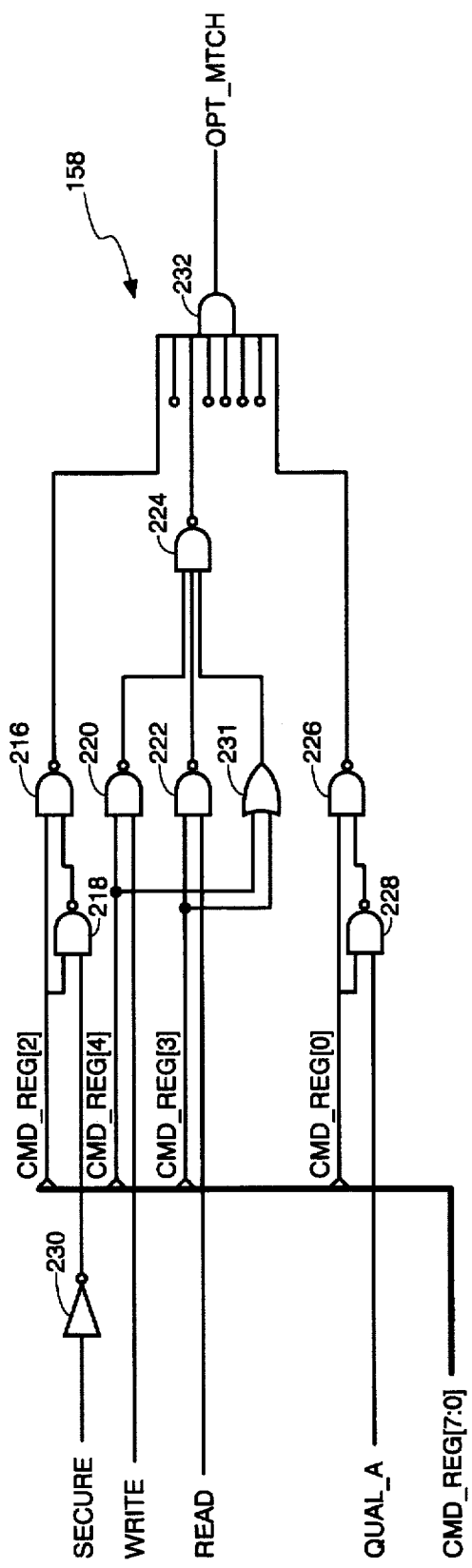
FIG. 5 is a schematic diagram of the command match logic illustrated in FIG. 3.

The command match CMD_MTCH logic 158 is illustrated in FIG. 5 and includes the NAND gates 216 through 228, the AND gate 232, the inverter 230, and the OR gate 231. In an address decode mode of operation and an index decode mode of operation, the command match CMD_MTCH logic 158 is used to enable the output signals address select ADD_SEL and index select INDX_SEL (FIG. 3). As discussed above, additional qualifiers can be added, such that the I/O devices 11 and 12 will only be selected on the expansion card 13 when the system controller 1 matches both the preprogrammed address and the particular command programmed into the command register CMD_REG [7:0] for a particular I/O device 11, 12. In particular, bits 0, 2 through 4 from the command register CMD_REG[7:0] are applied to the inputs of the NAND gates 216 through 228. Bits 3 and 4 are also applied to the OR gate 231. The WRITE, READ, and other qualifier command signals, such as QUAL_A, are applied as inputs of the NAND gates 218, 220, 222, and 228. The SECURE signal is applied to the input of the NAND gate 218 by way of the inverter 230. The outputs of the NAND gates 218 and 228 are applied as inputs to the NAND gates 216 and 226, respectively, along with the bits 2 and 0 of the command register CMD_REG. The outputs of the NAND gates 220, 222 and OR gate 231 are applied as inputs to the NAND gate 224. The outputs of the NAND gates 216, 224, and 226 are applied as inputs to the AND gate 232. The output of the AND gate 232 is the option match signal OPT_MTCH.

In operation, when a command such as READ or WRITE matches the preprogrammed command qualifier in the command register CMD_REG[7:0], the NAND gate 232 will be enabled, which, in turn, will enable the AND gates 154 and 160 (FIG. 3) to enable the I/O select signals IOSEL during an address and index mode of operation. During a sticky bit mode of operation, the command match CMD_MTCH logic 158 is ignored.

Figure 6:
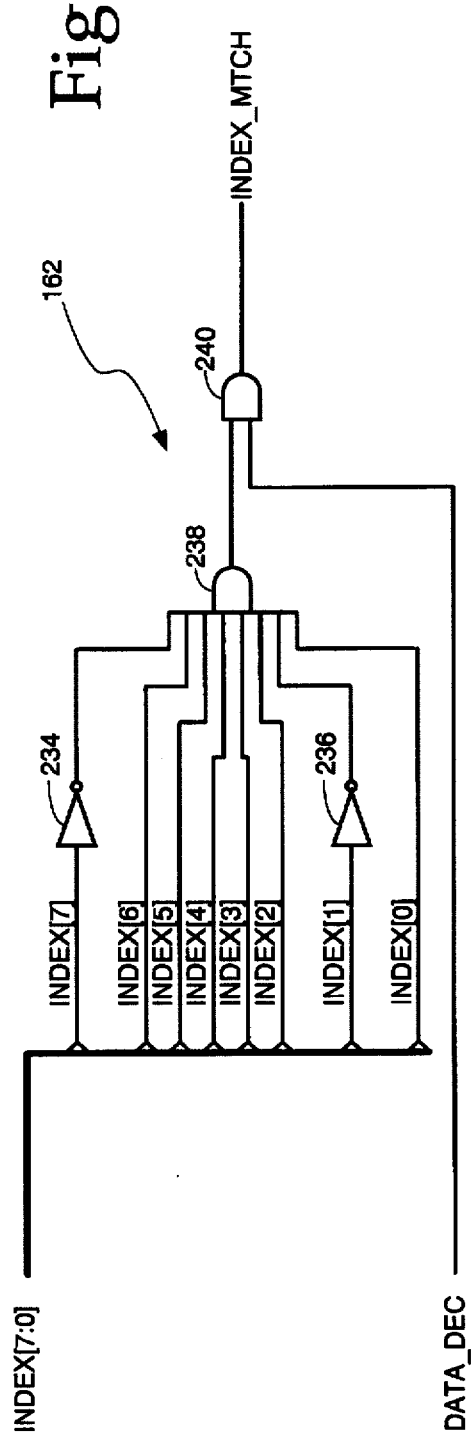
FIG. 6 is a schematic diagram of the index match logic illustrated in FIG. 3.

The index match INDX_MTCH logic 162 is illustrated in FIG. 6 and includes the inverters 234 and 236 and the AND gates 238 to 240. The index match logic INDX_MTCH 162 is used to enable the AND gate 160 (FIG. 3), which, in turn, is used in an index mode of operation. The value from the index register 90 (FIG. 2) is applied to the inputs of the AND gate 238 with bits 1 and 7 of the index register 90 being inverted by inverters 234 and 236. The output of the AND gate 238 is applied to one input of the AND gate 240 along with the data decode signal DATA_DEC. The AND gate 238 decodes the index value written to the index register 90 (FIG. 2).

The signal DATA_DEC (FIG. 2) is available at the output of the OR gate 132 and is enabled whenever system controller 1 initiates a read or write access to the port. When both the output of the AND gate 238 is asserted along with the data decode signal DATA_DEC, the index match signal INDX_MTCH goes high.

Remapping of IRO and DMA Control Lines

To provide flexibility and alleviate the burdens of knowing the details of microcomputer system resources and hardware locations, the embodiment uses a hardware method to provide a system having means for remapping input I/O lines to any one or more output I/O lines under software control. The embodiment includes mapping interrupt requests (IRQs) and direct memory access (DMA) I/O channel control lines to multiple output destinations. Since in many cases the complexity of a microcomputer configuration is directly related to the multiplexing of the interrupt and DMA I/O channel control lines, this complexity may be reduced considerably by eliminating the need for physical jumpers manually placed by the user when configuring the system for use with devices which use the interrupt and DMA I/O channels.

The use of jumpers is burdensome and often confusing to users. In fact, improper jumper configuration often creates system conflicts which, through the eyes of the novice user, often looks like software incompatibility issues when in fact the problem actually only lies in the improper hardware jumper configuration. Microcomputer systems have typically been built with a confusing matrix of these hardware jumpers and complex related documentation which is also confusing. Different motherboards and add-on cards have added to the confusion by placing these hardware jumpers in different locations depending on the particular product. Moreover, if a resource limit is reached because too many different jumper options have been used up, then some add-on boards or system options may not be available to the user. All this has historically left users confused with how interrupts and DMA I/O control lines should be configured. Accordingly, the elimination of physical jumpers as provided by the embodiment considerably reduces the complexity and user confusion associated with interrupt and DMA I/O control line configuration.

The embodiment provides programmable DMA switching of six (6) different pairs of DMA control lines to be mapped to three (3) different sources. The embodiment also provides for the programmable switching of six (6) IRQ IN lines to any of six (6) IRQ OUT lines. Of course, the mapping of three (3) DMA input pairs to six (6) output pairs and the mapping of six (6) IRQ input lines to six (6) IRQ output lines is only an arbitrary choice for the embodiment; any number of input and output I/O control lines could be switched in accordance with the invention (2 channels, e.g., 0,1, are shown in FIG. 1 for the interrupt and DMA control lines). As will be described in more detail below, switching is provided by the programmable device 2 through a series of registers which control multiplexers (MUXs) and demultiplexers (DEMUXs) which carry out the switching of the control lines. The registers reside in the register file 6 as described above. The programmable device 2 is disposed between the system controller 1 via the system bus 3 and the option card 13 to facilitate I/O communications with option card 13 control and support I/O devices 11, 12 over interrupt and DMA I/O channels. DMA request/acknowledging mapping logic 10 (FIG. 1) utilizes MUXs and DEMUXs as well as associated glue logic which is described below. The interrupt mapping logic 9 uses DEMUXs and associated glue logic described below.

DMA Mapping Logic

In order to make the system as integrated as possible, the programmable device 2 controls all system I/O functions, controls the I/O data paths, and routes signals critical to the DMA and IRQ paths. The mapping control logic is normally programmed by the system firmware during the power-up sequence to industry standard location which may be reprogrammed later under software control. Referring again to FIG. 1, it can be seen that the system address bus and the XDATA bus are both connected to the register file 6 within the programmable device 2. The register file 6 contains numerous READ and WRITE 8-bit registers, six of which are of interest in the present discussion, namely, the three DMA registers and the three IRQ registers. All of these registers are accessed by an indexing mechanism which is controlled through two address locations within the system's real I/O address space, as described above.

FIG. 2 shows the register file wherein the registers for DMA switching of DMA channel 1 and channel 0, channel 3 and channel 2, and channel 5 and channel 4, DMASW10_REG, DMASW32_REG, and DMASW54_REG, respectively, are programmable registers controlling DMA request acknowledging mapping logic 10. The location of the registers in the embodiment are at index x045, x046, and x047 ports respectively. The registers for interrupt request switching of interrupt channel 1 and channel 0, channel 3 and channel 2, and channel 5 and channel 4, IRQSW10_REG, IRQSW32_REG, and IRQSW54_REG, respectively, are the registers controlling the interrupt mapping logic 9 (FIG. 1) located at index x041, x042, and x043 ports respectively, in the embodiment. The interrupt and DMA I/O channel control registers are written to under program control by indexing in data transfer to the programmable device 2, as described above.

Each of the six interrupt and DMA control registers are 8-bit latches wherein each byte comprises a low nibble and a high nibble, and each nibble controls an I/O channel (DMA control line pair or interrupt control line). The DMA and interrupt control lines are numbered from 0 to 5, wherein each number represents a DMA control line pair comprising a DMA request signal line (DRQ) and a DMA acknowledge signal line (DACK) in the case of a DMA channel, and represents an interrupt request (IRQ) line in the case of an interrupt channel.

Figure 7:
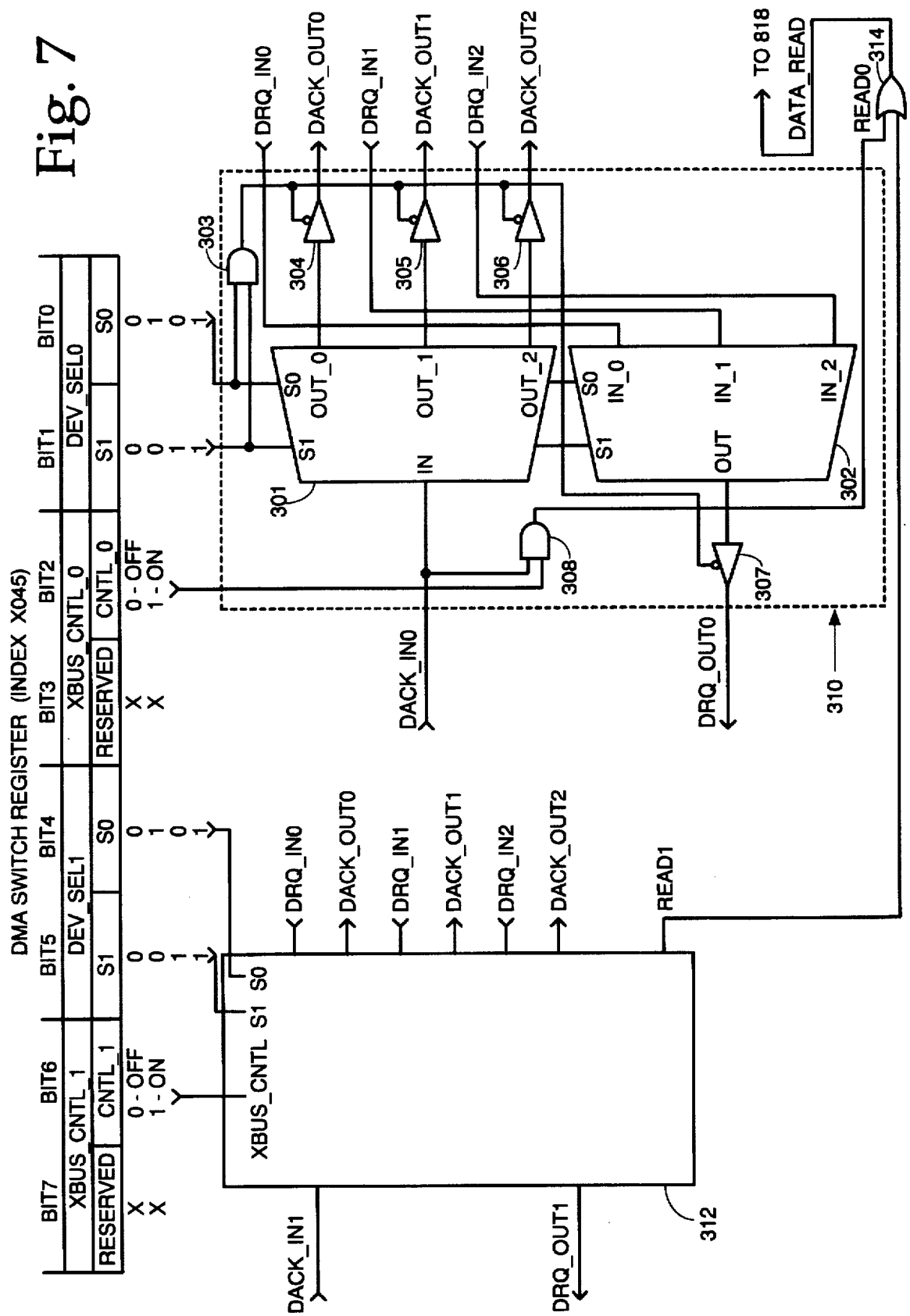
FIG. 7 is a block/schematic diagram of the direct memory access (DMA) switch register and related circuitry for remapping DMA I/O control lines.

FIG. 7 represents the first DMA mapping switch register from the register file 6. As can be seen from FIG. 7, the DMA mapping switch registers control two sets of DMA channel control line pairs each. The DMA switch register shown in FIG. 7 is DMASW10_REG[7:0] which controls DMA input channel 0 and DMA input channel 1. The control circuitry shown in FIG. 7 routes either DMA input channel to any one of DMA output channels 0,1, or 2.

The following TABLE 1 represents the programming of the data byte represented by the DMA switch registers.

(DACK_IN0/DRQ_OUT0 and DACK_IN1/DRQ_OUT1). The first two register bits 0,1 are for device select channel 0. DEV_SEL0 which controls the demultiplexing at DEMUX 301 of DACK_IN0 to DACK_OUT0, DACK_OUT1, or DACK_OUT2. The first two register bits 0,1, DEV_SEL0 also control the demultiplexing at MUX 302 of DRQ_IN0, DRQ_IN1, or DRQ_IN2 to DRQ_OUT0. DEMUX 301 and MUX 302 are controlled via control lines S0 and S1 from DEV_SEL0 in order to multiplex and demultiplex the DMA I/O control line signals. Also, the output of DEMUX 301 and MUX 302 are tri-stated by the control lines S0 and S1 by AND gate 303 by controlling tri-state buffers 304, 305, 306, and 307 as shown in FIG. 7. The DMA switching DEMUX 301 and MUX 302 plus glue logic is represented generally with the dashed line Box 310. Similarly, the upper nibble of the register of TABLE 1 and FIG. 7 controls a DEMUX and MUX with a Box 312 similar to Box 310 to route DMA I/O control line signal paths for DMA channel 1.

The XBUS_CNTL_0 and XBUS_CNTL_1 bits of the DMA switch register DMASW10_REG[7:0] each respec-

TABLE 1

DMA_SWITCH REGISTER

| Register(s): | DMA_SWITCH_1_0 |
| | DMA_SWITCH_3_2 |
| | DMA_SWITCH_5_4 |
| Index(s): | x045 for DMA_SWITCH_1_0 |
| | x046 for DMA_SWITCH_3_2 |
| | x047 for DMA_SWITCH_5_4 |
| Mode: | Read/Write |
| Description: | These registers control the DRQ_OUT and DACK_IN pins. They control which device DRQ_IN and DACK_OUT should be assigned to each bus DRQ_OUT and DACK_IN. Each half register is associated with the bus side pins. For example, DMA_SWITCH_5_4 determines the settings for the DMA_OUT[5] and DACK_IN[5] pins and for the DMA_OUT[4] and DACK_IN[4] pins. |

| Bits: | 7 | 6 | 5 | 4 | 3 | 2 | 1 | 0 |
|---|---|---|---|---|---|---|---|---|
| Fields: | XBUS_CNTRL_1 | DEV_SEL_1 | | | XBUS_CNTRL_0 | DEV_SEL_0 | | |
| Reset State: | reserved | X | X | X | reserved | X | X | X |

(DMA_SWITCH_1_0 shown)

Field Description

| DEV_SEL_X | This field selects which device DRQ_OUT[N] and returning DACK_IN[N] will use this DRQ_OUT[X] DACK_IN[X] (X= register half number, N=sel value): |
| | DEV_SEL_0=00 connects DRQ_IN[0] to the DRQ_OUT[0] and DACK_IN[0] to DACK_OUT[0]. |
| | DEV_SEL_0=01 connects DRQ_IN[1] to the DRQ_OUT[0] and DACK_IN[0] to DACK_OUT[1]. |
| | DEV_SEL_0=10 connects DRQ_IN[2] to the DRQ_OUT[0] and DACK_IN[0] to DACK_OUT[2]. |
| | DEV_SEL_0=11 unused combination disables DRQ_OUT[0]. The DACK_IN[0] will continue to control the XBUSes as configured. |
| XBUS_CNTRL_X | This field determines whether XBUS control lines will be used during the DACK_IN[X]. |

Figure 10:
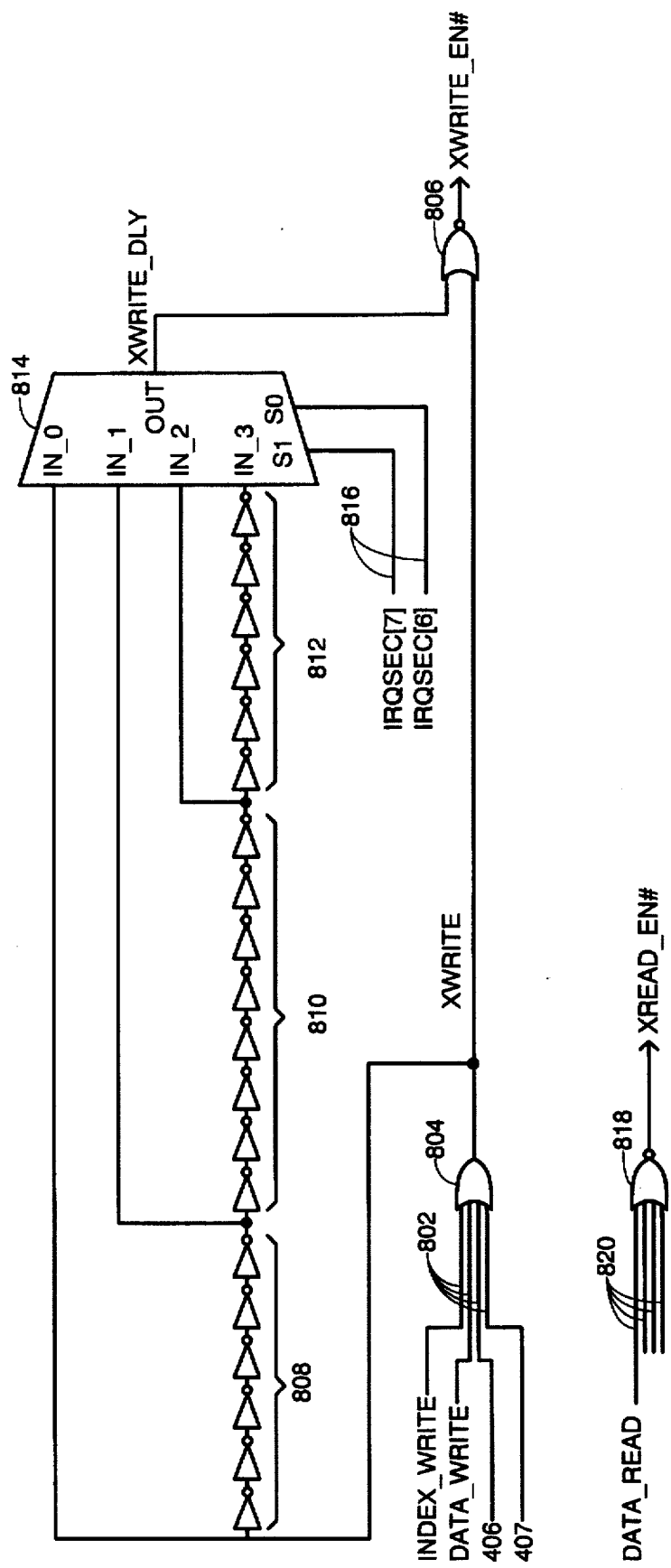
FIG. 10 is a schematic diagram of XBUS control logic.

As can be seen in FIG. 7, the data byte contained in the DMA switch register shown in TABLE 1 is used to configure the multiplexer and demultiplexer circuitry of FIG. 7 as well as the XBUS control circuitry, which includes DATA_READ from the OR gate 314 output to DATA_READ 818 (FIG. 10). Only the first register (index x045) is illustrated in FIG. 7, however, the other registers are configured similarly for DMA I/O channels 2, 3 and 4, 5.

The DMA switch register for channels 0,1 according to TABLE 1 and FIG. 7 programmed at offset x045 in register file 6 will control two of the six DMA I/O control line pairs tively control the read enables for DMA channel 0 and DMA channel 1 access to the XBUS. An AND gate 308 "ANDS" the XBUS control bit 2, CNTL_0 with a DMA acknowledge input DACK_IN0 to create a read enable signal READ0, which, in turn, is "ORED" with a read enable signal READ1 by way of an OR gate 314 from DMA I/O channel 1 to apply a DATA_READ signal to a NOR gate 818 (FIG. 10) along line 820 which is described above in conjunction with XBUS control 8.

With DMA switching, in order to allow for six different lines to be mapped to three different sources with the above three registers on the programmable device 2, six DMA acknowledge IN lines are demultiplexed to three DMA acknowledge OUT lines (e.g., DACKIN0 ... DACKIN5 to DACK_OUT0 ... DACK_OUT2) as will become apparent in the discussion that follows.

DMA services provided on the motherboard and on add-on cards may access system resources by becoming a bus user directly or via the DMA controller. The purpose of DMA services is to provide for the transfer of data between I/O and memory using the DMA signals as a request to the DMA controller to obtain the bus and execute the transfer cycles. As one skilled in the art appreciates, each DMA channel has two pairs of signal lines which have already been introduced (1) "DRQ" for DMA request and (2) "DACK" for DMA acknowledge. The "DRQ and DACK" are the "pair" of DMA control signal lines which are switched in the embodiment under program control and without the use of physical jumpers. The DMA request, DRQ signal is driven by the I/O resources to request DMA service from the DMA controller. The DRQ signal will remain active until the controller responds with the appropriate DMA acknowledge, DACK signal.

The programmable DMA channel configuration provided by the embodiment meets the configuration and software requirements for each request/acknowledge pair (DRQ/ DACK), providing a very dynamic controllable technique to select and direct where DMA I/O control lines are routed. In order to provide a programmable solution, the embodiment employs the programmable device 2 which provides the required configurable DMA control line pairs for the entire system. Through software control the system interrupt and DMA resources may be mapped or disabled to allow custom configuration of the system. The DRQ_IN0-DRQ_IN2 input pins may be mapped to any one or more of the DRQ_OUT0-DRQ_OUT5 output pins. The DRQ_OUT pins are tri-stated when not being used by a DRQIN, allowing for an external device on the system side to drive these lines. Since the DMA request works in pairs with the DMA acknowledge lines, the same DMA mapping circuitry also controls the input pin DACK_IN0-DACK_IN5 to DACK_OUT0-DACK_OUT2. When a DACK_INX from the system side is asserted, the XBUS control block may be used for the cycle, depending on how the DMA switch register DMASWXX_REGis configured. The XBUS may be used even though a DACKIN# signl is not being used by any of the device channels.

Figures 8A, 8B:
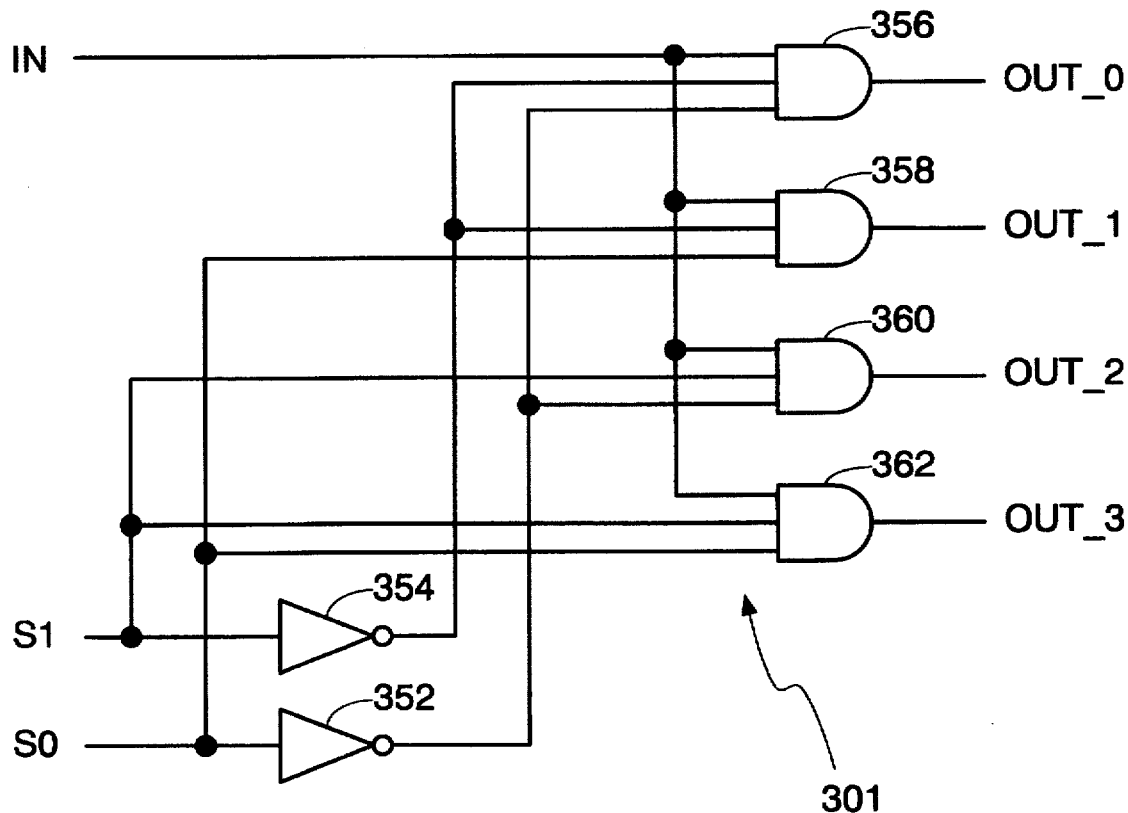
FIG. 8A is a schematic diagram of the demultiplexing logic circuitry used for DMA switching.
FIG. 8B is a truth table corresponding to the logic circuitry of FIG. 8A.

FIG. 8A represents exemplary logic circuitry for implementing the DMA mapping DEMUX 301, and FIG. 8B shows a truth table relating where the IN signal will be routed according to S0 and S1 to OUT_0, OUT_1, OUT_2, or OUT_3. The circuitry represented by FIG. 8A and FIG. 8B shows how the control lines S0 and S1 affect the DEMUX 301 circuitry. The circuit of FIG. 8A provides for AND gates 356, 358, 360, and 362, each having three inputs and one output. One of the inputs to each of the AND gates 356, 358, 360, and 362 is an IN signal. Inverted and noninverted control signls S0 and S1 are provided to each of the inputs to the AND gates 356, 358, 360, and 362. The control signals S0 and S1 are applied as inputs to each of the AND gates 356, 358, 360 and 362. These signals S0 and S1 are also inverted by way of inverters 352 and 354, respectively, and likewise applied as inputs to each of the AND gates 356, 358, 3609 and 362. Accordingly, when S0 and S1 are low for example, the IN signal will be routed to OUT_0 via AND gate 356. The other ways in which the IN signal is routed through the circuitry with control lines S0 and S1 is represented by the truth table shown in FIG. 8B.

Figures 9A, 9B:
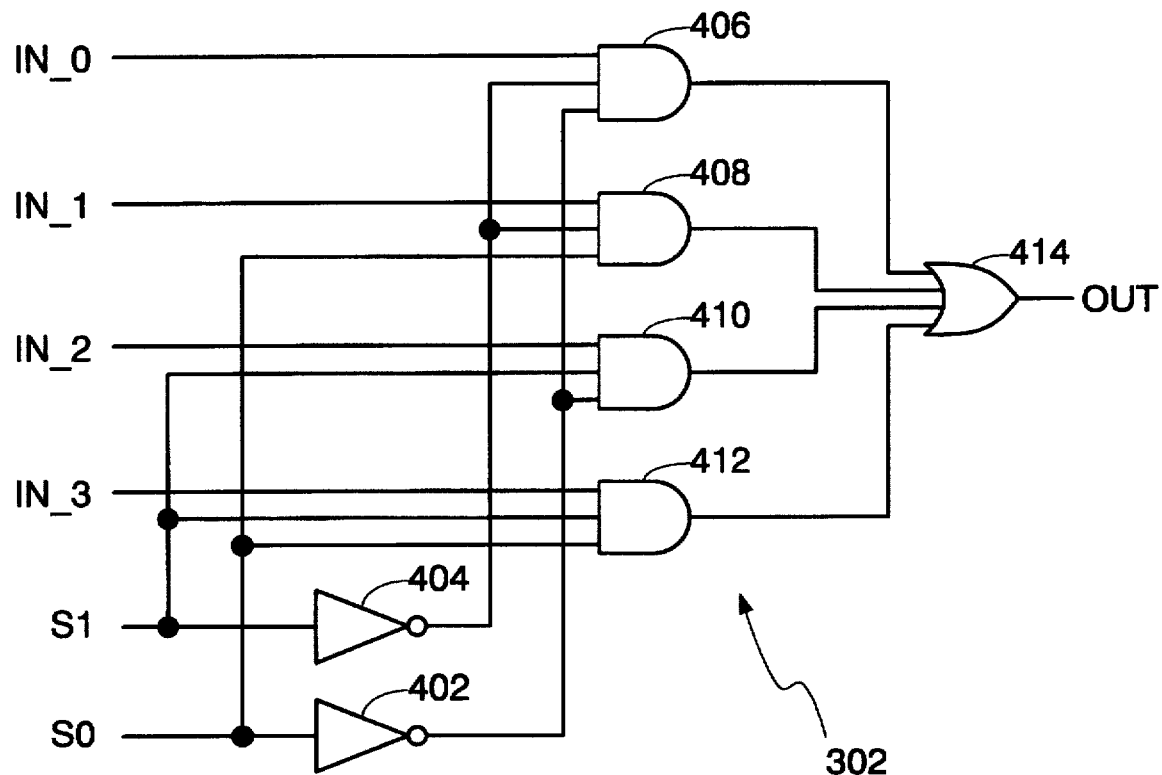
FIG. 9A is a schematic diagram of the multiplexing logic circuitry used for DMA switching.
FIG. 9B is a truth table corresponding to the logic circuitry of FIG. 9A.

FIG. 9A represents exemplary circuitry for DMA mapping MUX 302, and FIG. 9B represents truth table showing outputs indicating which inputs IN_0 to IN_2 are routed to the output signal OUT. The MUX 302 circuitry shown in FIG. 9A illustrates how control lines S0 and S1 affect AND gates 406, 408, 410, and 412 to determine which of input signals IN_0, IN_1, IN_2, or IN_3 are routed to the output signal OUT of a four input OR gate 414. The multiplexing is accomplished by sending noninverted versions of S1 to the input of AND gates 410 and 412, and sending inverted versions of S1 to AND gates 406 and 408 via inverter 404. Noninverted S0 control signals are sent to AND gates 408 and 412, and inverted S0 signals are sent to AND gates 406 and 410 via inverter 402. The output mapping is illustrated in the truth table of FIG. 9B.

Interrupt Mapping Logic

Figure 11A:
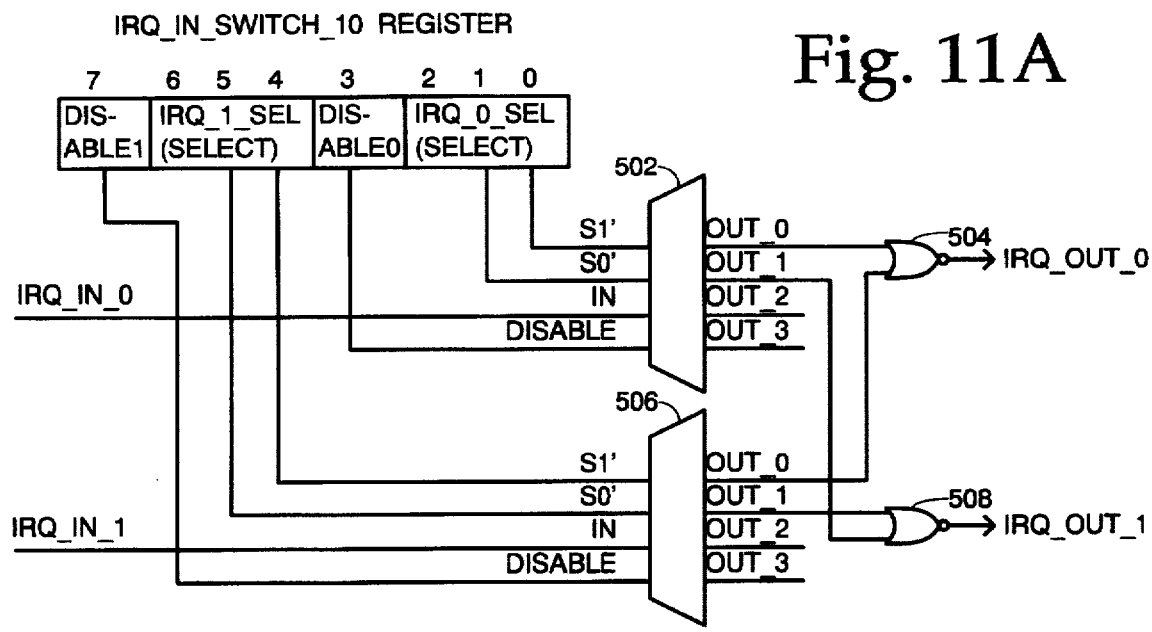
FIG. 11A is a block/schematic diagram of the interrupt request (IRQ) switch register and related circuitry for remapping IRQ I/O control lines.
Figure 11B:
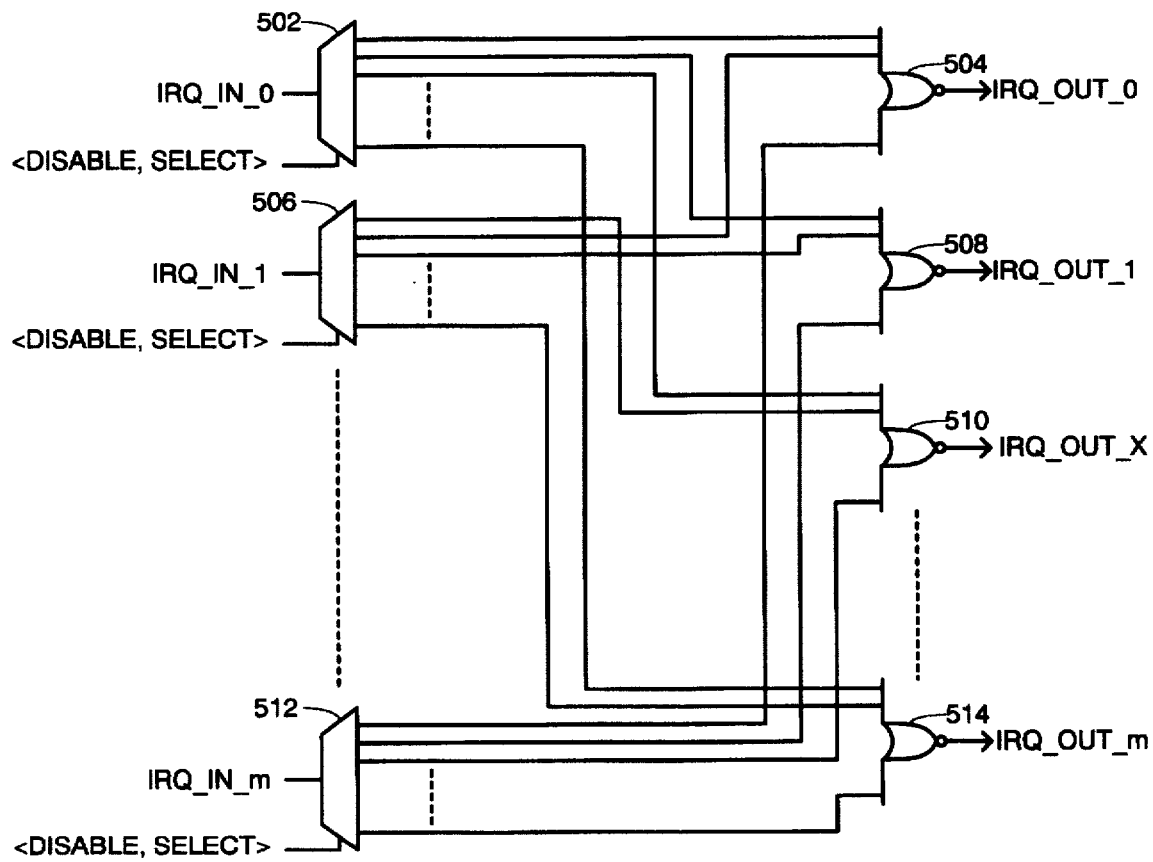
FIG. 11B is a schematic diagram of the mapping of IRQ inputs to the IRQ outputs.

Turning now to the interrupt request IRQ I/O channel control line switching, FIG. 11A, shows an IRQ switch register and related circuitry for remapping IRQ I/O control lines, and FIG. 11B expands the circuitry of FIG. 11A to provide mapping of m interrupt channels. Having described above the DMA I/O channel switching in detail, one skilled in the art will realize that IRQ switching is merely a subset of the DMA switching. The demultiplexing used for the interrupt mapping logic is much the same as that used for DMA request mapping logic. In fact, IRQ switching is much simpler than DMA switching because only one control signal needs to be routed for IRQ mapping, whereas two control signals (request and acknowledge) had to be mapped for DMA mapping. Moreover, since the IRQ signal is only an output signal being presented to the microcomputer by devices interrupting the microcomputer, only DEMUXs for demultiplexing IRQ control line signals are required for switching. Multiplexing of signals returned from the microcomputer are not required in interrupt mapping because no acknowledge signal is returned. The demultiplexer circuitry performed for IRQ mapping is much like the demultiplexing circuitry provided by DEMUX 301 described above in the context of DMA mapping.

The IRQ mapping switch registers from the register file 6 controls two (2) sets of IRQ input lines each, thus three (3) registers are required to control six (6) IRQ input lines. The six registers utilized are IRQSW10_REG, IRQSW32_REG, and IRQSW54_REG located at data offset x041, x042, and x043, respectively. The six IRQ channel inputs controlled by the three registers are 0,1 and 2,3, and 4,5, respectively.

The following TABLE 2 represents the programming byte of the IRQ_IN_SWITCH register.

TABLE 2

| IRQ_IN_SWITCH REGISTER | |
|---|---|
| Register(s): | IRQ_IN_SWITCH_1_0<br>IRQ_IN_SWITCH_3_2<br>IRQ_IN_SWITCH_5_4 |
| Index(s): | x041 for IRQ_IN_SWITCH_1_0<br>x042 for IRQ_IN_SWITCH_3_2<br>x043 for IRQ_IN_SWITCH_5_4 |
| Mode: | Read/Write |
| Description: | These registers contain the controls needed to select which IRQ_OUT will be used for IRQ_INX. |

| Bits: | 7 | 6 | 5 | 4 | 3 | 2 | 1 | 0 |
|---|---|---|---|---|---|---|---|---|
| Fields: | DISABLE1 | IRQ1_SEL | | | DISABLE0 | IRQ0_SEL | | |
| Reset State: | X | X | X | X | X | X | X | X |

TABLE 2-continued (IRQ_SWITCH_1_0 shown)

| Field Description | |
|---|---|
| IRQX_SEL | This field selects which IRQ_IN[X] is switched to IRQ_OUT[N]:<br>IRQX_SEL=000 connects IRQ_IN[X] to IRQ_OUT[0]<br>IRQX_SEL=001 connects IRQ_IN[X] to IRQ_OUT[1]<br>IRQX_SEL=010 connects IRQ_IN[X] to IRQ_OUT[2]<br>IRQX_SEL=011 connects IRQ_IN[X] to IRQ_OUT[3]<br>IRQX_SEL=100 connects IRQ_IN[X] to IRQ_OUT[4]<br>IRQX_SEL=101 connects IRQ_IN[X] to IRQ_OUT[5]<br>EXAMPLE: If every IRQ_SWITCH reg was loaded with 00h then any IRQ_IN would map to IRQ_OUT[0]. |
| DISABLEX | DISABLEX=1 disables response to IRQ_IN[X] (corresponding IRQ_OUT will float if no other IRQ_INs are mapped to it) |

The register shown in TABLE 2 indicates the data byte programming of any of the three above-described IRQ_IN_SWITCH registers which may be used for IRQ input channel mapping in accordance with the embodiment. The register shown in TABLE 2 indicates the data byte programming of any of the three above-described IRQ_IN_SWITCH registers which may be used for IRQ input channel mapping in accordance with the embodiment. The data byte of TABLE 2 is shown in FIG. 11A as IRQ_IN_SWITCH_10 register controlling two demultiplexer circuits DEMUX 502 and DEMUX 506 showing control of IRQ_OUT_0 via NOR gate 504 and IRQ_OUT_1 via NOR gate 508. The IRQ mapping of FIG. 11A may be expanded to an arbitrary number m outputs in accordance with the invention as illustrated in FIG. 11B. <Disable, Select> correspond to bits in switch register nibbles for programming DEMUXs 502, 506, and 512. Additional OR gates 510 and 514 are shown for added IRQ_OUT_X ... IRQ_OUT_m control lines.

As TABLE 2 and FIG. 11A illustrate, the 8-bit byte of an IRQSWXX_REG register from register file 6 has an upper and lower nibble, each nibble controlling an IRQ I/O channel. As shown, control signals S0, S1, and DISABLE control the routing of an IRQ input signal to an IRQ output determined by the demultiplexers DEMUX 502 and DEMUX 506, etc. The IRQ mapping is programmed in register file 6 as described earlier and will control two of the six IRQ input lines per register. Multiple inputs may be programmed for a single output allowing the sharing of multiple IRQ input to enable a single IRQ output.

Figures 12A, 12B:
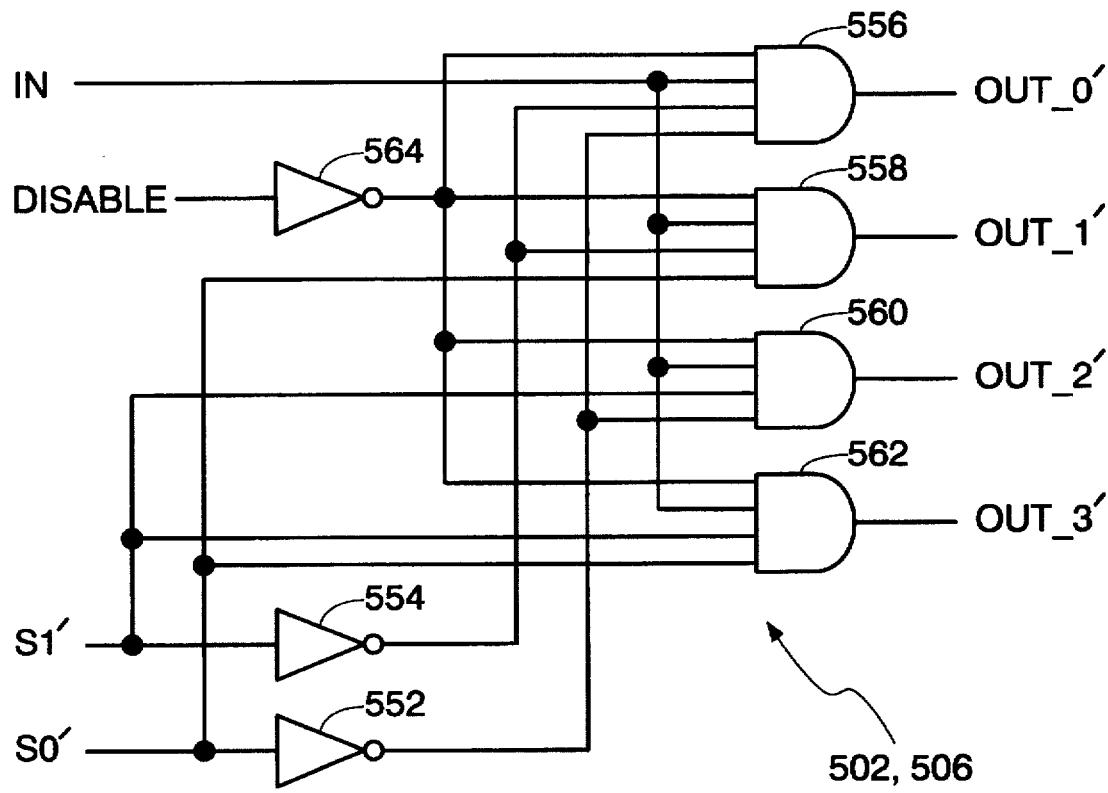
FIG. 12A is a schematic diagram of the demultiplexing logic circuitry used for IRQ switching.
FIG. 12B is a truth table corresponding to the logic circuitry of FIG. 12A.

FIG. 12A shows circuitry for implementing DEMUX 502 or DEMUX 506. The demultiplexer logic circuitry in FIG. 12A is used to route the IN signal to one of four OUT signals, OUT_0', OUT_1', OUT_2', or OUT_3'. The demultiplexing circuitry of FIG. 12A is not unlike that of FIG. 8A for the DMA control lines. However, the circuitry of FIG. 12A also includes a disable which is inverted via inverter 564 and presented as an input to each of four AND gates 556, 558, 560, and 562. When disable is high its inverted signal, a low signal, is presented to the AND gates, thus disabling their outputs by making them always low. Select signals S0' and S1' control the demultiplexing of the IN signal through the AND gates 556, 558, 560, and 562.

Selection control is provided by presenting the noninverted S0' signal to AND gate 558 and AND gate 562 while presenting an inverted S0' to AND gate 556 and AND gate 560 via inverter 552. The noninverted S1' is presented to the input of AND gate 560 and AND gate 562 while inverted S1' signals are presented to the inputs of AND gate 556 and AND gate 558 via inverter 554. The resulting signal flow of the IN signal through the demultiplexer circuitry of FIG. 12A is represented by the truth table shown in FIG. 12B.

FIGS. 13A and 13B are tables which are useful for programming the above-described hardware for remapping of IRQ and DMA control lines without hardware jumpers. FIG. 13A is used for programming the DMA remapping wherein the six control line pairs (DRQ_OUT/DACK_IN) for the Bus DMA channel are represented in the first column as 0 through 5. The device DMA channel is recorded in the second column (DRQ_IN/DACK_OUT). XBUS use is recorded in the third column and indicated as on or off. The fourth column records the DMA switch registers for DMA channels 0,1 or 2,3 or 4,5, which are programmed as discussed above. FIG. 13B is used for remapping of IRQ control lines, wherein system requirements are recorded for the six IRQ channels (0–5) in the first three columns and register values for programming are stored in the last two columns of the IRQ table.

Programmable Data Hold Control

In a computer system with multiple buses, it is advantageous to electrically isolate the buses from each other. In the preferred embodiment, the system bus 3 is isolated from the option bus XDATA by a data transceiver 5. The data transceiver 5 includes a write driver 14 and a read driver 15. The write driver 14 drives data toward the option bus 13 during write operations, and is controlled by a write enable signal XWRITE_EN#. The read driver 15 drives data toward the system bus 3 during read operations, and is controlled by a read enable signal XREAD_EN#. The write enable signal XWRITE_EN# and the read enable signal XREAD_EN# are controlled by XBUS control logic 8. The XBUS control logic 8 is shown in greater detail in FIG. 10. It is necessary that write data become valid when, or shortly after, a write signal WRITE# begins and after the write signal WRITE# ends to ensure that devices respond to valid data when receiving the write signal WRITE#. Devices latch write data on the trailing edge of the write signal WRITE#. This makes it critical to maintain valid write data beyond the end of the write signal WRITE#. Therefore, the write enable signal XWRITE_EN# must remain active beyond the end of the write signal WRITE#, ensuring the write driver 14 continues to drive the write data beyond the end of the write signal WRITE#.

Referring to FIG. 10, all write signals 802 are provided to the inputs of OR gate 804. The output of OR gate 804 XWRITE is provided to NOR gate 806 and to a group of serially connected inverters 808. The output of the group of serially connected inverters 808 is provided to a group of serially connected inverters 810 and to a MUX 814. The output of the group of serially connected inverters 810 is provided to a group of serially connected inverters 812 and to the MUX 814. The output of the group of serially connected inverters 812 is provided to the MUX 814. Finally, the output of the MUX 814 is provided to a NOR gate 806. The MUX 814 provides the outputs of the groups of serially connected inverters 808, 810, and 812 to the NOR gate 806 in response to control lines 816. Each group of serially connected inverters 808 through 812 delays its output by an incremental period. The duration of the write enable signal XWRITE_EN# is controlled by enabling the outputs of the groups of serially connected inverters 808 through 812. An OR of the write signal XWRITE and the output of the group of serially connected inverters 808 will provide a signal of slightly longer duration than the write signal XWRITE itself. An OR of the write signal XWRITE and the output of the group of serially connected inverters 808 and the output of the group of serially connected inverters 810 will provide a signal of longer duration than the combination of the write signal XWRITE and the output of serially connected inverters 808. The combination of the write signal XWRITE, the output of the group of serially connected inverters 808, the output of the group of serially connected inverters 810, and the output of the group of serially connected inverters 812 will provide the longest signal.

Figure 17:
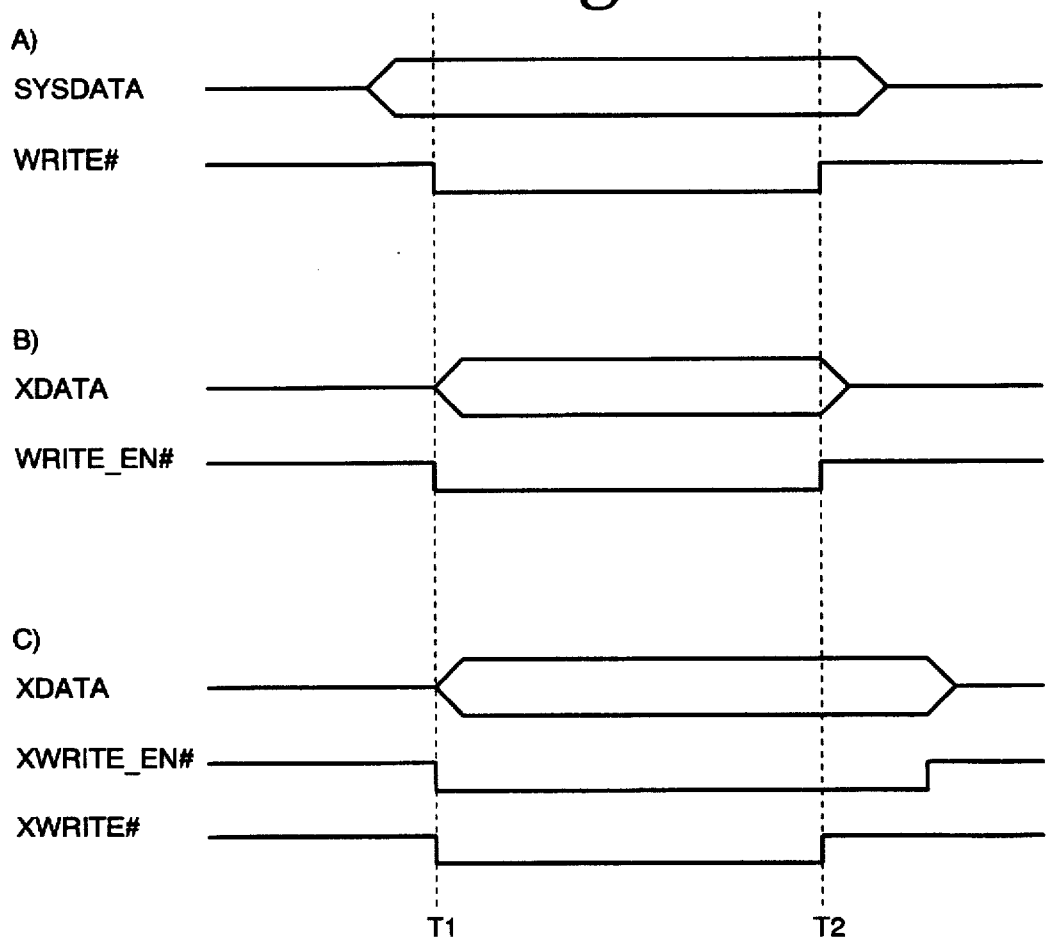
FIG. 17 is a timing diagram for the XBUS control logic.

The timing diagram FIG. 17A demonstrates the typical timing on the system bus 3 of system data SYSDATA and the write signal WRITE#. The system data SYSDATA must be present and valid shortly after time T1 and be continuously present and valid until after time T2. The write signal WRITE# goes active (low) at time T1 and inactive (high) at time T2. The write signal WRITE# informs a device that valid data is being written to it. The device may accept the data anytime the write signal WRITE# is active and latch write data on the trailing edge of the write signal WRITE#. It is important to note that a device may accept data up to thirty or forty nanoseconds after time T2 (the time the write signal WRITE# goes inactive) due to delays in the device's electrical circuitry.

The timing diagram 17B demonstrates the problems encountered when the write signal WRITE# is used to control the write driver 14 (FIG. 1) without the present invention. The XBUS data XDATA becomes valid shortly after the write enable signal XWRITE_EN# becomes active (low). The XBUS data XDATA also becomes invalid when the write enable signal XWRITE_EN# becomes inactive (high). If a slow device accepts the XBUS XDATA thirty nanoseconds after the write enable signal XWRITE_EN# becomes inactive, the device will accept invalid data.

The timing diagram 17C demonstrates the timing of a system incorporating the present invention. The XBUS data XDATA becomes valid at time T1, or shortly after time T1, when the write enable signal XWRITE_EN# becomes active (low). The XBUS data XDATA becomes invalid when the write enable signal XWRITE_EN# becomes inactive (high). The write signal XWRITE# informs a device when data is valid. The write enable signal XWRITE_EN# is equivalent to write signal XWRITE# except that the time in which it becomes inactive (high) is delayed by the delay circuit of FIG. 10. This ensures that the XBUS data XDATA will remain valid for thirty to forty nanoseconds after the write signal XWRITE# becomes inactive (high).

The duration of the delay between when the write enable signal XWRITE# becomes inactive (high) and the write enable signal XWRITE_EN# becomes inactive (high) is determined by the number of inverter gates employed in the delay circuit of FIG. 10. Differing considerations in the environment where the XBUS control 8 is used, determines the delay necessary. By way of example, increased temperature tends to reduce the amount of delay required. A temperature sensor can be used to control the delay setting selected by the control signals 816. Some devices respond more quickly than others to write signals. A longer delay may be needed in addressing slower devices than is needed in addressing faster devices. Also, some computer systems respond more quickly than others. Programmability of the delay device allows the delay device to be utilized in a wider range of computer systems. Some ASICS respond more quickly than others. Even within a given manufacturing lot, ASICS will vary in terms of the response time. An increased delay time can be used with faster responding ASICS. The preceding reasons for changing the program delay of the delay circuit of FIG. 10 are provided by way of illustration. Numerous other factors in a complex computer environment will affect the optimum delay of the write enable signal.

Shadowed Write Only Port

The I/O device 11 on option bus includes a write only port. The write only port includes signals such as a signal to enable flash ROM programming, a reset of the numeric coprocessor, a change of the speed mode of the processor, and changes to the memory map. It is often advantageous for the BIOS to be able to read the state of these signals, but they cannot be read directly from the write only port in the I/O device 11. The signals on the port in the I/O device 11 can only be changed when the system is in the index mode. The write only port on the I/O device 11 is a transparent write only latch. A typical example of a transparent write only latch is the 74×373 series from Texas Instruments. The present invention provides a shadow register, or a register that contains the same data as the write only port on the I/O device 11 while the system is in the index mode. The register 105 in FIG. 2 is normally used as the lower address decode register. However, the lower address decode register is not required when the system is in the index mode. Since the register 105 is not needed as a lower address decode register in the index mode, it is advantageous to use the register 105 as a shadow register for the write only port in the I/O device 11. This avoids the necessity of additional hardware. Further, access to the register 105 is controlled by the index register and by the SECURE signal. This allows only the BIOS, or those programs authorized by the BIOS, to either read from or write to the register 105. When data is to be written to the write only port on the I/O device 11, the data, the address of the write only port on the I/O device 11, and the write signal WRITE# are asserted on the system bus 3 by system controller 1. The data is provided via the system bus 3 to the data transceiver 5, and from the data transceiver 5 to the register file 6 and to the option bus. The data is then presented to the programmable select logic 7, and thereby, to registers 104 through 114. The combination of the write signal WRITE#, the address of the register 105, and the SECURE signal to the data port decode logic 92, signals the register select logic 93 to allow data to be written to the register 105.

Specifically, once the programmable select logic 7 is programmed into the indexed write mode, and the register select decode logic 93 contains the address of the register 105, the system controller 1 generates the address of the write only port on the I/O device 11 which is applied to the register file 6 and the programmable select logic 7 by the system bus 3. The data simultaneously generated by the system controller 1 is applied to the register file 6 through the system bus 3, the data transceiver 5, and the option bus. Simultaneously, the system controller 1 also generates the write signal WRITE# which is applied to the programmable select logic 7. The data port decode logic 92 and the register select logic 93 decode the address as the write signal WRITE# goes active (low). The write signal WRITE# in turn drives the the I/O select signal IOSEL0# low. The active I/O select signal IOSEL0# puts the write only port on the I/O device 11 into transparent mode to read data. When the system controller 1 deactivates the write signal WRITE#

(high), the programmable select logic 7 drives the I/O select signal IOSELO# inactive (high) as well. The data on the XDATA will be latched into the write only port on the I/O device 11. Simultaneously, the data is written to the register 105. The data port decode logic 92 and the register select logic 93 address lower address decode register 105 by asserting the target register signal 136. The target register signal 136 prepares the register 105 to latch the XDATA. When the system controller 1 deasserts the write signal WRITE#, the target register signal 136 is deasserted and the register 105 latches the data. Thus, the data latched in the write only port on the I/O device 11 is identical to the data latched in register 105.

Therefore, in response to the write signal WRITE#, the data will be written to both register 105 and the write only port on the I/O device 11. When data is to be read back from the write only port on the I/O device 11, the address of the register 105 is written into the register select logic 93 to select the register 105 as the target of the next I/O cycle. Then a read cycle to the data port is initiated which asserts IOSELO to the I/O device 11 and the read signal READ# will be asserted on the system bus 3 by the system controller 1. The write only port on the I/O device 11 will not respond since it is a write only port and the device attempting to read from the write only port on the I/O device 11 will receive a signal of all ones. This is the same signal as would be received if no I/O device 11 exists.

When data is to be read from register 105, the system controller 1 asserts the read signal READ# active (low). Since the I/O select signal IOSELO# is a write only signal, it will remain inactive (high). The system controller 1 asserts an address signal to the data port decode logic 92 via the system bus 3. The data port decode logic 92 in response to the read signal READ#, and the SECURE signal, asserts a DATA_READ signal 131 active. The index register 90, having been previously programmed to point to the register 105, asserts a signal to the MUX 130 to select the output of the register 105. The DATA_READ signal 131 is also applied to the AND gate 133 along with the value in bit 7 of the index register 90. The output of the AND gate 133 enables a tri-state device 129 to receive data from the MUX 130.

However, if the read signal and the address of the write only port on the I/O device 11 are asserted with the SECURE signal, the data port decode logic 92 and the register select logic 93 will cause the MUX 130 to not present the data in the register 105.

This provides maximum security for the write only port on the I/O device 11 since a device not authorized by the BIOS to read the register 105 cannot even determine if the I/O device 11 exists. The invention is most useful where the values in a write only port are critical to system function. In many cases, a read of a register will cause a momentary fluctuation in the value in that register. If user applications are allowed to read register containing critical system control signals, fluctuations in the output signals could be modified at times which could cause damage to the system. In the present invention, not even reads by the BIOS will cause such fluctuations in a protected write only port since reads are applied to the register 105 rather than the write only port.

Security Of I/O Controller

Security from data loss to or data modification by peripheral devices is provided by control of the peripheral device interrupts. By reading peripheral devices physically connected to the system and blocking the interrupts, the system can access the peripheral devices but not allow the peripheral devices to take control of or interrupt the system. The secure switch 4 in FIG. 1 is shown as a simple key switch. It should be clear to one of skill in the art that the security switch can be provided for by numerous devices capable of providing security such as a key switch, a magnetic card reader, a personal identification number, an encrypted software key, hand scanner, a voice recognition device, other devices which identify the authority of the user asserting the secure function, on any combination of the above.

The output of the secure switch 4 is applied to the data port decode logic 92. The secure signal must be active before any output on the lines 102 or 131 from the data port decode logic 92 is possible. This prevents any of the registers 104 through 114 in the register file 6 from being read from or written to unless the SECURE signal is deasserted.

Figure 14:
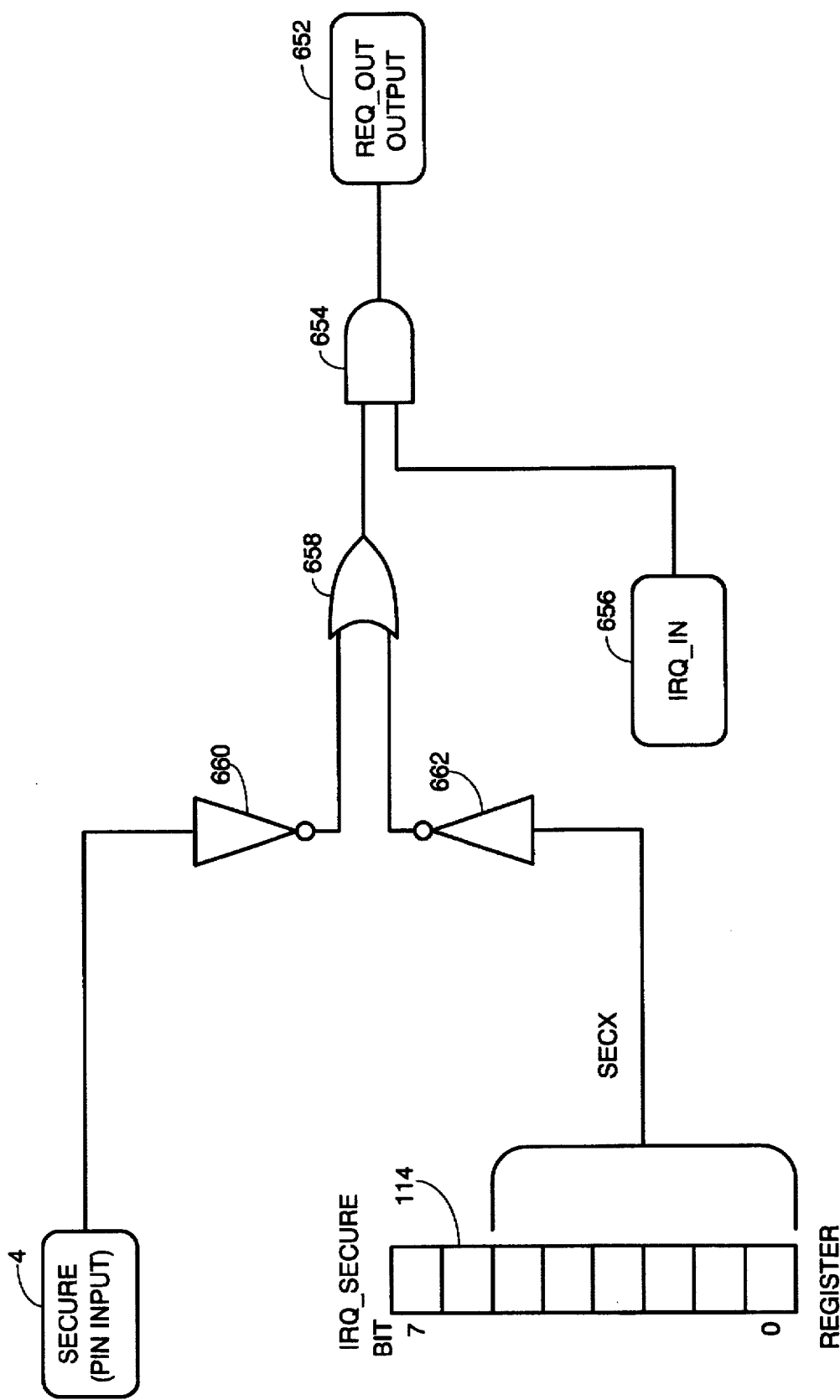
FIG. 14 is a schematic diagram of the secure-interrupt logic.

Register 114 contains a bit mask identifying interrupts that should be blocked with the SECURE signal. The circuit of FIG. 14 is replicated eight times, one for each bit in the register 114. An interrupt request 652 is the output of an AND gate 654. The AND gate 654 receives input from an interrupt request 656 and an OR gate 658. The OR gate 658 receives its input from the secure switch 4 via an inverter 660 and the relevant bit from the interrupt secure register 114 via an inverter 662.

Thus, output signal request OUT 652 is a function of (1) a request to activate that interrupt signal was made, and (2) that the SECURE signal is either inactive, or the input channel control was not programmed to disable the channel when the SECURE signal is active. The SECURE interaction is as fundamental to the assembly as the actual external request signal to generate the interrupt.

Figure 15:
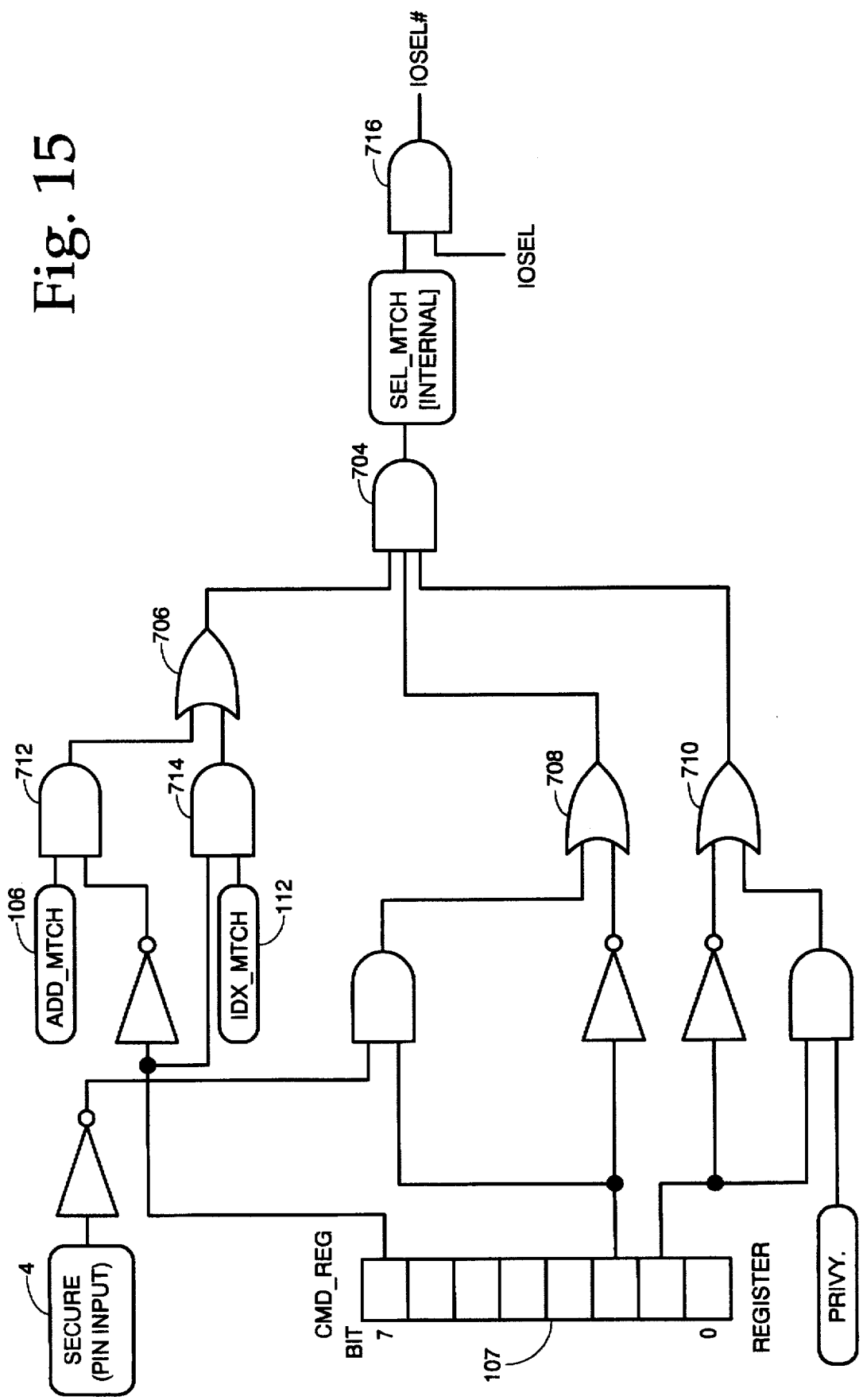
FIG. 15 is a schematic diagram of the secure-IOSELECT logic.

Referring to FIG. 15, the select match signal SEL_MTCH is the output of an AND gate 704. The AND gate 704 receives input from OR gates 706, 708, and 710. The OR gate 706 receives its input from an AND gate 712 and an AND gate 714. The AND gate 712 receives its input from the add match circuit 106 and the index bit, bit 7, of the command register 107. The AND gate 714 receives its input from the index bit, bit 7, of the register 107 and the index match circuit 112. The OR gate 708 receives its input from the secure switch 4 and the secure bit, bit 2, of the command register 107. The input to the OR gate 708 is NOT secure bit 2 or NOT secure switch 4 AND secure bit 2. The OR gate 710 receives its external input from the PRIVY bit; bit 1 of command register 107 and the privy signal PRIVY. The input of the OR gate 710 is not PRIVY and bit 1 in command register 107, or PRIVY bit 1 in command register 107 and the external PRIVY signal. Thus, the select match signal SEL_MTCH is a function of (1) one I/O channel selection indicating either direct or indirect addressing modes, (2) the SECURE signal active or the secure select control is not programmed to disable the channel when the SECURE signal is active, and (3) that the PRIVY signal is either active, or the select control is not programmed to disable the channel when PRIVY is active. Finally, the output select match signal SEL_MTCH and I/O select IOSEL, the output of MUX 150, are applied to an AND gate 716 to produce an I/O select signal IOSEL# to the option bus XDATA. Hence, no I/O selection on the option bus XDATA is possible unless the select match SEL_MTCH is active.

Figure 16:
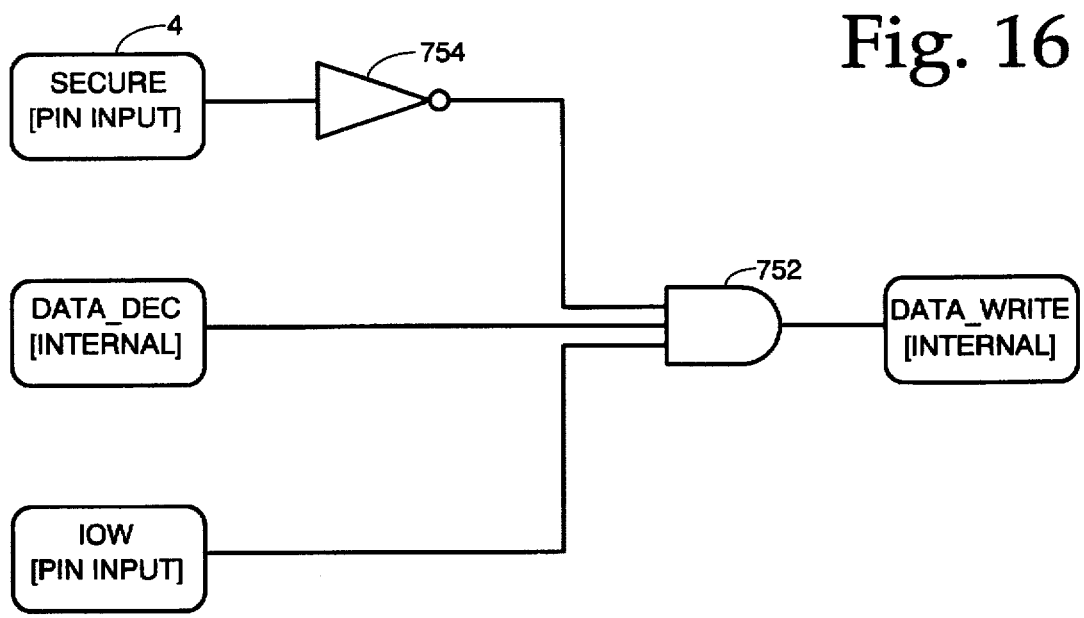
FIG. 16 is a schematic diagram of the secure data write logic.

Referring to FIG. 16, the data write signal DATA_WRITE supplied to XBUS control logic 8 is a function of the secure switch 4, the data decode signal DATA_DEC, and the I/O write signal IOW. The data write signal DATA_WRITE supplied to XBUS control 8 from the output of the AND gate 752. The inputs to the AND gate 752 include the output of inverter 754 (the NOT SECURE signal, data decode signal DATA_DEC and I/O write signal IOW). Thus, the data write signal DATA_WRITE supplied to XBUS control logic is a function of (1) I/O write signal IOW, (2) the address of the programming data register (DATA_DEC), and (3) the SECURE signal being inactive.

Obviously, many modifications and variations of the present invention are possible in light of the above teachings. Thus, it is to be understood that, within the scope of the appended claims, the invention may be practiced otherwise than as specifically described above.

-41-

```
1.  `timescale   1 ns / 10 ps
2.  `ifdef  DEFINED

3.  `else
4.  //////////////////////////////////////////////////
5.  // FILE: defines.h
6.  // DESCRIPTION:
7.  // This file sets all constant values used in both the CLIO design
8.  // code and the verification code.
9.  //////////////////////////////////////////////////

10. // define some useful constants

11. `define  z8     8'hzz
12. `define  z16    16'hzz
13. `define  zeros  'h0

14. // define some of the fixed port locations
15. `define  I_PORT      16'hE0  // default index port address for clio
16. `define  D_PORT      16'hE4  // default data port address for clio
17. `define  POST    8'h80    // LED IO port
18. `define  DIAG    8'hF2    // Diagnostic IO Port
19. `define  PRIVY_ON       8'hFB // Privy ON IO Port
20. `define  PRIVY_OFF      8'hF9 // Privy OFF IO Port
21. `define  KEY_DATA       8'h60 // Keyboard IO Port
22. `define  KEY_STATUS     8'h64 // Keyboard IO Port
23. `define  RTC_I    8'h70 // Real Time Clock IO Port
24. `define  RTC_D    8'h71 // Real Time Clock IO Port
25. `define  CLRF     8'hF0 // Clear CoProcessor Error IO Port
26. `define  EID      16'hC83  // EISA ID IO Port
27. `define  EID_MASK       16'h003 // EISA IO IO Port Mask 28. // define all of the register index port values
29. `define  IOBASE_DEFAULT  8'hE4
30. `define  SEL0CMD     8'h00
31. `define  SEL1CMD     8'h01
32. `define  SEL2CMD     8'h02
33. `define  SEL3CMD     8'h03
34. `define  SEL4CMD     8'h04
35. `define  SEL5CMD     8'h05
36. `define  SEL6CMD     8'h06
37. `define  SEL7CMD     8'h07
38. `define  SEL8CMD     8'h08
39. `define  SEL9CMD     8'h09
40. `define  SEL10CMD    8'h0A
41. `define  SEL11CMD    8'h0B
42. `define  SEL12CMD    8'h0C
43. `define  SEL13CMD    8'h0D
44. `define  SEL14CMD    8'h0E
45. `define  SEL15CMD    8'h0F
46. `define  SEL0LADD    8'h10
47. `define  SEL1LADD    8'h11
48. `define  SEL2LADD    8'h12
49. `define  SEL3LADD    8'h13
50. `define  SEL4LADD    8'h14
51. `define  SEL5LADD    8'h15
52. `define  SEL6LADD    8'h16
53. `define  SEL7LADD    8'h17
54. `define  SEL8LADD    8'h18
55. `define  SEL9LADD    8'h19
```

```
56.  `define SEL10LADD    8'h1A
57.  `define SEL11LADD    8'h1B
58.  `define SEL12LADD    8'h1C
59.  `define SEL13LADD    8'h1D
60.  `define SEL14LADD    8'h1E
61.  `define SEL15LADD    8'h1F
62.  `define SEL0UADD     8'h20
63.  `define SEL1UADD     8'h21
64.  `define SEL2UADD     8'h22
65.  `define SEL3UADD     8'h23
66.  `define SEL4UADD     8'h24
67.  `define SEL5UADD     8'h25
68.  `define SEL6UADD     8'h26
69.  `define SEL7UADD     8'h27
70.  `define SEL8UADD     8'h28
71.  `define SEL9UADD     8'h29
72.  `define SEL10UADD    8'h2A
73.  `define SEL11UADD    8'h2B
74.  `define SEL12UADD    8'h2C
75.  `define SEL13UADD    8'h2D
76.  `define SEL14UADD    8'h2E
77.  `define SEL15UADD    8'h2F
78.  `define SEL0MASK     8'h30
79.  `define SEL1MASK     8'h31
80.  `define SEL2MASK     8'h32
81.  `define SEL3MASK     8'h33
82.  `define SEL4MASK     8'h34
83.  `define SEL5MASK     8'h35
84.  `define SEL6MASK     8'h36
85.  `define SEL7MASK     8'h37
86.  `define SEL8MASK     8'h38
87.  `define SEL9MASK     8'h39
88.  `define SEL10MASK    8'h3A
89.  `define SEL11MASK    8'h3B
90.  `define SEL12MASK    8'h3C
91.  `define SEL13MASK    8'h3D
92.  `define SEL14MASK    8'h3E
93.  `define SEL15MASK    8'h3F 94.  `define FIXDIS       8'h40
95.  `define IRQSW10      8'h41
96.  `define IRQSW32      8'h42
97.  `define IRQSW54      8'h43
98.  `define IRQSEC       8'h44
99.  `define DMASW10      8'h45
100. `define DMASW32      8'h46
101. `define DMASW54      8'h47
102. `define IOBASE       8'h7F
103. `define DEFINED
104. `endif
```

```
105.  `include "defines.h" // comments
106.  //////////////////////////////////////////////
107.  // MODULE:     BASEREG
108.  // MODIFICATIONS:
109.  //
110.  `define BASEREG_REV 1.00
111.  //
112.  // DESCRIPTION: This module is just a register which resets to 'hE4.
113.  // Data is written to it on the falling edge of the WR signal.
114.  // NOTE: This module uses the Toshiba structural element FD2

115.  module basereg (D_IN, WR, RESET, D_OUT);
116.  input    [7:0]  D_IN;
117.  input           WR, RESET;
118.  output [7:0]    D_OUT;

119.  wire [7:0] D_OUT;
120.  wire SET=!RESET; // since the LD3 device has a low true reset
121.  wire NWR=!WR;
122.  // latch connection allows an asynchronous reset to 0xE4 (IOBASE DEFAULT)

123.  FD2  B7 (,D_OUT[7],!D_IN[7],NWR,SET);
124.  FD2  B6 (,D_OUT[6],!D_IN[6],NWR,SET);
125.  FD2  B5 (,D_OUT[5],!D_IN[5],NWR,SET);
126.  FD2  B4 (D_OUT[4],,D_IN[4],NWR,SET);
127.  FD2  B3 (D_OUT[3],,D_IN[3],NWR,SET);
128.  FD2  B2 (,D_OUT[2],!D_IN[2],NWR,SET);
129.  FD2  B1 (D_OUT[1],,D_IN[1],NWR,SET);
130.  FD2  B0 (D_OUT[0],,D_IN[0],NWR,SET);

131.  endmodule
```

−44−

```
132.  /* veri_fix version 1.01 has been run on this file */

133.  module clio( AEN, DRQI, DRQO, IRQI, IRQO, N_CLRF, N_CSIN, N_DIAG, N_EID,
134.         N_FRCXRA, N_FRCXW, N_IO16, N_IOR, N_IOW, N_KEY, N_POST, N_PRIVY,
135.         N_RESET, N_RTC, N_SECURE, N_SL, N_XREADA, N_XREADB, N_XWRITE,
136.         NDCKI, NDCKO, SA, XD );
137.  input AEN;
138.  input [0:2] DRQI;
139.  output [0:5] DRQO;
140.  input [0:5] IRQI;
141.  output [0:5] IRQO;
142.  output N_CLRF;
143.  input N_CSIN;
144.  output N_DIAG, N_EID;
145.  input N_FRCXRA, N_FRCXW;
146.  output N_IO16;
147.  input N_IOR, N_IOW;
148.  output N_KEY, N_POST, N_PRIVY;
149.  input N_RESET;
150.  output N_RTC;
151.  input N_SECURE;
152.  output [0:15] N_SL;
153.  output N_XREADA, N_XREADB, N_XWRITE;
154.  input [0:5] NDCKI;
155.  output [0:2] NDCKO;
156.  input [0:15] SA;
157.  inout [0:7] XD;
158.  wire [2:0] DRQIN;
159.  wire [5:0] IRQIN;
160.  wire [5:0] DACKIN;
161.  wire [15:0] ADD;
162.  wire [7:0] D_IN;
163.  wire [5:0] _DRQEN;
164.  wire [5:0] _IRQ_OUT;
165.  wire [2:0] _DACK_OUT;
166.  wire [15:0] _IOSEL;
167.  wire [5:0] DRQOUT;
168.  wire [7:0] D_OUT;
169.  wire _TEST1;
170.  wire _TEST2;
171.  wire _IO16;
172.  wire _PRIVY;
173.  wire _SEL_CLRF;
174.  wire _SEL_DIAG;
175.  wire _SEL_EID;
176.  wire _SEL_KEY;
177.  wire _SEL_POST;
178.  wire _SEL_RTC;
179.  wire _XREADA;
180.  wire _XREADB;
181.  wire _XWRITE;
182.  wire _D_OE;
183.  wire RESET;
184.  wire IOW;
185.  wire IOR;
186.  wire FORCE_XW;
187.  wire FORCE_XRA;
188.  wire SEC;
189.  wire CS_IN;
190.  wire BAEN;
```

```
191.  core CORE ( ._D_OE(_D_OE), ._DACK_OUT(_DACK_OUT[0:2]), ._DRQ_EN(_DRQEN[0:5]),
192.       ._IO16(_IO16), ._IO_SEL(_IOSEL[0:15]), ._IRQ_OUT(_IRQ_OUT[0:5]),
193.       ._PRIVY(_PRIVY), ._SEL_CLRF(_SEL_CLRF), ._SEL_DIAG(_SEL_DIAG),
194.       ._SEL_EID(_SEL_EID), ._SEL_KEY(_SEL_KEY), ._SEL_POST(_SEL_POST),
195.       ._SEL_RTC(_SEL_RTC), ._TEST1(_TEST1), ._TEST2(_TEST2),
196.       ._XREADA(_XREADA), ._XREADB(_XREADB), ._XWRITE(_XWRITE),
197.       .ADD(ADD[0:15]), .AEN(BAEN), .CS_IN(CS_IN), .D_IN(D_IN[0:7]),
198.       .D_OUT(D_OUT[0:7]), .DACK_IN(DACKIN[0:5]), .DRQ_IN(DRQIN[0:2]),
199.       .DRQ_OUT(DRQOUT[0:5]), .FORCE_XRA(FORCE_XRA), .FORCE_XW(FORCE_XW),
200.       .IOR(IOR), .IOW(IOW), .IRQ_IN(IRQIN[0:5]), .RESET(RESET),
201.       .SECURE(SEC) );
202.  TLCHTD PAEN ( .A(AEN), .PI(1'b0), .Z(BAEN) );
203.  TLCHTD PSA_0_ ( .A(SA[15]), .PI(1'b0), .Z(ADD[15]) );
204.  TLCHTD PSA_1_ ( .A(SA[14]), .PI(1'b0), .Z(ADD[14]) );
205.  TLCHTD PSA_2_ ( .A(SA[13]), .PI(1'b0), .Z(ADD[13]) );
206.  TLCHTD PSA_3_ ( .A(SA[12]), .PI(1'b0), .Z(ADD[12]) );
207.  TLCHTD PSA_4_ ( .A(SA[11]), .PI(1'b0), .Z(ADD[11]) );
208.  TLCHTD PSA_5_ ( .A(SA[10]), .PI(1'b0), .Z(ADD[10]) );
209.  TLCHTD PSA_6_ ( .A(SA[9]), .PI(1'b0), .Z(ADD[9]) );
210.  TLCHTD PSA_7_ ( .A(SA[8]), .PI(1'b0), .Z(ADD[8]) );
211.  TLCHTD PSA_8_ ( .A(SA[7]), .PI(1'b0), .Z(ADD[7]) );
212.  TLCHTD PSA_9_ ( .A(SA[6]), .PI(1'b0), .Z(ADD[6]) );
213.  TLCHTD PSA_10_ ( .A(SA[5]), .PI(1'b0), .Z(ADD[5]) );
214.  TLCHTD PSA_11_ ( .A(SA[4]), .PI(1'b0), .Z(ADD[4]) );
215.  TLCHTD PSA_12_ ( .A(SA[3]), .PI(1'b0), .Z(ADD[3]) );
216.  TLCHTD PSA_13_ ( .A(SA[2]), .PI(1'b0), .Z(ADD[2]) );
217.  TLCHTD PSA_14_ ( .A(SA[1]), .PI(1'b0), .Z(ADD[1]) );
218.  TLCHTD PSA_15_ ( .A(SA[0]), .PI(1'b0), .Z(ADD[0]) );
219.  TLCHTD PDRQIN_0_ ( .A(DRQI[2]), .PI(1'b0), .Z(DRQIN[2]) );
220.  TLCHTD PDRQIN_1_ ( .A(DRQI[1]), .PI(1'b0), .Z(DRQIN[1]) );
221.  TLCHTD PDRQIN_2_ ( .A(DRQI[0]), .PI(1'b0), .Z(DRQIN[0]) );
222.  TLCHNU PIRQIN_0_ ( .A(IRQI[5]), .PI(1'b0), .Z(IRQIN[5]) );
223.  TLCHNU PIRQIN_1_ ( .A(IRQI[4]), .PI(1'b0), .Z(IRQIN[4]) );
224.  TLCHNU PIRQIN_2_ ( .A(IRQI[3]), .PI(1'b0), .Z(IRQIN[3]) );
225.  TLCHNU PIRQIN_3_ ( .A(IRQI[2]), .PI(1'b0), .Z(IRQIN[2]) );
226.  TLCHNU PIRQIN_4_ ( .A(IRQI[1]), .PI(1'b0), .Z(IRQIN[1]) );
227.  TLCHNU PIRQIN_5_ ( .A(IRQI[0]), .PI(1'b0), .Z(IRQIN[0]) );
228.  TLCHNU PDACKIN_0_ ( .A(NDCKI[5]), .PI(1'b0), .Z(DACKIN[5]) );
229.  TLCHNU PDACKIN_1_ ( .A(NDCKI[4]), .PI(1'b0), .Z(DACKIN[4]) );
230.  TLCHNU PDACKIN_2_ ( .A(NDCKI[3]), .PI(1'b0), .Z(DACKIN[3]) );
231.  TLCHNU PDACKIN_3_ ( .A(NDCKI[2]), .PI(1'b0), .Z(DACKIN[2]) );
232.  TLCHNU PDACKIN_4_ ( .A(NDCKI[1]), .PI(1'b0), .Z(DACKIN[1]) );
233.  TLCHNU PDACKIN_5_ ( .A(NDCKI[0]), .PI(1'b0), .Z(DACKIN[0]) );
234.  TLCHNU PNCSIN ( .A(N_CSIN), .PI(1'b0), .Z(CS_IN) );
235.  TLCHNU PNSECURE ( .A(N_SECURE), .PI(1'b0), .Z(SEC) );
236.  TLCHNU PNFRCXRA ( .A(N_FRCXRA), .PI(1'b0), .Z(FORCE_XRA) );
237.  TLCHNU PNFRCXW ( .A(N_FRCXW), .PI(1'b0), .Z(FORCE_XW) );
238.  TLCHNU PNIOW ( .A(N_IOW), .PI(1'b0), .Z(IOW) );
239.  TLCHNU PNRESET ( .A(N_RESET), .PI(1'b0), .Z(RESET) );
240.  TLCHNU PNIOR ( .A(N_IOR), .PI(1'b0), .Z(IOR) );
241.  BT24 PNIO16 ( .A(1'b0), .EN(_IO16), .TN(_TEST2), .Z(N_IO16) );
242.  BT24RP PDRQOUT_0_ ( .A(DRQOUT[5]), .EN(_DRQEN[5]), .TN(_TEST1), .Z(DRQO[5]) );
243.  BT24RP PDRQOUT_1_ ( .A(DRQOUT[4]), .EN(_DRQEN[4]), .TN(_TEST1), .Z(DRQO[4]) );
244.  BT24RP PDRQOUT_2_ ( .A(DRQOUT[3]), .EN(_DRQEN[3]), .TN(_TEST1), .Z(DRQO[3]) );
245.  BT24RP PDRQOUT_3_ ( .A(DRQOUT[2]), .EN(_DRQEN[2]), .TN(_TEST1), .Z(DRQO[2]) );
246.  BT24RP PDRQOUT_4_ ( .A(DRQOUT[1]), .EN(_DRQEN[1]), .TN(_TEST1), .Z(DRQO[1]) );
247.  BT24RP PDRQOUT_5_ ( .A(DRQOUT[0]), .EN(_DRQEN[0]), .TN(_TEST1), .Z(DRQO[0]) );
248.  BT24RP PIRQOUT_0_ ( .A(1'b0), .EN(_IRQ_OUT[5]), .TN(_TEST1), .Z(IRQO[5]) );
249.  BT24RP PIRQOUT_1_ ( .A(1'b0), .EN(_IRQ_OUT[4]), .TN(_TEST1), .Z(IRQO[4]) );
250.  BT24RP PIRQOUT_2_ ( .A(1'b0), .EN(_IRQ_OUT[3]), .TN(_TEST1), .Z(IRQO[3]) );
```

```
251. BT24RP PIRQOUT_3_ ( .A(1'b0), .EN(_IRQ_OUT[2]), .TN(_TEST1), .Z(IRQO[2]) );
252. BT24RP PIRQOUT_4_ ( .A(1'b0), .EN(_IRQ_OUT[1]), .TN(_TEST1), .Z(IRQO[1]) );
253. BT24RP PIRQOUT_5_ ( .A(1'b0), .EN(_IRQ_OUT[0]), .TN(_TEST1), .Z(IRQO[0]) );
254. BT8RP PDACKO_0_ ( .A(1'b0), .EN(_DACK_OUT[2]), .TN(_TEST1), .Z(NDCKO[2]) );
255. BT8RP PDACKO_1_ ( .A(1'b0), .EN(_DACK_OUT[1]), .TN(_TEST1), .Z(NDCKO[1]) );
256. BT8RP PDACKO_2_ ( .A(1'b0), .EN(_DACK_OUT[0]), .TN(_TEST1), .Z(NDCKO[0]) );
257. BT8RP PNSEL_0_ ( .A(_IOSEL[15]), .EN(1'b0), .TN(_TEST2), .Z(N_SL[15]) );
258. BT8RP PNSEL_1_ ( .A(_IOSEL[14]), .EN(1'b0), .TN(_TEST2), .Z(N_SL[14]) );
259. BT8RP PNSEL_2_ ( .A(_IOSEL[13]), .EN(1'b0), .TN(_TEST2), .Z(N_SL[13]) );
260. BT8RP PNSEL_3_ ( .A(_IOSEL[12]), .EN(1'b0), .TN(_TEST2), .Z(N_SL[12]) );
261. BT8RP PNSEL_4_ ( .A(_IOSEL[11]), .EN(1'b0), .TN(_TEST2), .Z(N_SL[11]) );
262. BT8RP PNSEL_5_ ( .A(_IOSEL[10]), .EN(1'b0), .TN(_TEST2), .Z(N_SL[10]) );
263. BT8RP PNSEL_6_ ( .A(_IOSEL[9]), .EN(1'b0), .TN(_TEST2), .Z(N_SL[9]) );
264. BT8RP PNSEL_7_ ( .A(_IOSEL[8]), .EN(1'b0), .TN(_TEST2), .Z(N_SL[8]) );
265. BT8RP PNSEL_8_ ( .A(_IOSEL[7]), .EN(1'b0), .TN(_TEST2), .Z(N_SL[7]) );
266. BT8RP PNSEL_9_ ( .A(_IOSEL[6]), .EN(1'b0), .TN(_TEST2), .Z(N_SL[6]) );
267. BT8RP PNSEL_10_ ( .A(_IOSEL[5]), .EN(1'b0), .TN(_TEST2), .Z(N_SL[5]) );
268. BT8RP PNSEL_11_ ( .A(_IOSEL[4]), .EN(1'b0), .TN(_TEST2), .Z(N_SL[4]) );
269. BT8RP PNSEL_12_ ( .A(_IOSEL[3]), .EN(1'b0), .TN(_TEST2), .Z(N_SL[3]) );
270. BT8RP PNSEL_13_ ( .A(_IOSEL[2]), .EN(1'b0), .TN(_TEST2), .Z(N_SL[2]) );
271. BT8RP PNSEL_14_ ( .A(_IOSEL[1]), .EN(1'b0), .TN(_TEST2), .Z(N_SL[1]) );
272. BT8RP PNSEL_15_ ( .A(_IOSEL[0]), .EN(1'b0), .TN(_TEST2), .Z(N_SL[0]) );
273. BT8RP PNSRTC ( .A(_SEL_RTC), .EN(1'b0), .TN(_TEST2), .Z(N_RTC) );
274. BT8RP PNSKEY ( .A(_SEL_KEY), .EN(1'b0), .TN(_TEST2), .Z(N_KEY) );
275. BT8RP PNSDIAG ( .A(_SEL_DIAG), .EN(1'b0), .TN(_TEST2), .Z(N_DIAG) );
276. BT8RP PNPRIVY ( .A(_PRIVY), .EN(1'b0), .TN(_TEST2), .Z(N_PRIVY) );
277. BT8RP PNSPOST ( .A(_SEL_POST), .EN(1'b0), .TN(_TEST2), .Z(N_POST) );
278. BT8RP PNSEID ( .A(_SEL_EID), .EN(1'b0), .TN(_TEST2), .Z(N_EID) );
279. BT8RP PNSCLRF ( .A(_SEL_CLRF), .EN(1'b0), .TN(_TEST2), .Z(N_CLRF) );
280. BT12 PNXWRITE ( .A(_XWRITE), .EN(1'b0), .TN(_TEST1), .Z(N_XWRITE) );
281. BT8 PNXREADB ( .A(_XREADB), .EN(1'b0), .TN(_TEST2), .Z(N_XREADB) );
282. BT8 PNXREADA ( .A(_XREADA), .EN(1'b0), .TN(_TEST1), .Z(N_XREADA) );
283. BD12TRP PXD_0_ ( .A(D_OUT[7]), .EN(_D_OE), .IO(XD[7]), .PI(1'b0), .TN(_TEST1),
284.     .ZI(D_IN[7]) );
285. BD12TRP PXD_1_ ( .A(D_OUT[6]), .EN(_D_OE), .IO(XD[6]), .PI(1'b0), .TN(_TEST1),
286.     .ZI(D_IN[6]) );
287. BD12TRP PXD_2_ ( .A(D_OUT[5]), .EN(_D_OE), .IO(XD[5]), .PI(1'b0), .TN(_TEST1),
288.     .ZI(D_IN[5]) );
289. BD12TRP PXD_3_ ( .A(D_OUT[4]), .EN(_D_OE), .IO(XD[4]), .PI(1'b0), .TN(_TEST1),
290.     .ZI(D_IN[4]) );
291. BD12TRP PXD_4_ ( .A(D_OUT[3]), .EN(_D_OE), .IO(XD[3]), .PI(1'b0), .TN(_TEST1),
292.     .ZI(D_IN[3]) );
293. BD12TRP PXD_5_ ( .A(D_OUT[2]), .EN(_D_OE), .IO(XD[2]), .PI(1'b0), .TN(_TEST1),
294.     .ZI(D_IN[2]) );
295. BD12TRP PXD_6_ ( .A(D_OUT[1]), .EN(_D_OE), .IO(XD[1]), .PI(1'b0), .TN(_TEST1),
296.     .ZI(D_IN[1]) );
297. BD12TRP PXD_7_ ( .A(D_OUT[0]), .EN(_D_OE), .IO(XD[0]), .PI(1'b0), .TN(_TEST1),
298.     .ZI(D_IN[0]) );

299. endmodule // clio
```

-47-

```
300. /* Verilog Net List from E.C.S. - File = CORE.v */

301. module core( ADD, AEN, CS_IN, DACK_IN, DRQ_IN, D_IN, FORCE_XRA,
302.   FORCE_XW, IOR, IOW, IRQ_IN, RESET, SECURE, DRQ_OUT, D_OUT,
303.   _DACK_OUT, _DRQ_EN, _D_OE, _IO16, _IO_SEL, _IRQ_OUT, _PRIVY,
304.   _SEL_CLRF, _SEL_DIAG, _SEL_EID, _SEL_KEY, _SEL_POST, _SEL_RTC,
305.   _TEST1, _TEST2, _XREADA, _XREADB, _XWRITE );
306. input AEN, CS_IN, FORCE_XRA, FORCE_XW, IOR, IOW, RESET, SECURE;
307. output _D_OE, _IO16, _PRIVY, _SEL_CLRF, _SEL_DIAG, _SEL_EID, _SEL_KEY,
308.   _SEL_POST, _SEL_RTC, _TEST1, _TEST2, _XREADA, _XREADB, _XWRITE;
309. input [5:0] IRQ_IN;
310. input [7:0] D_IN;
311. input [2:0] DRQ_IN;
312. input [5:0] DACK_IN;
313. input [15:0] ADD;
314. output [5:0] _IRQ_OUT;
315. output [15:0] _IO_SEL;
316. output [5:0] _DRQ_EN;
317. output [2:0] _DACK_OUT;
318. output [7:0] D_OUT;
319. output [5:0] DRQ_OUT;
320. wire [5:0] FIXDIS;
321. wire [15:0] IX_DEC;
322. wire [7:0] SEL0CMD;
323. wire [7:0] SEL1CMD;
324. wire [7:0] SEL2CMD;
325. wire [7:0] SEL3CMD;
326. wire [7:0] SEL4CMD;
327. wire [7:0] SEL6CMD;
328. wire [7:0] SEL7CMD;
329. wire [7:0] SEL8CMD;
330. wire [7:0] SEL9CMD;
331. wire [7:0] SEL10CMD;
332. wire [7:0] SEL11CMD;
333. wire [7:0] SEL12CMD;
334. wire [7:0] SEL13CMD;
335. wire [7:0] SEL14CMD;
336. wire [7:0] SEL15CMD;
337. wire [7:0] SEL0MASK;
338. wire [7:0] SEL1MASK;
339. wire [7:0] SEL2MASK;
340. wire [7:0] SEL3MASK;
341. wire [7:0] SEL4MASK;
342. wire [7:0] SEL5MASK;
343. wire [7:0] SEL6MASK;
344. wire [7:0] SEL7MASK;
345. wire [7:0] SEL8MASK;
346. wire [7:0] SEL9MASK;
347. wire [7:0] SEL10MASK;
348. wire [7:0] SEL11MASK;
349. wire [7:0] SEL12MASK;
350. wire [7:0] SEL13MASK;
351. wire [7:0] SEL14MASK;
352. wire [7:0] SEL15MASK;
353. wire [7:0] SEL0UADD;
354. wire [7:0] SEL1UADD;
355. wire [7:0] SEL2UADD;
356. wire [7:0] SEL3UADD;
357. wire [7:0] SEL4UADD;
358. wire [7:0] SEL5UADD;
```

```
359.  wire  [7:0] SEL6UADD;
360.  wire  [7:0] SEL7UADD;
361.  wire  [7:0] SEL8UADD;
362.  wire  [7:0] SEL9UADD;
363.  wire  [7:0] SEL10UADD;
364.  wire  [7:0] SEL11UADD;
365.  wire  [7:0] SEL12UADD;
366.  wire  [7:0] SEL13UADD;
367.  wire  [7:0] SEL14UADD;
368.  wire  [7:0] SEL15UADD;
369.  wire  [7:0] SEL0LADD;
370.  wire  [7:0] SEL1LADD;
371.  wire  [7:0] SEL2LADD;
372.  wire  [7:0] SEL3LADD;
373.  wire  [7:0] SEL4LADD;
374.  wire  [7:0] SEL5LADD;
375.  wire  [7:0] SEL6LADD;
376.  wire  [7:0] SEL7LADD;
377.  wire  [7:0] SEL8LADD;
378.  wire  [7:0] SEL9LADD;
379.  wire  [7:0] SEL10LADD;
380.  wire  [7:0] SEL11LADD;
381.  wire  [7:0] SEL12LADD;
382.  wire  [7:0] SEL13LADD;
383.  wire  [7:0] SEL14LADD;
384.  wire  [7:0] SEL15LADD;
385.  wire  [7:0] SEL5CMD;
386.  wire  [7:0] DMASW10;
387.  wire  [7:0] DMASW32;
388.  wire  [7:0] DMASW54;
389.  wire  [0:0] REGCNT;
390.  wire  [1:0] DMAX;
391.  wire  [7:0] IRQSEC;
392.  wire  [15:0] IO16_SEL;
393.  wire  [2:0] X14;
394.  wire  [2:0] X13;
395.  wire  [2:0] X12;
396.  wire  [2:0] X11;
397.  wire  [2:0] X10;
398.  wire  [2:0] X9;
399.  wire  [2:0] X8;
400.  wire  [2:0] X7;
401.  wire  [2:0] X6;
402.  wire  [2:0] X5;
403.  wire  [2:0] X4;
404.  wire  [2:0] X3;
405.  wire  [2:0] X2;
406.  wire  [2:0] X1;
407.  wire  [2:0] X0;
408.  wire  [2:0] X15;
409.  wire  [0:2] FXDEC;
410.  wire  [5:0] IRQO;
411.  wire  [7:0] IRQSW54;
412.  wire  [7:0] IRQSW32;
413.  wire  [7:0] IRQSW10;
414.  wire  [5:0] DRQ_EN;
415.  wire  [2:0] ACK_OUT;
416.  wire  [15:0] IO_SEL;
417.  wire  [6:0] INDEX;
418.  wire  [5:0] _IRQ_OUT;
```

-49-

```
419.  wire [15:0] _IO_SEL;
420.  wire [5:0] _DRQ_EN;
421.  wire [2:0] _DACK_OUT;
422.  wire [7:0] D_OUT;
423.  wire [5:0] DRQ_OUT;
424.  wire [5:0] IRQ_IN;
425.  wire [7:0] D_IN;
426.  wire [2:0] DRQ_IN;
427.  wire [5:0] DACK_IN;
428.  wire [15:0] ADD;

429.  dma_sw I_23 ( .DACK_IN(DACK_IN[5:0]), .DMASW10(DMASW10[7:0]),
430.     .DMASW32(DMASW32[7:0]), .DMASW54(DMASW54[7:0]),
431.     .DRQ_IN(DRQ_IN[2:0]), .IOR(IOR), .IOW(IOW), .PROG(PROG),
432.     .DACK_OUT(ACK_OUT[2:0]), .DRQ_EN(DRQ_EN[5:0]),
433.     .DRQ_OUT(DRQ_OUT[5:0]), .XA_SEL(DMAX[0]), .XB_SEL(DMAX[1]) );
434.  iosel CS15 ( .ADDRESS(ADD[15:0]), .AEN(AEN), .CMD_REG(SEL15CMD[7:0]),
435.     .DATA_DEC(DATA_DEC), .IOR(IOR), .IOW(IOW), .I_MTCH(IX_DEC[15]),
436.     .LADD_REG(SEL15LADD[7:0]), .MASK_REG(SEL15MASK[7:0]),
437.     .PRIVY(PRIVY), .PROG(PROG), .SECURE(SECURE),
438.     .UADD_REG(SEL15UADD[7:0]), .IGNORE_RD(X15[2]), .IO16(IO16_SEL[15]),
439.     .IO_SEL(IO_SEL[15]), .XA_SEL(X15[0]), .XB_SEL(X15[1]) );
440.  iosel CS14 ( .ADDRESS(ADD[15:0]), .AEN(AEN), .CMD_REG(SEL14CMD[7:0]),
441.     .DATA_DEC(DATA_DEC), .IOR(IOR), .IOW(IOW), .I_MTCH(IX_DEC[14]),
442.     .LADD_REG(SEL14LADD[7:0]), .MASK_REG(SEL14MASK[7:0]),
443.     .PRIVY(PRIVY), .PROG(PROG), .SECURE(SECURE),
444.     .UADD_REG(SEL14UADD[7:0]), .IGNORE_RD(X14[2]), .IO16(IO16_SEL[14]),
445.     .IO_SEL(IO_SEL[14]), .XA_SEL(X14[0]), .XB_SEL(X14[1]) );
446.  iosel CS13 ( .ADDRESS(ADD[15:0]), .AEN(AEN), .CMD_REG(SEL13CMD[7:0]),
447.     .DATA_DEC(DATA_DEC), .IOR(IOR), .IOW(IOW), .I_MTCH(IX_DEC[13]),
448.     .LADD_REG(SEL13LADD[7:0]), .MASK_REG(SEL13MASK[7:0]),
449.     .PRIVY(PRIVY), .PROG(PROG), .SECURE(SECURE),
450.     .UADD_REG(SEL13UADD[7:0]), .IGNORE_RD(X13[2]), .IO16(IO16_SEL[13]),
451.     .IO_SEL(IO_SEL[13]), .XA_SEL(X13[0]), .XB_SEL(X13[1]) );
452.  iosel CS12 ( .ADDRESS(ADD[15:0]), .AEN(AEN), .CMD_REG(SEL12CMD[7:0]),
453.     .DATA_DEC(DATA_DEC), .IOR(IOR), .IOW(IOW), .I_MTCH(IX_DEC[12]),
454.     .LADD_REG(SEL12LADD[7:0]), .MASK_REG(SEL12MASK[7:0]),
455.     .PRIVY(PRIVY), .PROG(PROG), .SECURE(SECURE),
456.     .UADD_REG(SEL12UADD[7:0]), .IGNORE_RD(X12[2]), .IO16(IO16_SEL[12]),
457.     .IO_SEL(IO_SEL[12]), .XA_SEL(X12[0]), .XB_SEL(X12[1]) );
458.  iosel CS11 ( .ADDRESS(ADD[15:0]), .AEN(AEN), .CMD_REG(SEL11CMD[7:0]),
459.     .DATA_DEC(DATA_DEC), .IOR(IOR), .IOW(IOW), .I_MTCH(IX_DEC[11]),
460.     .LADD_REG(SEL11LADD[7:0]), .MASK_REG(SEL11MASK[7:0]),
461.     .PRIVY(PRIVY), .PROG(PROG), .SECURE(SECURE),
462.     .UADD_REG(SEL11UADD[7:0]), .IGNORE_RD(X11[2]), .IO16(IO16_SEL[11]),
463.     .IO_SEL(IO_SEL[11]), .XA_SEL(X11[0]), .XB_SEL(X11[1]) );
464.  iosel CS10 ( .ADDRESS(ADD[15:0]), .AEN(AEN), .CMD_REG(SEL10CMD[7:0]),
465.     .DATA_DEC(DATA_DEC), .IOR(IOR), .IOW(IOW), .I_MTCH(IX_DEC[10]),
466.     .LADD_REG(SEL10LADD[7:0]), .MASK_REG(SEL10MASK[7:0]),
467.     .PRIVY(PRIVY), .PROG(PROG), .SECURE(SECURE),
468.     .UADD_REG(SEL10UADD[7:0]), .IGNORE_RD(X10[2]), .IO16(IO16_SEL[10]),
469.     .IO_SEL(IO_SEL[10]), .XA_SEL(X10[0]), .XB_SEL(X10[1]) );
470.  iosel CS9 ( .ADDRESS(ADD[15:0]), .AEN(AEN), .CMD_REG(SEL9CMD[7:0]),
471.     .DATA_DEC(DATA_DEC), .IOR(IOR), .IOW(IOW), .I_MTCH(IX_DEC[9]),
472.     .LADD_REG(SEL9LADD[7:0]), .MASK_REG(SEL9MASK[7:0]), .PRIVY(PRIVY),
473.     .PROG(PROG), .SECURE(SECURE), .UADD_REG(SEL9UADD[7:0]),
474.     .IGNORE_RD(X9[2]), .IO16(IO16_SEL[9]), .IO_SEL(IO_SEL[9]),
475.     .XA_SEL(X9[0]), .XB_SEL(X9[1]) );
476.  iosel CS8 ( .ADDRESS(ADD[15:0]), .AEN(AEN), .CMD_REG(SEL8CMD[7:0]),
477.     .DATA_DEC(DATA_DEC), .IOR(IOR), .IOW(IOW), .I_MTCH(IX_DEC[8]),
```

-50-

```
478.      .LADD_REG(SEL8LADD[7:0]), .MASK_REG(SEL8MASK[7:0]), .PRIVY(PRIVY),
479.      .PROG(PROG), .SECURE(SECURE), .UADD_REG(SEL8UADD[7:0]),
480.      .IGNORE_RD(X8[2]), .IO16(IO16_SEL[8]), .IO_SEL(IO_SEL[8]),
481.      .XA_SEL(X8[0]), .XB_SEL(X8[1]) );
482. iosel CS7 ( .ADDRESS(ADD[15:0]), .AEN(AEN), .CMD_REG(SEL7CMD[7:0]),
483.      .DATA_DEC(DATA_DEC), .IOR(IOR), .IOW(IOW), .I_MTCH(IX_DEC[7]),
484.      .LADD_REG(SEL7LADD[7:0]), .MASK_REG(SEL7MASK[7:0]), .PRIVY(PRIVY),
485.      .PROG(PROG), .SECURE(SECURE), .UADD_REG(SEL7UADD[7:0]),
486.      .IGNORE_RD(X7[2]), .IO16(IO16_SEL[7]), .IO_SEL(IO_SEL[7]),
487.      .XA_SEL(X7[0]), .XB_SEL(X7[1]) );
488. iosel CS6 ( .ADDRESS(ADD[15:0]), .AEN(AEN), .CMD_REG(SEL6CMD[7:0]),
489.      .DATA_DEC(DATA_DEC), .IOR(IOR), .IOW(IOW), .I_MTCH(IX_DEC[6]),
490.      .LADD_REG(SEL6LADD[7:0]), .MASK_REG(SEL6MASK[7:0]), .PRIVY(PRIVY),
491.      .PROG(PROG), .SECURE(SECURE), .UADD_REG(SEL6UADD[7:0]),
492.      .IGNORE_RD(X6[2]), .IO16(IO16_SEL[6]), .IO_SEL(IO_SEL[6]),
493.      .XA_SEL(X6[0]), .XB_SEL(X6[1]) );
494. iosel CS5 ( .ADDRESS(ADD[15:0]), .AEN(AEN), .CMD_REG(SEL5CMD[7:0]),
495.      .DATA_DEC(DATA_DEC), .IOR(IOR), .IOW(IOW), .I_MTCH(IX_DEC[5]),
496.      .LADD_REG(SEL5LADD[7:0]), .MASK_REG(SEL5MASK[7:0]), .PRIVY(PRIVY),
497.      .PROG(PROG), .SECURE(SECURE), .UADD_REG(SEL5UADD[7:0]),
498.      .IGNORE_RD(X5[2]), .IO16(IO16_SEL[5]), .IO_SEL(IO_SEL[5]),
499.      .XA_SEL(X5[0]), .XB_SEL(X5[1]) );
500. iosel CS4 ( .ADDRESS(ADD[15:0]), .AEN(AEN), .CMD_REG(SEL4CMD[7:0]),
501.      .DATA_DEC(DATA_DEC), .IOR(IOR), .IOW(IOW), .I_MTCH(IX_DEC[4]),
502.      .LADD_REG(SEL4LADD[7:0]), .MASK_REG(SEL4MASK[7:0]), .PRIVY(PRIVY),
503.      .PROG(PROG), .SECURE(SECURE), .UADD_REG(SEL4UADD[7:0]),
504.      .IGNORE_RD(X4[2]), .IO16(IO16_SEL[4]), .IO_SEL(IO_SEL[4]),
505.      .XA_SEL(X4[0]), .XB_SEL(X4[1]) );
506. iosel CS3 ( .ADDRESS(ADD[15:0]), .AEN(AEN), .CMD_REG(SEL3CMD[7:0]),
507.      .DATA_DEC(DATA_DEC), .IOR(IOR), .IOW(IOW), .I_MTCH(IX_DEC[3]),
508.      .LADD_REG(SEL3LADD[7:0]), .MASK_REG(SEL3MASK[7:0]), .PRIVY(PRIVY),
509.      .PROG(PROG), .SECURE(SECURE), .UADD_REG(SEL3UADD[7:0]),
510.      .IGNORE_RD(X3[2]), .IO16(IO16_SEL[3]), .IO_SEL(IO_SEL[3]),
511.      .XA_SEL(X3[0]), .XB_SEL(X3[1]) );
512. iosel CS2 ( .ADDRESS(ADD[15:0]), .AEN(AEN), .CMD_REG(SEL2CMD[7:0]),
513.      .DATA_DEC(DATA_DEC), .IOR(IOR), .IOW(IOW), .I_MTCH(IX_DEC[2]),
514.      .LADD_REG(SEL2LADD[7:0]), .MASK_REG(SEL2MASK[7:0]), .PRIVY(PRIVY),
515.      .PROG(PROG), .SECURE(SECURE), .UADD_REG(SEL2UADD[7:0]),
516.      .IGNORE_RD(X2[2]), .IO16(IO16_SEL[2]), .IO_SEL(IO_SEL[2]),
517.      .XA_SEL(X2[0]), .XB_SEL(X2[1]) );
518. iosel CS1 ( .ADDRESS(ADD[15:0]), .AEN(AEN), .CMD_REG(SEL1CMD[7:0]),
519.      .DATA_DEC(DATA_DEC), .IOR(IOR), .IOW(IOW), .I_MTCH(IX_DEC[1]),
520.      .LADD_REG(SEL1LADD[7:0]), .MASK_REG(SEL1MASK[7:0]), .PRIVY(PRIVY),
521.      .PROG(PROG), .SECURE(SECURE), .UADD_REG(SEL1UADD[7:0]),
522.      .IGNORE_RD(X1[2]), .IO16(IO16_SEL[1]), .IO_SEL(IO_SEL[1]),
523.      .XA_SEL(X1[0]), .XB_SEL(X1[1]) );
524. iosel CS0 ( .ADDRESS(ADD[15:0]), .AEN(AEN), .CMD_REG(SEL0CMD[7:0]),
525.      .DATA_DEC(DATA_DEC), .IOR(IOR), .IOW(IOW), .I_MTCH(IX_DEC[0]),
526.      .LADD_REG(SEL0LADD[7:0]), .MASK_REG(SEL0MASK[7:0]), .PRIVY(PRIVY),
527.      .PROG(PROG), .SECURE(SECURE), .UADD_REG(SEL0UADD[7:0]),
528.      .IGNORE_RD(X0[2]), .IO16(IO16_SEL[0]), .IO_SEL(IO_SEL[0]),
529.      .XA_SEL(X0[0]), .XB_SEL(X0[1]) );
530. irqswch IRQSWCH ( .DIS0(IRQSW10[3]), .DIS1(IRQSW10[7]),
531.      .DIS2(IRQSW32[3]), .DIS3(IRQSW32[7]), .DIS4(IRQSW54[3]),
532.      .DIS5(IRQSW54[7]), .PROG(PROG), .REQ_IN(IRQ_IN[5:0]),
533.      .SEC0(IRQSEC[0]), .SEC1(IRQSEC[1]), .SEC2(IRQSEC[2]),
534.      .SEC3(IRQSEC[3]), .SEC4(IRQSEC[4]), .SEC5(IRQSEC[5]),
535.      .SECURE(SECURE), .SEL0(IRQSW10[2:0]), .SEL1(IRQSW10[6:4]),
536.      .SEL2(IRQSW32[2:0]), .SEL3(IRQSW32[6:4]), .SEL4(IRQSW54[2:0]),
537.      .SEL5(IRQSW54[6:4]), .REQ_OUT(IRQO[5:0]) );
```

```
538.  xbus_cnt XBUSCNT ( .CS_IN(CS_IN), .DLY_SEL(IRQSEC[7:6]),
539.    .DMAX(DMAX[1:0]), .FORCE_XRA(FORCE_XRA), .FORCE_XW(FORCE_XW),
540.    .FXDEC0(FXDEC[0]), .FXDEC2(FXDEC[2]), .IO16_IN(IO16_SEL[15:0]),
541.    .IOR(IOR), .IOW(IOW), .REGCNT0(REGCNT[0]), .X0(X0[2:0]),
542.    .X10(X10[2:0]), .X11(X11[2:0]), .X12(X12[2:0]), .X13(X13[2:0]),
543.    .X14(X14[2:0]), .X15(X15[2:0]), .X1(X1[2:0]), .X2(X2[2:0]),
544.    .X3(X3[2:0]), .X4(X4[2:0]), .X5(X5[2:0]), .X6(X6[2:0]),
545.    .X7(X7[2:0]), .X8(X8[2:0]), .X9(X9[2:0]), .IO16(N_1), .XREADA(N_3),
546.    .XREADB(N_4), .XWRITE(N_2) );
547.  fix_deco FIXDEC ( .ADD(ADD[15:0]), .AEN(AEN), .DISABLE(FIXDIS[5:0]),
548.    .IOR(IOR), .IOW(IOW), .RESET(RESET), .IGNORE_RD(FXDEC[2]),
549.    .PRIVY(PRIVY), .SEL_CLRF(SEL_CLRF), .SEL_DIAG(SEL_DIAG),
550.    .SEL_EID(SEL_EID), .SEL_KEY(SEL_KEY), .SEL_POST(SEL_POST),
551.    .SEL_RTC(SEL_RTC), .XA_SEL(FXDEC[0]) );
552.  nand1_37 ( _TEST1, IOR, IOW );
553.  nand1_40 ( _TEST2, IOR, IOW );
554.  regcntrl REGCNTRL ( .ADDRESS(ADD[15:0]), .AEN(AEN), .D_IN(D_IN[7:0]),
555.    .IOR(IOR), .IOW(IOW), .PRIVY(PRIVY), .RESET(RESET),
556.    .SECURE(SECURE), .DATA_DEC(DATA_DEC), .DMASW10(DMASW10[7:0]),
557.    .DMASW32(DMASW32[7:0]), .DMASW54(DMASW54[7:0]), .D_OUT(D_OUT[7:0]),
558.    .FIXDIS(FIXDIS[5:0]), .INDEX(INDEX[6:0]), .IRQSEC(IRQSEC[7:0]),
559.    .IRQSW10(IRQSW10[7:0]), .IRQSW32(IRQSW32[7:0]),
560.    .IRQSW54(IRQSW54[7:0]), .OUT_EN(D_OE), .PROG(PROG),
561.    .SEL0CMD(SEL0CMD[7:0]), .SEL0LADD(SEL0LADD[7:0]),
562.    .SEL0MASK(SEL0MASK[7:0]), .SEL0UADD(SEL0UADD[7:0]),
563.    .SEL10CMD(SEL10CMD[7:0]), .SEL10LADD(SEL10LADD[7:0]),
564.    .SEL10MASK(SEL10MASK[7:0]), .SEL10UADD(SEL10UADD[7:0]),
565.    .SEL11CMD(SEL11CMD[7:0]), .SEL11LADD(SEL11LADD[7:0]),
566.    .SEL11MASK(SEL11MASK[7:0]), .SEL11UADD(SEL11UADD[7:0]),
567.    .SEL12CMD(SEL12CMD[7:0]), .SEL12LADD(SEL12LADD[7:0]),
568.    .SEL12MASK(SEL12MASK[7:0]), .SEL12UADD(SEL12UADD[7:0]),
569.    .SEL13CMD(SEL13CMD[7:0]), .SEL13LADD(SEL13LADD[7:0]),
570.    .SEL13MASK(SEL13MASK[7:0]), .SEL13UADD(SEL13UADD[7:0]),
571.    .SEL14CMD(SEL14CMD[7:0]), .SEL14LADD(SEL14LADD[7:0]),
572.    .SEL14MASK(SEL14MASK[7:0]), .SEL14UADD(SEL14UADD[7:0]),
573.    .SEL15CMD(SEL15CMD[7:0]), .SEL15LADD(SEL15LADD[7:0]),
574.    .SEL15MASK(SEL15MASK[7:0]), .SEL15UADD(SEL15UADD[7:0]),
575.    .SEL1CMD(SEL1CMD[7:0]), .SEL1LADD(SEL1LADD[7:0]),
576.    .SEL1MASK(SEL1MASK[7:0]), .SEL1UADD(SEL1UADD[7:0]),
577.    .SEL2CMD(SEL2CMD[7:0]), .SEL2LADD(SEL2LADD[7:0]),
578.    .SEL2MASK(SEL2MASK[7:0]), .SEL2UADD(SEL2UADD[7:0]),
579.    .SEL3CMD(SEL3CMD[7:0]), .SEL3LADD(SEL3LADD[7:0]),
580.    .SEL3MASK(SEL3MASK[7:0]), .SEL3UADD(SEL3UADD[7:0]),
581.    .SEL4CMD(SEL4CMD[7:0]), .SEL4LADD(SEL4LADD[7:0]),
582.    .SEL4MASK(SEL4MASK[7:0]), .SEL4UADD(SEL4UADD[7:0]),
583.    .SEL5CMD(SEL5CMD[7:0]), .SEL5LADD(SEL5LADD[7:0]),
584.    .SEL5MASK(SEL5MASK[7:0]), .SEL5UADD(SEL5UADD[7:0]),
585.    .SEL6CMD(SEL6CMD[7:0]), .SEL6LADD(SEL6LADD[7:0]),
586.    .SEL6MASK(SEL6MASK[7:0]), .SEL6UADD(SEL6UADD[7:0]),
587.    .SEL7CMD(SEL7CMD[7:0]), .SEL7LADD(SEL7LADD[7:0]),
588.    .SEL7MASK(SEL7MASK[7:0]), .SEL7UADD(SEL7UADD[7:0]),
589.    .SEL8CMD(SEL8CMD[7:0]), .SEL8LADD(SEL8LADD[7:0]),
590.    .SEL8MASK(SEL8MASK[7:0]), .SEL8UADD(SEL8UADD[7:0]),
591.    .SEL9CMD(SEL9CMD[7:0]), .SEL9LADD(SEL9LADD[7:0]),
592.    .SEL9MASK(SEL9MASK[7:0]), .SEL9UADD(SEL9UADD[7:0]),
593.    .XA_SEL(REGCNT[0]) );
594.  ix_deco I_22 ( .INDEX(INDEX[6:0]), .IX_DECODE(IX_DEC[15:0]) );
595.  not \IOS[15] ( _IO_SEL[15], IO_SEL[15] );
596.  not \IOS[14] ( _IO_SEL[14], IO_SEL[14] );
597.  not \IOS[13] ( _IO_SEL[13], IO_SEL[13] );
```

-52-

```
598.  not \IOS[12] ( _IO_SEL[12], IO_SEL[12] );
599.  not \IOS[11] ( _IO_SEL[11], IO_SEL[11] );
600.  not \IOS[10] ( _IO_SEL[10], IO_SEL[10] );
601.  not \IOS[9]  ( _IO_SEL[9],  IO_SEL[9] );
602.  not \IOS[8]  ( _IO_SEL[8],  IO_SEL[8] );
603.  not \IOS[7]  ( _IO_SEL[7],  IO_SEL[7] );
604.  not \IOS[6]  ( _IO_SEL[6],  IO_SEL[6] );
605.  not \IOS[5]  ( _IO_SEL[5],  IO_SEL[5] );
606.  not \IOS[4]  ( _IO_SEL[4],  IO_SEL[4] );
607.  not \IOS[3]  ( _IO_SEL[3],  IO_SEL[3] );
608.  not \IOS[2]  ( _IO_SEL[2],  IO_SEL[2] );
609.  not \IOS[1]  ( _IO_SEL[1],  IO_SEL[1] );
610.  not \IOS[0]  ( _IO_SEL[0],  IO_SEL[0] );
611.  not \DAO[2]  ( _DACK_OUT[2], ACK_OUT[2] );
612.  not \DAO[1]  ( _DACK_OUT[1], ACK_OUT[1] );
613.  not \DAO[0]  ( _DACK_OUT[0], ACK_OUT[0] );
614.  not \DQE[5]  ( _DRQ_EN[5], DRQ_EN[5] );
615.  not \DQE[4]  ( _DRQ_EN[4], DRQ_EN[4] );
616.  not \DQE[3]  ( _DRQ_EN[3], DRQ_EN[3] );
617.  not \DQE[2]  ( _DRQ_EN[2], DRQ_EN[2] );
618.  not \DQE[1]  ( _DRQ_EN[1], DRQ_EN[1] );
619.  not \DQE[0]  ( _DRQ_EN[0], DRQ_EN[0] );
620.  not \IQO[5]  ( _IRQ_OUT[5], IRQO[5] );
621.  not \IQO[4]  ( _IRQ_OUT[4], IRQO[4] );
622.  not \IQO[3]  ( _IRQ_OUT[3], IRQO[3] );
623.  not \IQO[2]  ( _IRQ_OUT[2], IRQO[2] );
624.  not \IQO[1]  ( _IRQ_OUT[1], IRQO[1] );
625.  not \IQO[0]  ( _IRQ_OUT[0], IRQO[0] );
626.  not I_32 ( _XREADB, N_4 );
627.  not I_33 ( _XREADA, N_3 );
628.  not I_34 ( _XWRITE, N_2 );
629.  not I_35 ( _IO16, N_1 );
630.  not I_25 ( _SEL_EID, SEL_EID );
631.  not I_26 ( _SEL_CLRF, SEL_CLRF );
632.  not I_27 ( _SEL_RTC, SEL_RTC );
633.  not I_28 ( _SEL_KEY, SEL_KEY );
634.  not I_29 ( _PRIVY, PRIVY );
635.  not I_30 ( _SEL_DIAG, SEL_DIAG );
636.  not I_31 ( _SEL_POST, SEL_POST );
637.  not I_39 ( _D_OE, D_OE );

638.  endmodule // core
```

-53-

```
639. //////////////////////////////////////////////
640. // MODULE: dma_sw
641. // It also controlles the XBUS for use during ACK's and will tristate
642. // use this line.
643. //
644. // The XBUS control for the bus side ACKs are programmable via bits
645. // 3,2 and 7,6 in the DMASW registers
646. //
647. //            DMA_ACK will control XBUS even when not enabled.
648. //            will not be able to configure a DACK on both buses
649. //
650. `define DMA_SW_REV 1.10
651. //
652. // DESCRIPTION: This block performs the mapping of 3 dma channels in to
653. // a single DMA channel in. Disabled DMA channels out will still control
654. // the XBUS via DACK in.

655. module dma_sw( DACK_IN, DMASW10, DMASW32, DMASW54, DRQ_IN, IOR, IOW, PROG
656. , DACK_OUT, DRQ_EN, DRQ_OUT, XA_SEL, XB_SEL );
657. input IOR, IOW, PROG;
658. output XA_SEL, XB_SEL;
659. input [2:0] DRQ_IN;
660. input [7:0] DMASW54;
661. input [7:0] DMASW32;
662. input [7:0] DMASW10;
663. input [5:0] DACK_IN;
664. output [5:0] DRQ_OUT;
665. output [5:0] DRQ_EN;
666. output [2:0] DACK_OUT;

667. // tristate enables for the DRQ_OUT pads. (disabled when not assigned
668. // to one of the input channels.)
669. wire EN5=!PROG && DMASW54[5:4]!=2'b11;
670. wire EN4=!PROG && DMASW54[1:0]!=2'b11;
671. wire EN3=!PROG && DMASW32[5:4]!=2'b11;
672. wire EN2=!PROG && DMASW32[1:0]!=2'b11;
673. wire EN1=!PROG && DMASW10[5:4]!=2'b11;
674. wire EN0=!PROG && DMASW10[1:0]!=2'b11;

675. wire [5:0] DRQ_EN = {EN5, EN4, EN3, EN2, EN1, EN0};

676. wire DRQ5 = EN5 && (DMASW54[5:4]==2'b00 && DRQ_IN[0]) ||
677.      (DMASW54[5:4]==2'b01 && DRQ_IN[1]) ||
678.      (DMASW54[5:4]==2'b10 && DRQ_IN[2]);
679. wire DRQ4 = EN4 && (DMASW54[1:0]==2'b00 && DRQ_IN[0]) ||
680.      (DMASW54[1:0]==2'b01 && DRQ_IN[1]) ||
681.      (DMASW54[1:0]==2'b10 && DRQ_IN[2]);
682. wire DRQ3 = EN3 && (DMASW32[5:4]==2'b00 && DRQ_IN[0]) ||
683.      (DMASW32[5:4]==2'b01 && DRQ_IN[1]) ||
684.      (DMASW32[5:4]==2'b10 && DRQ_IN[2]);
685. wire DRQ2 = EN2 && (DMASW32[1:0]==2'b00 && DRQ_IN[0]) ||
686.      (DMASW32[1:0]==2'b01 && DRQ_IN[1]) ||
687.      (DMASW32[1:0]==2'b10 && DRQ_IN[2]);
688. wire DRQ1 = EN1 && (DMASW10[5:4]==2'b00 && DRQ_IN[0]) ||
```

```
689.        (DMASW10[5:4]==2'b01 && DRQ_IN[1]) ||
690.        (DMASW10[5:4]==2'b10 && DRQ_IN[2]);
691.  wire  DRQ0 = EN0 && (DMASW10[1:0]==2'b00 && DRQ_IN[0]) ||
692.        (DMASW10[1:0]==2'b01 && DRQ_IN[1]) ||
693.        (DMASW10[1:0]==2'b10 && DRQ_IN[2]);

694.  wire [5:0] DRQ_OUT = {DRQ5, DRQ4, DRQ3, DRQ2, DRQ1, DRQ0};

695.  wire  DACK0 = !PROG && (
696.        (DMASW54[5:4]==2'b00 && DACK_IN[5]) ||
697.        (DMASW54[1:0]==2'b00 && DACK_IN[4]) ||
698.        (DMASW32[5:4]==2'b00 && DACK_IN[3]) ||
699.        (DMASW32[1:0]==2'b00 && DACK_IN[2]) ||
700.        (DMASW10[5:4]==2'b00 && DACK_IN[1]) ||
701.        (DMASW10[1:0]==2'b00 && DACK_IN[0]) ) ;

702.  wire  DACK1 = !PROG && (
703.        (DMASW54[5:4]==2'b01 && DACK_IN[5]) ||
704.        (DMASW54[1:0]==2'b01 && DACK_IN[4]) ||
705.        (DMASW32[5:4]==2'b01 && DACK_IN[3]) ||
706.        (DMASW32[1:0]==2'b01 && DACK_IN[2]) ||
707.        (DMASW10[5:4]==2'b01 && DACK_IN[1]) ||
708.        (DMASW10[1:0]==2'b01 && DACK_IN[0]) ) ;

709.  wire  DACK2 = !PROG && (
710.        (DMASW54[5:4]==2'b10 && DACK_IN[5]) ||
711.        (DMASW54[1:0]==2'b10 && DACK_IN[4]) ||
712.        (DMASW32[5:4]==2'b10 && DACK_IN[3]) ||
713.        (DMASW32[1:0]==2'b10 && DACK_IN[2]) ||
714.        (DMASW10[5:4]==2'b10 && DACK_IN[1]) ||
715.        (DMASW10[1:0]==2'b10 && DACK_IN[0]) ) ;

716.  wire [2:0] DACK_OUT = {DACK2, DACK1, DACK0};

717. // firmware will not be allowed to configure a DACK to use
718. // both xbuses.
719.  wire XA5=DACK_IN[5] && !DMASW54[7] && DMASW54[6] && !PROG;
720.  wire XA4=DACK_IN[4] && !DMASW54[3] && DMASW54[2] && !PROG;
721.  wire XA3=DACK_IN[3] && !DMASW32[7] && DMASW32[6] && !PROG;
722.  wire XA2=DACK_IN[2] && !DMASW32[3] && DMASW32[2] && !PROG;
723.  wire XA1=DACK_IN[1] && !DMASW10[7] && DMASW10[6] && !PROG;
724.  wire XA0=DACK_IN[0] && !DMASW10[3] && DMASW10[2] && !PROG;

725.  wire XB5=DACK_IN[5] && DMASW54[7] && !DMASW54[6] && !PROG;
726.  wire XB4=DACK_IN[4] && DMASW54[3] && !DMASW54[2] && !PROG;
727.  wire XB3=DACK_IN[3] && DMASW32[7] && !DMASW32[6] && !PROG;
728.  wire XB2=DACK_IN[2] && DMASW32[3] && !DMASW32[2] && !PROG;
729.  wire XB1=DACK_IN[1] && DMASW10[7] && !DMASW10[6] && !PROG;
730.  wire XB0=DACK_IN[0] && DMASW10[3] && !DMASW10[2] && !PROG;

731.  wire XA_SEL = (XA5 || XA4 || XA3 || XA2 || XA1 || XA0);
732.  wire XB_SEL = (XB5 || XB4 || XB3 || XB2 || XB1 || XB0);

733. endmodule // dma_sw
```

-55-

```
734.  'include "defines.h" // comments

735.  ///////////////////////////////////////////////////////
736.  // MODULE:    FIX_DECO
737.  // MODIFICATIONS:
738.  //
739.  'define FIX_DEC_REV 1.00
740.  //
741.  // DESCRIPTION:
742.  // This module performs the decode of all fixed ports. It includes
743.  // decode of address and command information.

744.  module fix_deco( ADD, AEN, DISABLE, IOR, IOW, RESET, IGNORE_RD, PRIVY,
745.         SEL_CLRF, SEL_DIAG, SEL_EID, SEL_KEY, SEL_POST, SEL_RTC, XA_SEL );
746.  input AEN, IOR, IOW, RESET;
747.  output IGNORE_RD, PRIVY, SEL_CLRF, SEL_DIAG, SEL_EID, SEL_KEY, SEL_POST
748.  , SEL_RTC, XA_SEL;
749.  input [5:0] DISABLE;
750.  input [15:0] ADD;

751.  wire    PRIVY;

752.  wire    POST_ADD_MTCH = ADD=='POST && !AEN && !DISABLE[0];
753.  wire    POST_CMD_MTCH = IOW;
754.  wire    SEL_POST = POST_ADD_MTCH && POST_CMD_MTCH;
755.  wire    POST_XA_SEL = POST_ADD_MTCH;

756.  wire    DIAG_ADD_MTCH = ADD=='DIAG && !AEN && !DISABLE[1] && PRIVY;
757.  wire    DIAG_CMD_MTCH = IOW;
758.  wire    SEL_DIAG = DIAG_ADD_MTCH && DIAG_CMD_MTCH;
759.  wire    DIAG_XA_SEL = DIAG_ADD_MTCH;

760.  wire    KEY_ADD_MTCH = (ADD=='KEY_STATUS || ADD=='KEY_DATA) && !AEN && !DISABLE[2];
761.  wire    KEY_CMD_MTCH = 1;
762.  wire    SEL_KEY = KEY_ADD_MTCH && KEY_CMD_MTCH;
763.  wire    KEY_XA_SEL = KEY_ADD_MTCH;

764.  wire    RTC_ADD_MTCH = (ADD=='RTC_I || ADD=='RTC_D) && !AEN && !DISABLE[3];
765.  wire    RTC_CMD_MTCH = 1;
766.  wire    SEL_RTC = RTC_ADD_MTCH && RTC_CMD_MTCH;
767.  wire    RTC_XA_SEL = RTC_ADD_MTCH;

768.  wire    CLRF_ADD_MTCH = ADD=='CLRF && !AEN && !DISABLE[4];
769.  wire    CLRF_CMD_MTCH = IOW;
770.  wire    SEL_CLRF = CLRF_ADD_MTCH && CLRF_CMD_MTCH;
```

-56-

```
771. wire    EID_ADD_MTCH = (ADD | `EID_MASK)==`EID && !AEN && !DISABLE[5];
772. wire    EID_CMD_MTCH = IOR;
773. wire    SEL_EID = EID_ADD_MTCH && EID_CMD_MTCH;
774. wire    EID_XA_SEL = EID_ADD_MTCH;

775. // all fixed registers are hard coded on the XBUSA
776. wire    XA_SEL = POST_XA_SEL || DIAG_XA_SEL || KEY_XA_SEL || RTC_XA_SEL || EID_XA_SEL;
777. wire    IGNORE_RD = POST_XA_SEL || DIAG_XA_SEL;

778. wire privy_gate = !AEN && IOW && (ADD==`PRIVY_ON || ADD==`PRIVY_OFF);
779. wire privy_on = !AEN && (ADD==`PRIVY_OFF);
780. LD3  PRIV (.D(privy_on), .G(privy_gate), .CD(!RESET), .QN(PRIVY) );

781. endmodule // fix_deco
```

-57-

```
782.  `include "defines.h" // comments
783.  //////////////////////////////////////////////
784.  // MODULE:    FXDISREG
785.  // MODIFICATIONS:
786.  //
787.  `define FXDISREG 1.10
788.  //
789.  // DESCRIPTION: This module is just a register which resets to 'h00.
790.  // Data is written to it while the WR signal is high
791.  // NOTE: This module uses the Toshiba structural element LD3

792.  module fxdisreg (D_IN, WR, RESET, D_OUT);
793.  input   [7:0]   D_IN;
794.  input           WR, RESET;
795.  output [7:0]    D_OUT;

796.  wire [7:0] D_OUT;
797.  wire  SET = !RESET; // since the LD3 device has a low true reset
798.  wire  NWR = !WR;
799.  // latch connection allows an asynchronous reset to ALL ZEROS
800.  // changed to positive edge D to fix unknowns on PROG and TAP 801.  FD2   B7 (D_OUT[7],,D_IN[7],NWR,SET); // edge device
802.  FD2   B6 (D_OUT[6],,D_IN[6],NWR,SET); // edge device
803.  LD3   B5 (D_OUT[5],,D_IN[5],WR,SET);
804.  LD3   B4 (D_OUT[4],,D_IN[4],WR,SET);
805.  LD3   B3 (D_OUT[3],,D_IN[3],WR,SET);
806.  LD3   B2 (D_OUT[2],,D_IN[2],WR,SET);
807.  LD3   B1 (D_OUT[1],,D_IN[1],WR,SET);
808.  LD3   B0 (D_OUT[0],,D_IN[0],WR,SET);

809.  endmodule
```

```
810.  `include "defines.h" // comment

811.  ////////////////////////////////////////////////
812.  // MODULE:      IOSEL
813.  // MODIFICATIONS:
814.  //            improve operation
815.  //
816.  `define IOSEL_REV  1.10
817.  //
818.  // DESCRIPTION:
819.  // This module is a programmable IO select. It receives the contents
820.  // of a LADD_REG (lower address), UADD_REG (upper address), and the
821.  // MASK_REG to determine a match against the contents of
822.  // the address bus. Further selection qualification includes matches of
823.  // the contents of a CMD_REG against command conditions for the access.

824.  module iosel( ADDRESS, AEN, CMD_REG, DATA_DEC, IOR, IOW, I_MTCH, LADD_REG
825.  , MASK_REG, PRIVY, PROG, SECURE, UADD_REG, IGNORE_RD, IO16, IO_SEL, XA_SEL
826.  , XB_SEL );
827.  input  AEN, DATA_DEC, IOR, IOW, I_MTCH, PRIVY, PROG, SECURE;
828.  output IGNORE_RD, IO16, IO_SEL, XA_SEL, XB_SEL;
829.  input  [7:0] UADD_REG;
830.  input  [7:0] MASK_REG;
831.  input  [7:0] LADD_REG;
832.  input  [7:0] CMD_REG;
833.  input  [15:0] ADDRESS;

834.  wire STICKY; // This bit is used during index decode mode. The sticky bit is set and turns
835.             // on the IOSEL if the write to the indexed LADD_REG has bit[0] is a 1.
836.             // If bit[0] is not a 1, STICKY is cleared
837.  //        7 6 5 4 3 2 1 0
838.  // REGISTER ASSUMPTION   INDEXED XA_USE XB_USE IOW_OK IOR_OK SECURE PRIVY IO16

839.  wire ADD_MTCH = {UADD_REG,LADD_REG} == {ADDRESS[15:8],(~(MASK_REG) & ADDRESS[7:0])} ;

840.  wire IDX_MTCH = I_MTCH && DATA_DEC;

841.  wire SEL_MTCH = ( (ADD_MTCH && !CMD_REG[7]) || (IDX_MTCH && CMD_REG[7]) ) &&
842.                 ((CMD_REG[2] && !SECURE) || !CMD_REG[2]) &&
843.                 ((CMD_REG[1] && PRIVY) || !CMD_REG[1]) &&
844.                 !AEN && !PROG;

845.  wire CMD_MTCH = CMD_REG[4:3]==2'b00 || CMD_REG[3] && IOR || CMD_REG[4] && IOW ;

846.  wire IO_SEL = (SEL_MTCH && CMD_MTCH) || !PROG && CMD_REG[7] && STICKY;

847.  // enable the appropriate BUS; note: illegal combination of CMD_REG[6:5]=11 disables all BUSes
848.  wire XA_SEL = CMD_REG[6:5]==2'b01 && SEL_MTCH;
849.  wire XB_SEL = CMD_REG[6:5]==2'b10 && SEL_MTCH;

850.  wire SEL = XA_SEL || XB_SEL;

851.  wire IGNORE_RD = SEL && (CMD_REG[4:3]==2'b10); // fix of a bug: this signal should only
852.                                                  // be asserted if this sel is intended to
853.                                                  // be write only, not address decode

854.  YFD1 U2 (.D(MASK_REG[0]), .CP(!IOW), .Q(STICKY));
```

-59-

855. wire IO16 = SEL_MTCH && CMD_REG[0];

856. endmodule // iosel

```
857. //////////////////////////////////////////////
858. // MODULE:    IRQ_DEC
859. // MODIFICATIONS:
860. //
861. `define IRQ_DEC_REV 1.00
862. //
863. // DESCRIPTION:
864. // This block is the core element in the IRQ_SW block that maps
865. // the given input to one of the outputs based on selects and
866. // proper enables
867. //////////////////////////////////////////////
868. module  irq_dec (REQ_IN, SEL, DIS, PROG, REQ_OUT);
869.  input REQ_IN, DIS, PROG;
870.  input [2:0] SEL;
871.  output [5:0] REQ_OUT;

872.  wire [5:0] REQ_OUT= {6{(!PROG && !DIS && REQ_IN)}} & (
873.        {SEL= =3'b101,SEL= =3'b100,SEL= =3'b011,SEL= =3'b010,SEL= =3'b001,SEL= =3'b000});

874. endmodule  // irq_dec
```

-61-

```
875. /////////////////////////////////////
876. // MODULE:    IRQ_SWITCH
877. // MODIFICATIONS:
878. //              (revamped to be decodes instead of muxes)
879. //
880. `define IRQSWCH_REV 1.00
881. //
882. // DESCRIPTION:
883. // This block switches 6 device-side IRQs
884. // to 8 system side IRQs. Note that multiple IRQ ins can share an
885. // IRQ out.
886. /////////////////////////////////////

887. module irqswch( DIS0, DIS1, DIS2, DIS3, DIS4, DIS5, PROG, REQ_IN, SEC0, SEC1
888.   , SEC2, SEC3, SEC4, SEC5, SEL0, SEL1, SEL2, SEL3, SEL4, SEL5, REQ_OUT, SECURE
889.   );
890. input DIS0, DIS1, DIS2, DIS3, DIS4, DIS5, PROG, SEC0, SEC1, SEC2, SEC3
891.   , SEC4, SEC5, SECURE;
892. input [2:0] SEL5;
893. input [2:0] SEL4;
894. input [2:0] SEL3;
895. input [2:0] SEL2;
896. input [2:0] SEL1;
897. input [2:0] SEL0;
898. input [5:0] REQ_IN;
899. output [5:0] REQ_OUT;

900. wire [5:0]    req0, req1, req2, req3, req4, req5;

901. wire [5:0] REQ_OUT =    req5 | req4 | req3 | req2 | req1 | req0;

902. // disable should be asserted if secure is on and the sec feature is on.

903. irq_dec S0req (REQ_IN[0], SEL0, ((SEC0 && SECURE) || DIS0), PROG, req0 );
904. irq_dec S1req (REQ_IN[1], SEL1, ((SEC1 && SECURE) || DIS1), PROG, req1 );
905. irq_dec S2req (REQ_IN[2], SEL2, ((SEC2 && SECURE) || DIS2), PROG, req2 );
906. irq_dec S3req (REQ_IN[3], SEL3, ((SEC3 && SECURE) || DIS3), PROG, req3 );
907. irq_dec S4req (REQ_IN[4], SEL4, ((SEC4 && SECURE) || DIS4), PROG, req4 );
908. irq_dec S5req (REQ_IN[5], SEL5, ((SEC5 && SECURE) || DIS5), PROG, req5 );

909. endmodule // irqswch
```

-62-

```
910.  `include "defines.h" // comments

911.  //////////////////////////////////////////
912.  // MODULE: IX_DECO
913.  //
914.  // MODIFICATIONS:
915.  //          support the CLIO_INHIBIT bit in index[7]
916.  //
917.  `define IX_DECO_REV 1.00
918.  //
919.  // Description: This block asserts the Index decode lines
920.  //          when the index contains the value of the corresponding
921.  //          register. (SELXLADDs)

922.  module ix_deco( INDEX, IX_DECODE );
923.  input  [6:0] INDEX;
924.  output [15:0] IX_DECODE;

925.  reg    [15:0] IX_DECODE;

926.  always @(INDEX) begin
927.    case (( 1'b0, INDEX ))  // mask off index bit 7
928.                            // which determines wether CLIO returns data
929.                            // on reads or the index_decoded device does
930.      `SEL0LADD:   IX_DECODE=16'b0000000000000001;
931.      `SEL1LADD:   IX_DECODE=16'b0000000000000010;
932.      `SEL2LADD:   IX_DECODE=16'b0000000000000100;
933.      `SEL3LADD:   IX_DECODE=16'b0000000000001000;
934.      `SEL4LADD:   IX_DECODE=16'b0000000000010000;
935.      `SEL5LADD:   IX_DECODE=16'b0000000000100000;
936.      `SEL6LADD:   IX_DECODE=16'b0000000001000000;
937.      `SEL7LADD:   IX_DECODE=16'b0000000010000000;
938.      `SEL8LADD:   IX_DECODE=16'b0000000100000000;
939.      `SEL9LADD:   IX_DECODE=16'b0000001000000000;
940.      `SEL10LADD:  IX_DECODE=16'b0000010000000000;
941.      `SEL11LADD:  IX_DECODE=16'b0000100000000000;
942.      `SEL12LADD:  IX_DECODE=16'b0001000000000000;
943.      `SEL13LADD:  IX_DECODE=16'b0010000000000000;
944.      `SEL14LADD:  IX_DECODE=16'b0100000000000000;
945.      `SEL15LADD:  IX_DECODE=16'b1000000000000000;
946.      default:     IX_DECODE=16'b0000000000000000;
947.    endcase
948.  end
949.  endmodule // ix_deco
```

-63-

```
950. //////////////////////////////////////////////
951. // This module was created to force synopsys
952. // to utilize a specific 8 bit latch architecture.
953. // In this case it forces the Toshiba 4 bit latch
954. // library element to be used as the building block.
955. //
956. //
957. `define LTCH8_REV 1.00
958. //
959. // DESCRIPTION: This module was created to force Synopsys to use
960. // then YLD14B 4 bit latch element from the Toshiba library for
961. // optimal size efficientcy 962. module ltch8 (ind, wr, outd);

963. input  [7:0] ind;
964. input        wr;
965. output [7:0] outd;

966. wire   [7:0] outd;

967. // instatiate Toshiba 140G library device (4 bit latch)
968. YLD14B U1 (outd[3],,outd[2],,outd[1],,outd[0],,ind[3],ind[2],ind[1],ind[0],wr);
969. YLD14B U2 (outd[7],,outd[6],,outd[5],,outd[4],,ind[7],ind[6],ind[5],ind[4],wr);

970. // This code is a scructural independant version of the 8 bit latch.
971. // reg [7:0] outd;
972. // always @(wr or ind) begin
973. //     if (wr) outd=ind;
974. // end 975. endmodule
```

-64-

```
976. /////////////////////////////////////
977. // MODULE: Prog_DLY
978. // PURPOSE: This programmable tap delay element provides
979. // a means for selecting one of 4 delay taps. The default
980. // delay on sel=00 is typical delay of 36ns. 48, 60, and
981. // 24 are also selectable. designed for use with 140G
982. // speed delays
983. // Note: Be sure to account for other delays in the path
984. // outside of this elements.
985. //
986. `define PROG_DLY_REV 1.00
987. //
988. // Note: This module uses Toshiba 140G specific structures 989. module prog_dly (Z, A, SEL0, SEL1);
990. input   A, SEL0, SEL1;
991. output  Z;

992. wire  Z;
993. YDLY3 U1 (.Z(TAP1), .A(A));     // typ=4-12
994. YDLY3 U2 (.Z(TAP2), .A(TAP1));  // typ=8-24
995. YDLY3 U3 (.Z(TAP3), .A(TAP2));  // typ=12-36
996. YDLY3 U4 (.Z(TAP4), .A(TAP3));  // typ=16-48
997. YDLY3 U5 (.Z(TAP5), .A(TAP4));  // typ=20-60
998. YDLY3 U7 (.Z(TAP6), .A(TAP5));  // typ=24-72
999. MUX41 U6 (.Z(Z), .D0(TAP5), .D1(TAP6), .D2(TAP4), .D3(TAP3),
1000.          .A(SEL0), .B(SEL1));
1001. endmodule // prog_dly
```

-65-

```
1002. `include "defines.h" // comments
1003. ///////////////////////////////////////////
1004. // MODULE: REGCNTRL
1005. // MODIFICATION:
1006. // to 6 bits
1007. // delay
1008. // features
1009. // so that CLIO rd data can be inhibited
1010. // during index decoded IOR
1011. // during writes only
1012. //         be 8'hFF
1013. //         conditions on TAP_SEL and PROG
1014. //
1015. `define REGCNTRL_REV 1.20

1016. module regcntrl( ADDRESS, AEN, D_IN, IOR, IOW, PRIVY, RESET, SECURE, DATA_DEC
1017. , DMASW10, DMASW32, DMASW54, D_OUT, FIXDIS, INDEX, IRQSEC, IRQSW10
1018. , IRQSW32, IRQSW54, OUT_EN, PROG, SEL0CMD, SEL0LADD, SEL0MASK, SEL0UADD
1019. , SEL10CMD, SEL10LADD, SEL10MASK, SEL10UADD, SEL11CMD, SEL11LADD, SEL11MASK
1020. , SEL11UADD, SEL12CMD, SEL12LADD, SEL12MASK, SEL12UADD, SEL13CMD, SEL13LADD
1021. , SEL13MASK, SEL13UADD, SEL14CMD, SEL14LADD, SEL14MASK, SEL14UADD, SEL15CMD
1022. , SEL15LADD, SEL15MASK, SEL15UADD, SEL1CMD, SEL1LADD, SEL1MASK, SEL1UADD
1023. , SEL2CMD, SEL2LADD, SEL2MASK, SEL2UADD, SEL3CMD, SEL3LADD, SEL3MASK, SEL3UADD
1024. , SEL4CMD, SEL4LADD, SEL4MASK, SEL4UADD, SEL5CMD, SEL5LADD, SEL5MASK, SEL5UADD
1025. , SEL6CMD, SEL6LADD, SEL6MASK, SEL6UADD, SEL7CMD, SEL7LADD, SEL7MASK, SEL7UADD
1026. , SEL8CMD, SEL8LADD, SEL8MASK, SEL8UADD, SEL9CMD, SEL9LADD, SEL9MASK, SEL9UADD
1027. , XA_SEL );
1028. input AEN, IOR, IOW, PRIVY, RESET, SECURE;
1029. output DATA_DEC, OUT_EN, PROG, XA_SEL;
1030. input [7:0] D_IN;
1031. input [15:0] ADDRESS;
1032. output [7:0] SEL9UADD;
1033. output [7:0] SEL9MASK;
1034. output [7:0] SEL9LADD;
1035. output [7:0] SEL9CMD;
1036. output [7:0] SEL8UADD;
1037. output [7:0] SEL8MASK;
1038. output [7:0] SEL8LADD;
1039. output [7:0] SEL8CMD;
1040. output [7:0] SEL7UADD;
1041. output [7:0] SEL7MASK;
1042. output [7:0] SEL7LADD;
1043. output [7:0] SEL7CMD;
1044. output [7:0] SEL6UADD;
1045. output [7:0] SEL6MASK;
1046. output [7:0] SEL6LADD;
1047. output [7:0] SEL6CMD;
1048. output [7:0] SEL5UADD;
1049. output [7:0] SEL5MASK;
1050. output [7:0] SEL5LADD;
1051. output [7:0] SEL5CMD;
1052. output [7:0] SEL4UADD;
1053. output [7:0] SEL4MASK;
1054. output [7:0] SEL4LADD;
1055. output [7:0] SEL4CMD;
1056. output [7:0] SEL3UADD;
1057. output [7:0] SEL3MASK;
1058. output [7:0] SEL3LADD;
1059. output [7:0] SEL3CMD;
```

```
1060. output [7:0] SEL2UADD;
1061. output [7:0] SEL2MASK;
1062. output [7:0] SEL2LADD;
1063. output [7:0] SEL2CMD;
1064. output [7:0] SEL1UADD;
1065. output [7:0] SEL1MASK;
1066. output [7:0] SEL1LADD;
1067. output [7:0] SEL1CMD;
1068. output [7:0] SEL15UADD;
1069. output [7:0] SEL15MASK;
1070. output [7:0] SEL15LADD;
1071. output [7:0] SEL15CMD;
1072. output [7:0] SEL14UADD;
1073. output [7:0] SEL14MASK;
1074. output [7:0] SEL14LADD;
1075. output [7:0] SEL14CMD;
1076. output [7:0] SEL13UADD;
1077. output [7:0] SEL13MASK;
1078. output [7:0] SEL13LADD;
1079. output [7:0] SEL13CMD;
1080. output [7:0] SEL12UADD;
1081. output [7:0] SEL12MASK;
1082. output [7:0] SEL12LADD;
1083. output [7:0] SEL12CMD;
1084. output [7:0] SEL11UADD;
1085. output [7:0] SEL11MASK;
1086. output [7:0] SEL11LADD;
1087. output [7:0] SEL11CMD;
1088. output [7:0] SEL10UADD;
1089. output [7:0] SEL10MASK;
1090. output [7:0] SEL10LADD;
1091. output [7:0] SEL10CMD;
1092. output [7:0] SEL0UADD;
1093. output [7:0] SEL0MASK;
1094. output [7:0] SEL0LADD;
1095. output [7:0] SEL0CMD;
1096. output [7:0] IRQSW54;
1097. output [7:0] IRQSW32;
1098. output [7:0] IRQSW10;
1099. output [7:0] IRQSEC;

1100. output [6:0] INDEX;
1101. output [5:0] FIXDIS;
1102. output [7:0] D_OUT;
1103. output [7:0] DMASW54;
1104. output [7:0] DMASW32;
1105. output [7:0] DMASW10;

1106. reg              OUT_EN;
1107. wire  [7:0] index;
1108. wire  [6:0] INDEX = index[6:0];

1109. // This INDEX latch holds the register INDEX value
1110. wire  [7:0]      IOBASE, fxdis;
1111. wire  [5:0] FIXDIS = fxdis[5:0];

1112. wire  [7:0] SEL0CMD
1113. , SEL1CMD
1114. , SEL2CMD
```

```
1115. , SEL3CMD
1116. , SEL4CMD
1117. , SEL5CMD
1118. , SEL6CMD
1119. , SEL7CMD
1120. , SEL8CMD
1121. , SEL9CMD
1122. , SEL10CMD
1123. , SEL11CMD
1124. , SEL12CMD
1125. , SEL13CMD
1126. , SEL14CMD
1127. , SEL15CMD
1128. , SEL0LADD
1129. , SEL1LADD
1130. , SEL2LADD
1131. , SEL3LADD
1132. , SEL4LADD
1133. , SEL5LADD
1134. , SEL6LADD
1135. , SEL7LADD
1136. , SEL8LADD
1137. , SEL9LADD
1138. , SEL10LADD
1139. , SEL11LADD
1140. , SEL12LADD
1141. , SEL13LADD
1142. , SEL14LADD
1143. , SEL15LADD
1144. , SEL0UADD
1145. , SEL1UADD
1146. , SEL2UADD
1147. , SEL3UADD
1148. , SEL4UADD
1149. , SEL5UADD
1150. , SEL6UADD
1151. , SEL7UADD
1152. , SEL8UADD
1153. , SEL9UADD
1154. , SEL10UADD
1155. , SEL11UADD
1156. , SEL12UADD
1157. , SEL13UADD
1158. , SEL14UADD
1159. , SEL15UADD
1160. , SEL0MASK
1161. , SEL1MASK
1162. , SEL2MASK
1163. , SEL3MASK
1164. , SEL4MASK
1165. , SEL5MASK
1166. , SEL6MASK
1167. , SEL7MASK
1168. , SEL8MASK
1169. , SEL9MASK
1170. , SEL10MASK
1171. , SEL11MASK
1172. , SEL12MASK
1173. , SEL13MASK
1174. , SEL14MASK
```

-67-

-68-

```
1175.    , SEL15MASK
1176.    , IRQSW10
1177.    , IRQSW32
1178.    , IRQSW54
1179.    , DMASW10
1180.    , DMASW32
1181.    , DMASW54
1182.    , IRQSEC;

1183. // This INDEX and data port are programmable based off
1184. // of IOBASE register
1185. wire   uadd_zero = ADDRESS[15:8]==8'h00;
1186. wire   base_mtch = uadd_zero &&
1187.                   (ADDRESS[7:3]==IOBASE[7:3] && PRIVY && !AEN);
1188. wire   INDEX_DEC = ( base_mtch && ADDRESS[2:0]==3'b000);
1189. wire   DATA_DEC  = ( base_mtch && ADDRESS[2:0]==IOBASE[2:0]);
1190. wire   data_wr  = DATA_DEC && IOW && !SECURE;
1191. wire   index_wr = INDEX_DEC && IOW;
1192. reg  [7:0]  data_out;
1193. wire [7:0]  D_OUT = INDEX_DEC ? index : data_out;

1194. wire  D_XA = DATA_DEC ;

1195. wire  I_XA = INDEX_DEC;

1196. // inhibit turning XREAD_ on during reads of index_decoded iosels
1197. wire  XA_SEL  = (D_XA && !index[7]) || I_XA;

1198. wire    WR_SEL0CMD  = index==`SEL0CMD && data_wr;
1199. wire    WR_SEL1CMD  = index==`SEL1CMD && data_wr;
1200. wire    WR_SEL2CMD  = index==`SEL2CMD && data_wr;
1201. wire    WR_SEL3CMD  = index==`SEL3CMD && data_wr;
1202. wire    WR_SEL4CMD  = index==`SEL4CMD && data_wr;
1203. wire    WR_SEL5CMD  = index==`SEL5CMD && data_wr;
1204. wire    WR_SEL6CMD  = index==`SEL6CMD && data_wr;
1205. wire    WR_SEL7CMD  = index==`SEL7CMD && data_wr;
1206. wire    WR_SEL8CMD  = index==`SEL8CMD && data_wr;
1207. wire    WR_SEL9CMD  = index==`SEL9CMD && data_wr;
1208. wire    WR_SEL10CMD = index==`SEL10CMD && data_wr;
1209. wire    WR_SEL11CMD = index==`SEL11CMD && data_wr;
1210. wire    WR_SEL12CMD = index==`SEL12CMD && data_wr;
1211. wire    WR_SEL13CMD = index==`SEL13CMD && data_wr;
1212. wire    WR_SEL14CMD = index==`SEL14CMD && data_wr;
1213. wire    WR_SEL15CMD = index==`SEL15CMD && data_wr;
1214. wire    WR_SEL0LADD = index==`SEL0LADD && data_wr;
1215. wire    WR_SEL1LADD = index==`SEL1LADD && data_wr;
1216. wire    WR_SEL2LADD = index==`SEL2LADD && data_wr;
1217. wire    WR_SEL3LADD = index==`SEL3LADD && data_wr;
1218. wire    WR_SEL4LADD = index==`SEL4LADD && data_wr;
1219. wire    WR_SEL5LADD = index==`SEL5LADD && data_wr;
1220. wire    WR_SEL6LADD = index==`SEL6LADD && data_wr;
1221. wire    WR_SEL7LADD = index==`SEL7LADD && data_wr;
1222. wire    WR_SEL8LADD = index==`SEL8LADD && data_wr;
1223. wire    WR_SEL9LADD = index==`SEL9LADD && data_wr;
1224. wire    WR_SEL10LADD = index==`SEL10LADD && data_wr;
1225. wire    WR_SEL11LADD = index==`SEL11LADD && data_wr;
1226. wire    WR_SEL12LADD = index==`SEL12LADD && data_wr;
1227. wire    WR_SEL13LADD = index==`SEL13LADD && data_wr;
1228. wire    WR_SEL14LADD = index==`SEL14LADD && data_wr;
```

```
1229. wire   WR_SEL15LADD = index==`SEL15LADD && data_wr;
1230. wire   WR_SEL0UADD  = index==`SEL0UADD && data_wr;
1231. wire   WR_SEL1UADD  = index==`SEL1UADD && data_wr;
1232. wire   WR_SEL2UADD  = index==`SEL2UADD && data_wr;
1233. wire   WR_SEL3UADD  = index==`SEL3UADD && data_wr;
1234. wire   WR_SEL4UADD  = index==`SEL4UADD && data_wr;
1235. wire   WR_SEL5UADD  = index==`SEL5UADD && data_wr;
1236. wire   WR_SEL6UADD  = index==`SEL6UADD && data_wr;
1237. wire   WR_SEL7UADD  = index==`SEL7UADD && data_wr;
1238. wire   WR_SEL8UADD  = index==`SEL8UADD && data_wr;
1239. wire   WR_SEL9UADD  = index==`SEL9UADD && data_wr;
1240. wire   WR_SEL10UADD = index==`SEL10UADD && data_wr;
1241. wire   WR_SEL11UADD = index==`SEL11UADD && data_wr;
1242. wire   WR_SEL12UADD = index==`SEL12UADD && data_wr;
1243. wire   WR_SEL13UADD = index==`SEL13UADD && data_wr;
1244. wire   WR_SEL14UADD = index==`SEL14UADD && data_wr;
1245. wire   WR_SEL15UADD = index==`SEL15UADD && data_wr;
1246. wire   WR_SEL0MASK  = index==`SEL0MASK && data_wr;
1247. wire   WR_SEL1MASK  = index==`SEL1MASK && data_wr;
1248. wire   WR_SEL2MASK  = index==`SEL2MASK && data_wr;
1249. wire   WR_SEL3MASK  = index==`SEL3MASK && data_wr;
1250. wire   WR_SEL4MASK  = index==`SEL4MASK && data_wr;
1251. wire   WR_SEL5MASK  = index==`SEL5MASK && data_wr;
1252. wire   WR_SEL6MASK  = index==`SEL6MASK && data_wr;
1253. wire   WR_SEL7MASK  = index==`SEL7MASK && data_wr;
1254. wire   WR_SEL8MASK  = index==`SEL8MASK && data_wr;
1255. wire   WR_SEL9MASK  = index==`SEL9MASK && data_wr;
1256. wire   WR_SEL10MASK = index==`SEL10MASK && data_wr;
1257. wire   WR_SEL11MASK = index==`SEL11MASK && data_wr;
1258. wire   WR_SEL12MASK = index==`SEL12MASK && data_wr;
1259. wire   WR_SEL13MASK = index==`SEL13MASK && data_wr;
1260. wire   WR_SEL14MASK = index==`SEL14MASK && data_wr;
1261. wire   WR_SEL15MASK = index==`SEL15MASK && data_wr;
1262. wire   WR_IOBASE    = index==`IOBASE && data_wr;
1263. wire   WR_FIXDIS    = index==`FIXDIS && data_wr;
1264. wire   WR_IRQSW10   = index==`IRQSW10   && data_wr;
1265. wire   WR_IRQSW32   = index==`IRQSW32   && data_wr;
1266. wire   WR_IRQSW54   = index==`IRQSW54   && data_wr;
1267. wire   WR_IRQSEC    = index==`IRQSEC && data_wr;
1268. wire   WR_DMASW10   = index==`DMASW10   && data_wr;
1269. wire   WR_DMASW32   = index==`DMASW32   && data_wr;
1270. wire   WR_DMASW54   = index==`DMASW54   && data_wr;

1271. ltch8 R1    (D_IN, WR_SEL0CMD,  SEL0CMD);
1272. ltch8 R2    (D_IN, WR_SEL1CMD,  SEL1CMD);
1273. ltch8 R3    (D_IN, WR_SEL2CMD,  SEL2CMD);
1274. ltch8 R4    (D_IN, WR_SEL3CMD,  SEL3CMD);
1275. ltch8 R5    (D_IN, WR_SEL4CMD,  SEL4CMD);
1276. ltch8 R6    (D_IN, WR_SEL5CMD,  SEL5CMD);
1277. ltch8 R7    (D_IN, WR_SEL6CMD,  SEL6CMD);
1278. ltch8 R8    (D_IN, WR_SEL7CMD,  SEL7CMD);
1279. ltch8 R9    (D_IN, WR_SEL8CMD,  SEL8CMD);
1280. ltch8 R10   (D_IN, WR_SEL9CMD,  SEL9CMD);
1281. ltch8 R11   (D_IN, WR_SEL10CMD, SEL10CMD);
1282. ltch8 R12   (D_IN, WR_SEL11CMD, SEL11CMD);
1283. ltch8 R13   (D_IN, WR_SEL12CMD, SEL12CMD);
1284. ltch8 R14   (D_IN, WR_SEL13CMD, SEL13CMD);
1285. ltch8 R15   (D_IN, WR_SEL14CMD, SEL14CMD);
1286. ltch8 R16   (D_IN, WR_SEL15CMD, SEL15CMD);
1287. ltch8 R17   (D_IN, WR_SEL0LADD, SEL0LADD);
```

-69-

-70-

```
1288. ltch8 R18    (D_IN, WR_SEL1LADD,  SEL1LADD );
1289. ltch8 R19    (D_IN, WR_SEL2LADD,  SEL2LADD );
1290. ltch8 R20    (D_IN, WR_SEL3LADD,  SEL3LADD );
1291. ltch8 R21    (D_IN, WR_SEL4LADD,  SEL4LADD );
1292. ltch8 R22    (D_IN, WR_SEL5LADD,  SEL5LADD );
1293. ltch8 R23    (D_IN, WR_SEL6LADD,  SEL6LADD );
1294. ltch8 R24    (D_IN, WR_SEL7LADD,  SEL7LADD );
1295. ltch8 R25    (D_IN, WR_SEL8LADD,  SEL8LADD );
1296. ltch8 R26    (D_IN, WR_SEL9LADD,  SEL9LADD );
1297. ltch8 R27    (D_IN, WR_SEL10LADD, SEL10LADD );
1298. ltch8 R28    (D_IN, WR_SEL11LADD, SEL11LADD );
1299. ltch8 R29    (D_IN, WR_SEL12LADD, SEL12LADD );
1300. ltch8 R30    (D_IN, WR_SEL13LADD, SEL13LADD );
1301. ltch8 R31    (D_IN, WR_SEL14LADD, SEL14LADD );
1302. ltch8 R32    (D_IN, WR_SEL15LADD, SEL15LADD );
1303. ltch8 R33    (D_IN, WR_SEL0UADD,  SEL0UADD );
1304. ltch8 R34    (D_IN, WR_SEL1UADD,  SEL1UADD );
1305. ltch8 R35    (D_IN, WR_SEL2UADD,  SEL2UADD );
1306. ltch8 R36    (D_IN, WR_SEL3UADD,  SEL3UADD );
1307. ltch8 R37    (D_IN, WR_SEL4UADD,  SEL4UADD );
1308. ltch8 R38    (D_IN, WR_SEL5UADD,  SEL5UADD );
1309. ltch8 R39    (D_IN, WR_SEL6UADD,  SEL6UADD );
1310. ltch8 R40    (D_IN, WR_SEL7UADD,  SEL7UADD );
1311. ltch8 R41    (D_IN, WR_SEL8UADD,  SEL8UADD );
1312. ltch8 R42    (D_IN, WR_SEL9UADD,  SEL9UADD );
1313. ltch8 R43    (D_IN, WR_SEL10UADD, SEL10UADD );
1314. ltch8 R44    (D_IN, WR_SEL11UADD, SEL11UADD );
1315. ltch8 R45    (D_IN, WR_SEL12UADD, SEL12UADD );
1316. ltch8 R46    (D_IN, WR_SEL13UADD, SEL13UADD );
1317. ltch8 R47    (D_IN, WR_SEL14UADD, SEL14UADD );
1318. ltch8 R48    (D_IN, WR_SEL15UADD, SEL15UADD );
1319. ltch8 R49    (D_IN, WR_SEL0MASK,  SEL0MASK );
1320. ltch8 R50    (D_IN, WR_SEL1MASK,  SEL1MASK );
1321. ltch8 R51    (D_IN, WR_SEL2MASK,  SEL2MASK );
1322. ltch8 R52    (D_IN, WR_SEL3MASK,  SEL3MASK );
1323. ltch8 R53    (D_IN, WR_SEL4MASK,  SEL4MASK );
1324. ltch8 R54    (D_IN, WR_SEL5MASK,  SEL5MASK );
1325. ltch8 R55    (D_IN, WR_SEL6MASK,  SEL6MASK );
1326. ltch8 R56    (D_IN, WR_SEL7MASK,  SEL7MASK );
1327. ltch8 R57    (D_IN, WR_SEL8MASK,  SEL8MASK );
1328. ltch8 R58    (D_IN, WR_SEL9MASK,  SEL9MASK );
1329. ltch8 R59    (D_IN, WR_SEL10MASK, SEL10MASK );
1330. ltch8 R60    (D_IN, WR_SEL11MASK, SEL11MASK );
1331. ltch8 R61    (D_IN, WR_SEL12MASK, SEL12MASK );
1332. ltch8 R62    (D_IN, WR_SEL13MASK, SEL13MASK );
1333. ltch8 R63    (D_IN, WR_SEL14MASK, SEL14MASK );
1334. ltch8 R64    (D_IN, WR_SEL15MASK, SEL15MASK );
1335. ltch8 R67    (D_IN, WR_IRQSW10,   IRQSW10  );
1336. ltch8 R72    (D_IN, WR_IRQSW32,   IRQSW32  );
1337. ltch8 R73    (D_IN, WR_IRQSW54,   IRQSW54  );

1338. ltch8 R69    (D_IN, WR_DMASW10,   DMASW10  );
1339. ltch8 R70    (D_IN, WR_DMASW32,   DMASW32  );
1340. ltch8 R71    (D_IN, WR_DMASW54,   DMASW54);

1341. ltch8 R80    (D_IN, index_wr, index);

1342. // loads on trailing edge of write strobe
1343. basereg R65  (D_IN, WR_IOBASE, RESET, IOBASE);
```

```
1344. // loads on trailing edge of write strobe
1345. fxdisreg R66    (D_IN, WR_FIXDIS, RESET, fxdis);
1346. // loads on trailing edge of write strobe
1347. fxdisreg R616   (D_IN, WR_IRQSEC, RESET, IRQSEC);

1348. always @(index or data_wr or D_IN )
1349.    case (index)
1350.    'SEL0CMD :     data_out=SEL0CMD;
1351.    'SEL1CMD :     data_out=SEL1CMD;
1352.    'SEL2CMD :     data_out=SEL2CMD;
1353.    'SEL3CMD :     data_out=SEL3CMD;
1354.    'SEL4CMD :     data_out=SEL4CMD;
1355.    'SEL5CMD :     data_out=SEL5CMD;
1356.    'SEL6CMD :     data_out=SEL6CMD;
1357.    'SEL7CMD :     data_out=SEL7CMD;
1358.    'SEL8CMD :     data_out=SEL8CMD;
1359.    'SEL9CMD :     data_out=SEL9CMD;
1360.    'SEL10CMD :    data_out=SEL10CMD;
1361.    'SEL11CMD :    data_out=SEL11CMD;
1362.    'SEL12CMD :    data_out=SEL12CMD;
1363.    'SEL13CMD :    data_out=SEL13CMD;
1364.    'SEL14CMD :    data_out=SEL14CMD;
1365.    'SEL15CMD :    data_out=SEL15CMD;
1366.    'SEL0LADD :    data_out=SEL0LADD;
1367.    'SEL1LADD :    data_out=SEL1LADD;
1368.    'SEL2LADD :    data_out=SEL2LADD;
1369.    'SEL3LADD :    data_out=SEL3LADD;
1370.    'SEL4LADD :    data_out=SEL4LADD;
1371.    'SEL5LADD :    data_out=SEL5LADD;
1372.    'SEL6LADD :    data_out=SEL6LADD;
1373.    'SEL7LADD :    data_out=SEL7LADD;
1374.    'SEL8LADD :    data_out=SEL8LADD;
1375.    'SEL9LADD :    data_out=SEL9LADD;
1376.    'SEL10LADD :   data_out=SEL10LADD;
1377.    'SEL11LADD :   data_out=SEL11LADD;
1378.    'SEL12LADD :   data_out=SEL12LADD;
1379.    'SEL13LADD :   data_out=SEL13LADD;
1380.    'SEL14LADD :   data_out=SEL14LADD;
1381.    'SEL15LADD :   data_out=SEL15LADD;
1382.    'SEL0UADD :    data_out=SEL0UADD;
1383.    'SEL1UADD :    data_out=SEL1UADD;
1384.    'SEL2UADD :    data_out=SEL2UADD;
1385.    'SEL3UADD :    data_out=SEL3UADD;
1386.    'SEL4UADD :    data_out=SEL4UADD;
1387.    'SEL5UADD :    data_out=SEL5UADD;
1388.    'SEL6UADD :    data_out=SEL6UADD;
1389.    'SEL7UADD :    data_out=SEL7UADD;
1390.    'SEL8UADD :    data_out=SEL8UADD;
1391.    'SEL9UADD :    data_out=SEL9UADD;
1392.    'SEL10UADD :   data_out=SEL10UADD;
1393.    'SEL11UADD :   data_out=SEL11UADD;
1394.    'SEL12UADD :   data_out=SEL12UADD;
1395.    'SEL13UADD :   data_out=SEL13UADD;
1396.    'SEL14UADD :   data_out=SEL14UADD;
1397.    'SEL15UADD :   data_out=SEL15UADD;
1398.    'SEL0MASK :    data_out=SEL0MASK;
1399.    'SEL1MASK :    data_out=SEL1MASK;
1400.    'SEL2MASK :    data_out=SEL2MASK;
1401.    'SEL3MASK :    data_out=SEL3MASK;
```

-72-

```
1402.    'SEL4MASK :    data_out=SEL4MASK;
1403.    'SEL5MASK :    data_out=SEL5MASK;
1404.    'SEL6MASK :    data_out=SEL6MASK;
1405.    'SEL7MASK :    data_out=SEL7MASK;
1406.    'SEL8MASK :    data_out=SEL8MASK;
1407.    'SEL9MASK :    data_out=SEL9MASK;
1408.    'SEL10MASK:    data_out=SEL10MASK;
1409.    'SEL11MASK:    data_out=SEL11MASK;
1410.    'SEL12MASK:    data_out=SEL12MASK;
1411.    'SEL13MASK:    data_out=SEL13MASK;
1412.    'SEL14MASK:    data_out=SEL14MASK;
1413.    'SEL15MASK:    data_out=SEL15MASK;
1414.    'IOBASE   :    data_out=IOBASE  ;
1415.    'FIXDIS   :    data_out=fxdis  ;
1416.    'IRQSW10  :    data_out=IRQSW10  ;
1417.    'IRQSW32  :    data_out=IRQSW32  ;
1418.    'IRQSW54  :    data_out=IRQSW54  ;
1419.    'IRQSEC   :    data_out=IRQSEC  ;
1420.    'DMASW10  :    data_out=DMASW10  ;
1421.    'DMASW32:      data_out=DMASW32  ;
1422.    'DMASW54 :     data_out=DMASW54 ;
1423.    // return FF if unknown index
1424.    default:       data_out=8'hFF;
1425.    endcase 1426. // assign the value of the INDEX based on reset conditions or the data value
1427. always @(RESET or IOR) begin
1428.      if (RESET) OUT_EN=0;
1429.      // enable the output register fort reads
1430.      else if (IOR && ((DATA_DEC && !index[7]) || INDEX_DEC)) OUT_EN=1;
1431.              // if index[7] is a 1, inhibit DATA enabled from CLIO
1432.              // this is for index decoded iosel reads of D_PORT 1433.      else OUT_EN=0 ;
1434.      end
1435. // finally, the PROG signal is derived out of FIXDIS register
1436. // only when it is not changing. (It will always be known since it is now
1437. // an edge triggered storage elemtent)
1438. wire  PROG= !fxdis[7];

1439. endmodule // regcntrl
```

-73-

```
1440. `include "defines.h" // comments
1441. ///////////////////////////////////////////
1442. // MODULE: xbus_cnt
1443. //    a 2 and a 3 (3 was missing)
1444. //
1445. `define XBUS_CNT_REV 1.00
1446. //
1447. // PURPOSE: This block controls the XWRITE, XREAD, and IO16
1448. //    for the xbus based on controls comming from all blocks.
1449. //

1450. module xbus_cnt( CS_IN, DLY_SEL, DMAX, FORCE_XRA, FORCE_XW, FXDEC0, FXDEC2
1451. , IO16_IN, IOR, IOW, REGCNT0, X0, X10, X11, X12, X13, X14, X15, X1, X2
1452. , X3, X4, X5, X6, X7, X8, X9, IO16, XREADA, XREADB, XWRITE );
1453. input CS_IN, FORCE_XRA, FORCE_XW, FXDEC0, FXDEC2, IOR, IOW, REGCNT0;
1454. output IO16, XREADA, XREADB, XWRITE;
1455. input [2:0] X9;
1456. input [2:0] X8;
1457. input [2:0] X7;
1458. input [2:0] X6;
1459. input [2:0] X5;
1460. input [2:0] X4;
1461. input [2:0] X3;
1462. input [2:0] X2;
1463. input [2:0] X1;
1464. input [2:0] X15;
1465. input [2:0] X14;
1466. input [2:0] X13;
1467. input [2:0] X12;
1468. input [2:0] X11;
1469. input [2:0] X10;
1470. input [2:0] X0;
1471. input [15:0] IO16_IN;
1472. input [1:0] DMAX;
1473. input [1:0] DLY_SEL;
1474. // These busses contain the control info [0]=XA_SEL, [1]=XB_SEL and
1475. // coming from the prog_decode (X), DMA_SW (DX), and fix_deco
1476. // (FXDEC) blocks 1477. wire   CS_XWH;

1478. wire IO16 = IO16_IN[0] || IO16_IN[1] || IO16_IN[2] || IO16_IN[3] || IO16_IN[4] || IO16_IN[5] ||
1479.             IO16_IN[6] || IO16_IN[7] || IO16_IN[8] || IO16_IN[9] || IO16_IN[10] || IO16_IN[11] ||
1480.             IO16_IN[12] || IO16_IN[13] || IO16_IN[14] || IO16_IN[15];

1481. wire XA_SEL = X0[0] || X1[0] || X2[0] || X3[0] || X4[0] || X5[0] ||
1482.               X6[0] || X7[0] || X8[0] || X9[0] || X10[0] ||
1483.               X11[0] || X12[0] || X13[0] || X14[0] || X15[0] ||
1484.               DMAX[0] || CS_IN || FXDEC0 || REGCNT0;

1485. wire XB_SEL = X0[1] || X1[1] || X2[1] || X3[1] || X4[1] || X5[1] ||
1486.               X6[1] || X7[1] || X8[1] || X9[1] || X10[1] ||
1487.               X11[1] || X12[1] || X13[1] || X14[1] || X15[1] ||
1488.               DMAX[1];

1489. wire IGNORE_RD = X0[2] || X1[2] || X2[2] || X3[2] || X4[2] || X5[2] ||
1490.                  X6[2] || X7[2] || X8[2] || X9[2] || X10[2] ||
1491.                  X11[2] || X12[2] || X13[2] || X14[2] || X15[2] || FXDEC2 ;
```

-74-

```
1492. wire DLY_IOW; // programmable delayed version of IOW 1493. prog_dly UDLY (.Z(DLY_IOW), .A(IOW),
1494.           .SEL0(DLY_SEL[0]), .SEL1(DLY_SEL[1]));

1495. wire XWRITE = FORCE_XW ||
1496.          !IOR && ((XA_SEL || XB_SEL) && (IOW || DLY_IOW ));

1497. wire XREADA = FORCE_XRA || (IOR && XA_SEL && !IGNORE_RD);

1498. wire XREADB = IOR && XB_SEL && !IGNORE_RD;

1499. endmodule // xbus_cnt
```

We claim:

1. In a computer system having a central processing unit (CPU), a memory comprising one or more memory units wherein at least one of the memory units has a portion configured as a a write only port having a predetermined address and a predetermined bus coupled between said CPU and said memory, a system for reading data written to a write only port comprising:

a read/write register coupled to said predetermined bus, said read/write register resident in said memory;

means including an address decoder coupled to said predetermined bus, said means responsive to a write signal and the address of said write only port for enabling data to be written to said write only port and for automatically writing said data to said read/write register; and means responsive to a read signal, the address of the write only port and a predetermined signal for reading said data from said read/write register to enable data to be supplied to said bus from said read/write register which is accessed using the same address at which said write only port is accessed.

2. In a computer system having a central processing unit (CPU), a memory comprising one or more memory units wherein at least one of the memory units has a portion configured as a write only port having a predetermined address, and an address and a data bus operatively coupled between said CPU and said memory, a system for reading data written to said write only port, comprising:

a predetermined read/write register located in said memory, said read/write register coupled to said address and data bus;

means for automatically writing data written to said write only port to said predetermined read/write register;

means for enabling data to be read from said predetermined read/write register when a read signal is asserted at the predetermined address of the write only port; and means for selectably inhibiting reads of said read/write register, said inhibiting means including means for generating a signal for disabling said enabling means to prevent data from being read from said predetermined read/write register without disabling rest of said memory.

3. The circuit as recited in claim 2, further including means for inhibiting said writing means.

4. The circuit recited in claim 2, wherein said writing means includes means for decoding addresses applied to said address bus, said decoding means operable in a plurality of modes of operation.

5. The circuit as recited in claim 4, wherein said writing means is not operable in all of said plurality of modes of operation.

6. The circuit as recited in claim 3, wherein said inhibiting means is programmable.

7. The circuit as recited in claim 2, wherein said disabling means is programmable.

8. In a computer system having a user selectable index mode of operation and an address mode of operation, a central processing unit (CPU), a memory comprising a plurality of memory units wherein at least one of the memory units has a portion configured as a write only port having a predetermined address and a predetermined bus coupled between said CPU and said memory for reading data written to a write only port, the system comprising:

a predetermined read/write register;

means for writing said data, written to said write only port, to said predetermined read/write register when said index mode of operation is selected;

means responsive to a read signal, the address of the write only port and a predetermined signal for reading said predetermined read/write register when a read signal is sent to said write only port;

means for selectably inhibiting said reading means under predetermined conditions, said inhibiting means generating a signal disabling said reading means from reading data from said predetermined read/write register without disabling rest of said memory.

9. The circuit as recited in claim 8, further including means for disabling said writing means under predetermined conditions.

10. The circuit as recited in claim 8, wherein said inhibiting means is programmable.

11. The circuit as recited in claim 9, wherein said disabling means is programmable.

12. The circuit as recited in claim 8, wherein said inhibiting means includes a manually operated switch having a plurality of positions, one of which inhibits said reading means.

13. A method in a computer system including a central processing unit (CPU), a memory comprising one or more memory units wherein at least one of the memory units has a portion configured as a write only port, a data bus, an address bus and a predetermined read/write register located in said memory for reading data written to the write only port, the method comprising the steps of:

(a) writing a copy of said data written to said write only port to said predetermined read/write register;

(b) reading data from said predetermined read/write register at the write only port address when a read signal and the address of said write only port is applied to said write only port;

(c) selectably generating a signal for inhibiting the reading of said predetermined read/write register to prevent unauthorized reads of said register, said inhibiting signal preventing data to be read from said read/write register without disabling rest of said memory.

14. The method recited in claim 13, further including the step of inhibiting the writing of data to the predetermined memory device under predetermined conditions.

15. In a computer system including a CPU, a data bus, an address bus, a predetermined read/write register in memory, the memory comprising one or more memory units wherein at least one of the memory units has a portion configured as a write only port, a system for reading data written to said write only port comprising:

means for writing said data written to said write only port to said predetermined read/write register;

means for reading said data in said predetermined read/write register at said write only port address when a read signal is sent to said write only port;

means for selectably inhibiting said reading means from reading said data in said predetermined read/write register under predetermined conditions, said inhibiting means including means for generating signals indicative of the absence of said write only port.

16. The computer system as recited in claim 15, further including means for disabling said writing means under predetermined conditions.

17. The computer system as recited in claim 15, wherein said inhibiting means is programmable.

18. The computer system as recited in claim 16, wherein said disabling means is programmable.

19. The computer system as recited in claim 16, wherein said disabling means includes a manually operated switch having a plurality of positions, one of which disables said disabling means.

20. The computer system as recited in claim 19, wherein said manually operated switch is a key lock switch.

21. In a computer system having an index mode of operation and an address mode of operation, a central processing unit (CPU), a memory comprising one or more memory units wherein at least one of the memory units has a portion configured as a write only port having a predetermined address and a predetermined bus coupled between said CPU and said memory, a system for reading data written to a write only port comprising:

a read/write register coupled to said predetermined bus, said read/write register resident in said memory;

means including an address decoder coupled to said predetermined bus responsive to a write signal and the address of said write only port for enabling data to be written to said write only port and for automatically writing said data to said read/write register; and means responsive to a read signal, the address of the write only port and a predetermined signal for reading said data from said read/write register to enable data to be supplied to said bus from said read/write register, said read/write register being accessed using the same address at which said write only port is accessed.

22. The preventing means of claim 21 further including means for substituting the address of said read/write register when said read signal for said write port is asserted.

23. The system of claim 21 wherein said read/write register is an 8-bit latch.

24. The system of claim 21 wherein said data enabling means is operational when said computer system is in an index mode of operation.

25. The system of claim 8 wherein said read/write register includes an unused portion for storing data when said index mode of operation is selected.

26. The system of claim 21 wherein said read/write register includes an unused portion for storing data when said index mode of operation is selected.

* * * * *

UNITED STATES PATENT AND TRADEMARK OFFICE
CERTIFICATE OF CORRECTION

PATENT NO. : 5,748,922
DATED :  May 5, 1998
INVENTOR(S) : Smith et al.

It is certified that error appears in the above-indentified patent and that said Letters Patent is hereby corrected as shown below:

Column 9, line 4, change "a a" to ---a---.

Signed and Sealed this

Fourth Day of August, 1998

Attest:

BRUCE LEHMAN

*Attesting Officer*            *Commissioner of Patents and Trademarks*